United States Patent
Zhao et al.

(10) Patent No.: US 9,111,727 B2
(45) Date of Patent: *Aug. 18, 2015

(54) PLASMA TUNING RODS IN MICROWAVE RESONATOR PLASMA SOURCES

(75) Inventors: Jianping Zhao, Austin, TX (US); Lee Chen, Cedar Creek, TX (US); Merritt Funk, Austin, TX (US); Toshihiko Iwao, Tokyo (JP); Peter L.G. Ventzek, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 327 days.

This patent is subject to a terminal disclaimer.

(21) Appl. No.: 13/249,560

(22) Filed: Sep. 30, 2011

(65) Prior Publication Data

US 2013/0082030 A1    Apr. 4, 2013

(51) Int. Cl.
| | | |
|---|---|---|
| *C23C 16/00* | (2006.01) | |
| *C23F 1/00* | (2006.01) | |
| *H01L 21/306* | (2006.01) | |
| *H01J 37/32* | (2006.01) | |

(52) U.S. Cl.
CPC ..... *H01J 37/32256* (2013.01); *H01J 37/32247* (2013.01)

(58) Field of Classification Search
CPC ............... H01J 37/32256; H01J 37/32247; H01J 37/32935; H01J 37/32192; H01J 37/32266; H01J 37/32211; C23F 1/00; C23F 1/08; H01L 22/00
USPC .............................. 156/345.41; 118/723 MW
See application file for complete search history.

(56) References Cited

U.S. PATENT DOCUMENTS

| | | | |
|---|---|---|---|
| 5,188,862 | A | 2/1993 | Itatani et al. |
| 5,254,372 | A | 10/1993 | Nichols |
| 5,413,759 | A | 5/1995 | Campbell et al. |
| 5,571,366 | A | 11/1996 | Ishii et al. |
| 5,714,009 | A | 2/1998 | Boling |
| 5,804,033 | A * | 9/1998 | Kanai et al. ............ 216/69 |
| 5,869,802 | A | 2/1999 | Spencer et al. |

(Continued)

FOREIGN PATENT DOCUMENTS

| | | | | |
|---|---|---|---|---|
| WO | WO 2010/004997 | * | 1/2010 | ............ H01L 21/302 |
| WO | 2010110256 | A1 | 9/2010 | |
| WO | 2013049700 | A1 | 4/2013 | |

OTHER PUBLICATIONS

International Searching Authority, International Search Report and Written Opinion issued in related International Application PCT/US12/58094, dated Dec. 17, 2012.

(Continued)

*Primary Examiner* — Rakesh Dhingra
(74) *Attorney, Agent, or Firm* — Wood, Herron & Evans, LLP

(57) ABSTRACT

The invention provides a plurality of resonator subsystems. The resonator subsystems can comprise one or more resonant cavities configured to couple electromagnetic (EM) energy in a desired EM wave mode to plasma by generating resonant microwave energy in a resonant cavity adjacent the plasma. The resonator subsystem can be coupled to a process chamber using one or more interface subsystems and can comprise one or more resonant cavities, and each resonant cavity can have a plurality of plasma tuning rods coupled thereto. Some of the plasma tuning rods can be configured to couple the EM-energy from one or more of the resonant cavities to the process space within the process chamber.

7 Claims, 17 Drawing Sheets

(56) References Cited

U.S. PATENT DOCUMENTS

| | | | |
|---|---|---|---|
| 6,029,602 | A | 2/2000 | Bhatnagar |
| 6,064,154 | A | 5/2000 | Crouch et al. |
| 6,114,811 | A * | 9/2000 | Wu .................. 315/111.21 |
| 6,313,584 | B1 | 11/2001 | Johnson et al. |
| 6,341,574 | B1 | 1/2002 | Bailey, III et al. |
| 6,388,226 | B1 | 5/2002 | Smith et al. |
| 6,552,296 | B2 | 4/2003 | Smith et al. |
| 7,232,767 | B2 | 6/2007 | George et al. |
| 7,510,664 | B2 | 3/2009 | Carr |
| 2002/0046991 | A1 | 4/2002 | Smith et al. |
| 2002/0112819 | A1* | 8/2002 | Kamarehi et al. ....... 156/345.36 |
| 2002/0148560 | A1 | 10/2002 | Carr |
| 2004/0011465 | A1* | 1/2004 | Matsumoto et al. ..... 156/345.41 |
| 2004/0244691 | A1 | 12/2004 | George et al. |
| 2005/0034815 | A1 | 2/2005 | Kasai et al. |
| 2006/0042546 | A1* | 3/2006 | Ishii et al. ............. 118/723 MW |
| 2006/0137613 | A1* | 6/2006 | Kasai .................. 118/723 MW |
| 2006/0239312 | A1 | 10/2006 | Kewitsch et al. |
| 2007/0113979 | A1 | 5/2007 | George et al. |
| 2008/0282979 | A1 | 11/2008 | Chen et al. |
| 2008/0303744 | A1 | 12/2008 | Hirayama et al. |
| 2009/0159214 | A1* | 6/2009 | Kasai ..................... 156/345.41 |
| 2009/0200910 | A1 | 8/2009 | Matsuuchi et al. |
| 2009/0236214 | A1 | 9/2009 | Janakiraman et al. |
| 2010/0009096 | A1 | 1/2010 | Kawamura et al. |
| 2011/0057562 | A1 | 3/2011 | Chen et al. |
| 2011/0061814 | A1 | 3/2011 | Ikeda |
| 2011/0097821 | A1 | 4/2011 | Sirard et al. |
| 2011/0097904 | A1 | 4/2011 | Sirard et al. |
| 2011/0174778 | A1 | 7/2011 | Sawada et al. |
| 2012/0067523 | A1 | 3/2012 | Kasai et al. |

OTHER PUBLICATIONS

International Searching Authority, International Search Report and Written Opinion issued in related International Application PCT/US12/58088, dated Jan. 7, 2013.

European Patent Office, International Search Report and Written Opinion issued in corresponding Application No. PCT/US2014/015530 dated Jul. 25, 2014, 13 pp.

* cited by examiner

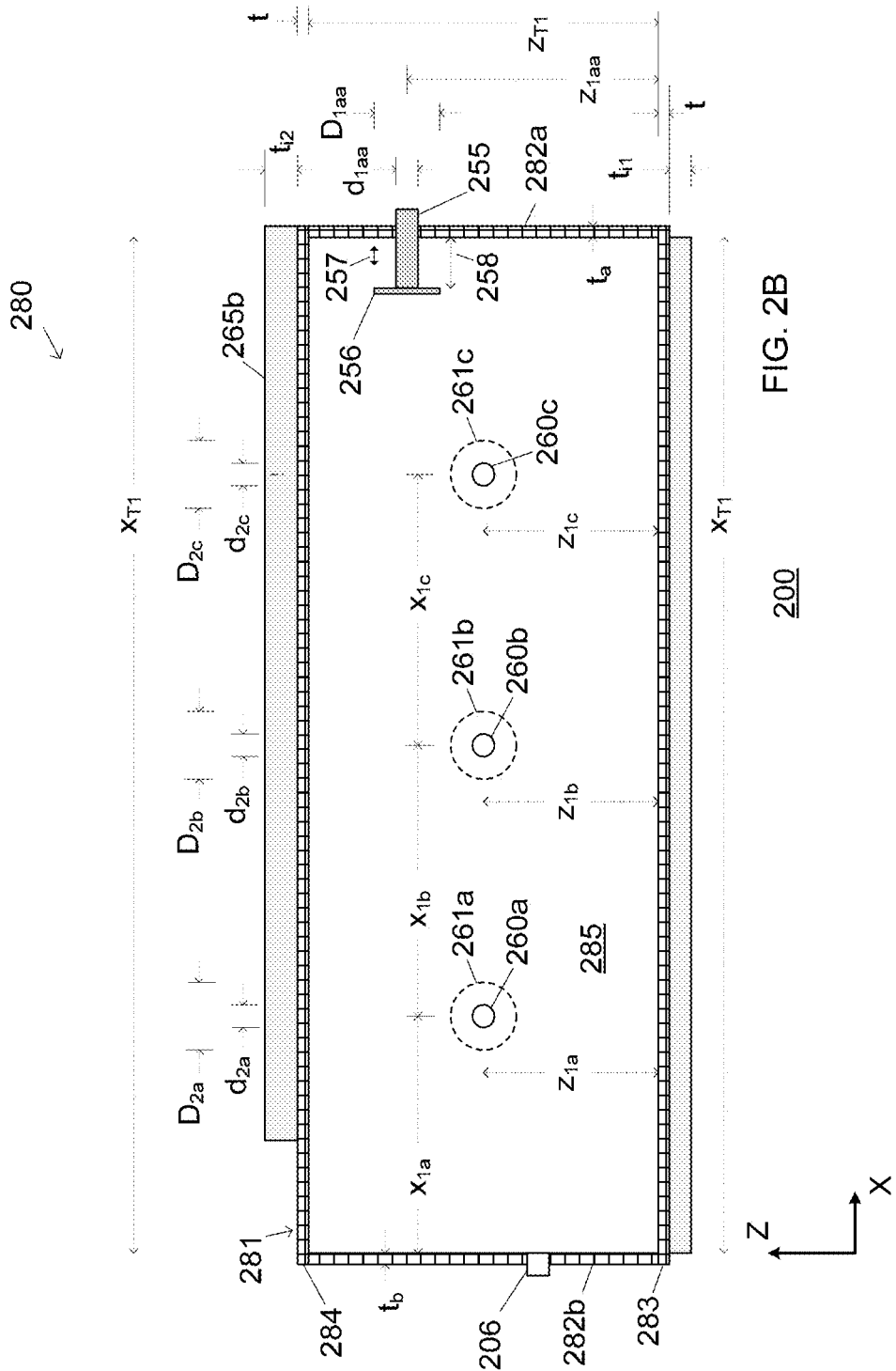

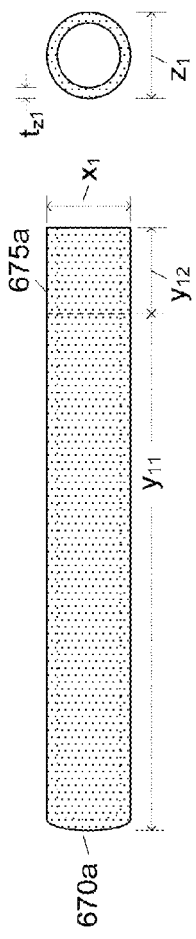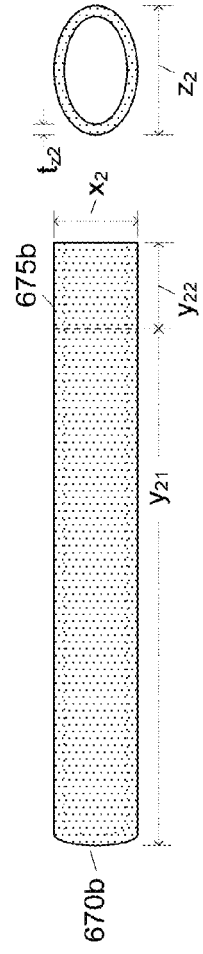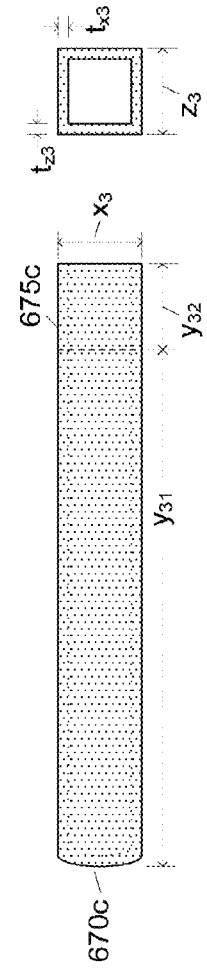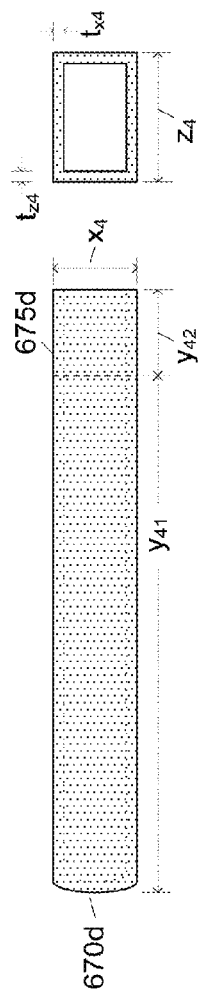
FIG. 6A
FIG. 6B
FIG. 6C
FIG. 6D

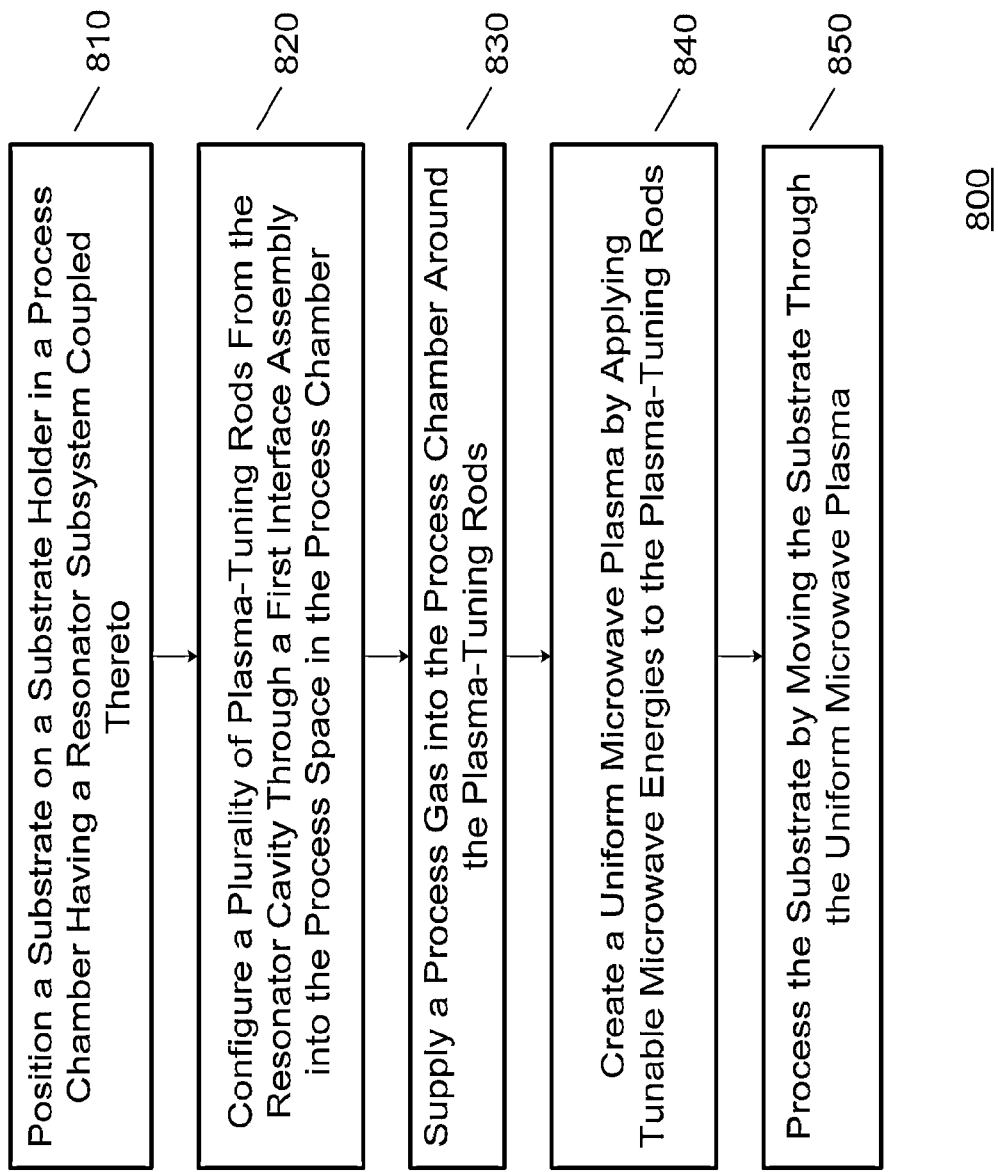

PLASMA TUNING RODS IN MICROWAVE RESONATOR PLASMA SOURCES

CROSS-REFERENCE TO RELATED APPLICATIONS

This Application is related to co-pending U.S. patent application Ser. No. 13/249,418, entitled "Plasma-Tuning Rods in Surface Wave Antenna (SWA) Sources", filed on Sep. 30, 2011 herewith. This application is related to co-pending U.S. patent application Ser. No. 13/249,485, entitled "Plasma Tuning Rods in Microwave Processing Systems", filed on Sep. 30, 2011 herewith. The contents of each of these applications are herein incorporated by reference in their entireties.

BACKGROUND OF THE INVENTION

1. Field of the Invention

The present invention relates to substrate/wafer processing, and more particularly to microwave resonator systems and methods for processing substrates and/or semiconductor wafers.

2. Description of the Related Art

Typically, during semiconductor processing, a (dry) plasma etch process is utilized to remove or etch material along fine lines or within vias or contacts patterned on a semiconductor substrate. The plasma etch process generally involves positioning a semiconductor substrate with an overlying patterned, protective layer, for example a photoresist layer, into a process chamber.

Once the substrate is positioned within the chamber, an ionizable, dissociative gas mixture is introduced within the chamber at a pre-specified flow rate, while a vacuum pump is throttled to achieve an ambient process pressure. Thereafter, a plasma is formed when a portion of the gas species present are ionized following a collision with an energetic electron. Moreover, the heated electrons serve to dissociate some species of the mixture gas species and create reactant specie(s) suitable for the etching exposed surfaces. Once the plasma is formed, any exposed surfaces of the substrate are etched by the plasma. The process is adjusted to achieve optimal conditions, including an appropriate concentration of desirable reactant and ion populations to etch various features (e.g., trenches, vias, contacts, etc.) in the exposed regions of substrate. Such substrate materials where etching is required include silicon dioxide ($SiO_2$), poly-silicon, and silicon nitride, for example.

Conventionally, various techniques have been implemented for exciting a gas into plasma for the treatment of a substrate during semiconductor device fabrication, as described above. In particular, ("parallel plate") capacitively coupled plasma (CCP) processing systems, or inductively coupled plasma (ICP) processing systems have been utilized commonly for plasma excitation. Among other types of plasma sources, there are microwave plasma sources (including those utilizing electron-cyclotron resonance (ECR)), surface wave plasma (SWP) sources, and helicon plasma sources.

It is becoming common wisdom that microwave resonator systems offer improved plasma processing performance, particularly for etching processes, over CCP systems, ICP systems and resonantly heated systems. Microwave resonator systems produce a high degree of ionization at a relatively lower Boltzmann electron temperature ($T_e$). In addition, SWP sources generally produce plasma richer in electronically excited molecular species with reduced molecular dissociation. However, the practical implementation of microwave resonator systems still suffers from several deficiencies including, for example, plasma stability and uniformity.

SUMMARY OF THE INVENTION

The invention relates to a microwave resonator systems and, more particularly, to stable and/or uniform resonator subsystems in microwave resonator systems.

According to embodiments, a plurality of resonator subsystems is described. The resonator subsystems comprise one or more resonant cavities configured to couple electromagnetic (EM) energy in a desired EM wave mode to plasma by generating resonant microwave energy in a resonant cavity adjacent to the plasma. The resonator subsystem can be coupled to a process chamber using one or more interface subsystems and can comprise one or more resonant cavities, and each resonant cavity can have a plurality of plasma tuning rods coupled thereto. Some of the plasma tuning rods can be configured to couple the EM-energy from one or more of the resonant cavities to the process space within the process chamber. In addition, one or more microwave assemblies can be coupled to one or more of the resonant cavities, and one or more additional plasma tuning rods can be configured to couple the EM-energy from one or more of the microwave assemblies to one or more of the resonant cavities. Furthermore, one or more microwave sources can be coupled to one or more of the microwave assemblies and/or to one or more of the resonant cavities.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 2A-2C illustrate different exemplary views of a second microwave processing system according to embodiments of the invention;

FIGS. 6A-6D show different views of other exemplary plasma-tuning rods in accordance with embodiments of the invention;

FIG. 8 illustrates a flow diagram for an exemplary operating procedure in accordance with embodiments of the invention.

DETAILED DESCRIPTION

Microwave resonator sources are disclosed in various embodiments. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" or variation thereof means that a particular feature, structure, material, or characteristic described in connection with the embodiment is included in at least one embodiment of the invention, but do not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Nonetheless, it should be appreciated that, contained within the description are features which, notwithstanding the inventive nature of the general concepts being explained, are also of an inventive nature.

Figure 1A:
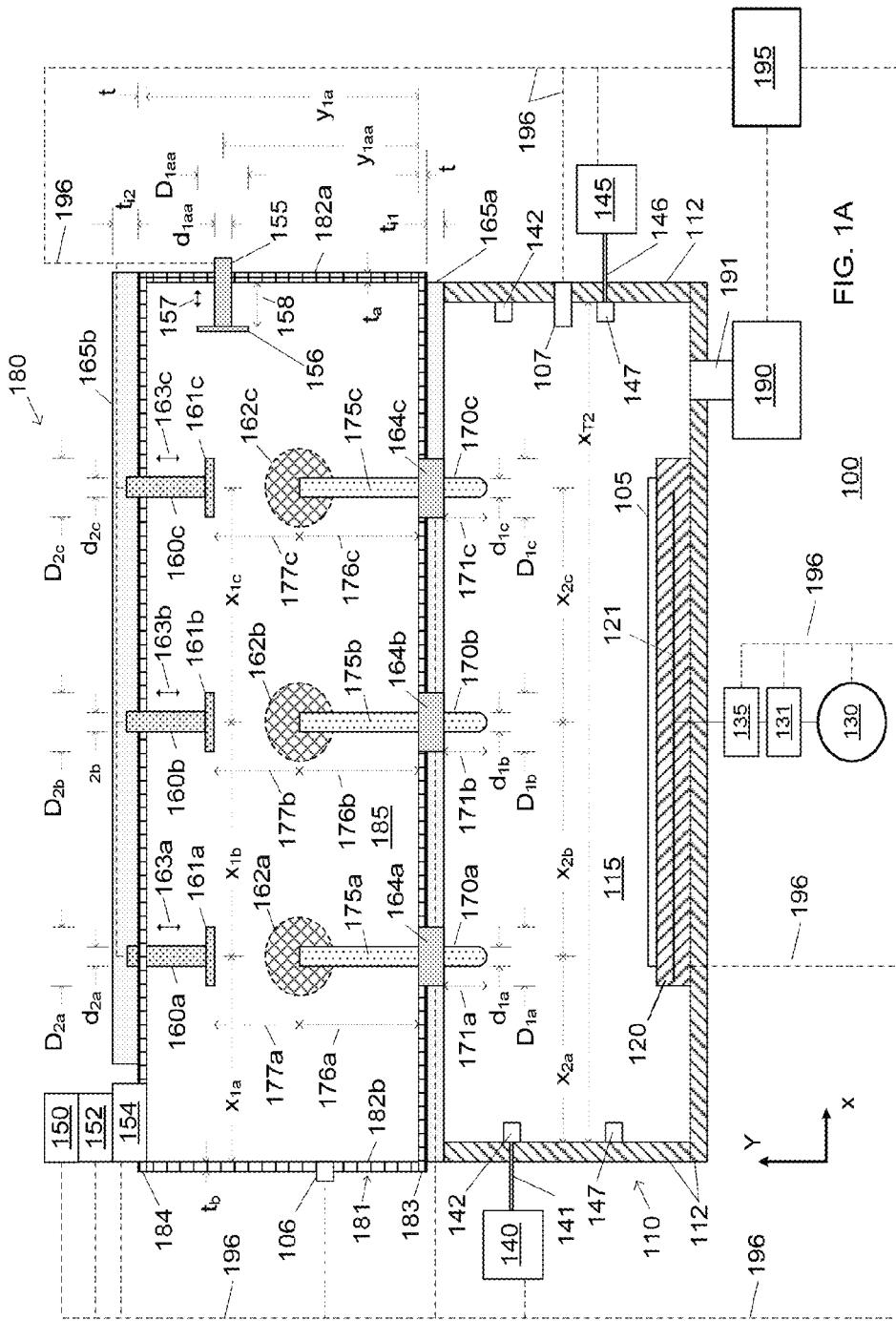
FIGS. 1A-1C illustrate different exemplary views of a first microwave processing system according to embodiments of the invention.

Referring now to the drawings, wherein like reference numerals designate identical or corresponding parts throughout the several views, FIG. 1A illustrates a first microwave resonator system 100 according to embodiments of the invention. The first microwave resonator system 100 may be used in a dry plasma etching system or a plasma enhanced deposition system. The first microwave resonator system 100 can include a first resonator subsystem 180 that can be coupled to a process chamber 110. Alternatively, the first microwave resonator system 100 may be configured differently.

FIG. 1A shows a front view of the first microwave resonator system 100. The front view shows an x/y plane view of a process chamber 110 that can be configured using a first interface assembly 165a, a plurality of chamber walls 112 coupled to the first interface assembly 165a, and a process space 115 can be configured within the process chamber 110. For example, the chamber walls 112 can have wall thicknesses (t) associated therewith, and the wall thicknesses (t) can vary from about 1 mm to about 5 mm. The first interface assembly 165a can have a first interface thickness ($t_{i1}$) associated therewith, and the first interface thickness ($t_{i1}$) can vary from about 1 mm to about 10 mm.

The front view shows an x/y plane view of a first resonator subsystem 180 that can comprise a first resonator assembly 181 having a plurality of resonator walls (182a, 182b, 183, and 184) defining a first EM-energy tuning space 185 therein. For example, the resonator walls (182a, 182b, 183, and 184) can include dielectric material such as quartz. In addition, one or more resonator sensors 106 can be coupled to the first EM-energy tuning space 185 to obtain first resonator data.

The resonator walls 182a can have wall thicknesses ($t_a$) associated therewith, and the wall thicknesses ($t_a$) can vary from about 1 mm to about 5 mm. The resonator walls 182b can have wall thicknesses ($t_b$) associated therewith, and the wall thicknesses ($t_b$) can vary from about 1 mm to about 5 mm. The resonator walls 182 can have wall thicknesses (t) associated therewith, and the wall thicknesses (t) can vary from about 1 mm to about 5 mm.

In some examples, the first interface assembly 165a can be used to removably couple the first resonator assembly 181 to the process chamber 110. The first interface assembly 165a can have first interface thicknesses ($t_{i1}$) associated therewith, and the first interface thicknesses ($t_{i1}$) can vary from about 1 mm to about 10 mm. Alternatively, the first interface assembly 165a may not be required or may be configured differently. A first interface assembly 165a can comprise one or more isolation assemblies (164a, 164b, and 164c). Each of the isolation assemblies (164a, 164b, and 164c) can be removably coupled to a lower resonator wall 183 and removably coupled to one or more of the first interface assembly 165a.

In addition, a second interface assembly 165b can be coupled to the first resonator assembly 181 using an upper resonator wall 184. The second interface assembly 165b can have second interface thicknesses ($t_{i2}$) associated therewith, and the second interface thicknesses ($t_{i2}$) can vary from about 1 mm to about 10 mm. Alternatively, the second interface assembly 165b may not be required or may be configured differently. The second interface assembly 165b can comprise one or more control assemblies (160a, 160b, and 160c). Each of the control assemblies (160a, 160b, and 160c) can be removably coupled to the upper resonator wall 184 and removably coupled to the second interface assembly 165b.

The first microwave resonator system 100 can be configured to form plasma in the process space 115 as the substrate holder 120 and the substrate are moved through the process space 115. The first microwave resonator system 100 can be configured to process 200 mm substrates, 300 mm substrates, or larger-sized substrates. In addition, square and/or rectangular chambers can be configured so that the first microwave resonator system 100 may be configured to process square or rectangular substrates, wafers, or LCDs regardless of their size, as would be appreciated by those skilled in the art. Therefore, while aspects of the invention will be described in connection with the processing of a semiconductor substrate, the invention is not limited solely thereto.

In other embodiments, the first resonator subsystem 180 can comprise a plurality of resonant cavities (not shown) therein. In some other embodiments, the first resonator subsystem 180 can comprise a plurality of resonator subsystems having one or more resonant cavities therein. In various systems, the first resonator subsystem 180 and the first EM-energy tuning space 185 can have cylindrical shapes, rectangular shapes, or squares shapes.

In some embodiments, a microwave source 150 can be coupled to the first resonator assembly 181. In addition, one or more RF sources (not shown) sources (not shown) may be coupled to the first resonator subsystem 180. The microwave source 150 can be coupled to a matching network 152, and the matching network 152 can be coupled to a coupling network 154. Alternatively, a plurality of matching networks (not shown) or a plurality of coupling networks (not shown) may be coupled to the first resonator subsystem 180. The coupling network 154 can be removably coupled to an upper resonator wall 184 of the first resonator assembly 181 and can be used to provide microwave energy to the first EM-energy tuning space 185. Alternatively, other coupling configurations may be used.

A first plasma-tuning rod (170a, 175a) can have a first plasma-tuning portion 170a that can extend into the process space 115 at a first location ($x_{2a}$), and a first EM-tuning portion 175a that can extend into the first EM-energy tuning space 185 at a first location ($x_{1a}$). A first isolation assembly 164a can be used to position (extend) the first plasma-tuning portion 170a a first plasma-tuning distance 171a within the process space 115 at a first location defined using ($x_{2a}$). For example, the first plasma-tuning distance 171a can vary from about 10 mm to about 400 mm, and the first plasma-tuning distance 171a can be wavelength-dependent and can vary from about (λ/4) to about (10λ).

A first EM-coupling region 162a can be established at a first EM-coupling distance 176a from the upper resonator wall 184 within the first EM-energy tuning space 185, and the first EM-tuning portion 175a can extend into the first EM-coupling region 162a. The first EM-tuning portion 175a can obtain first tunable microwave energy from the first EM-coupling region 162a, and the first microwave energy can be transferred as first plasma-tuning energy to the process space 115 at the first location ($x_{2a}$) using the first plasma-tuning portion 170a. The first EM-coupling region 162a can include a tunable E-field region, a tunable H-field region, a maximum field region, a maximum voltage region, maximum energy region, or a maximum current region, or any combination thereof. For example, the first EM-coupling distance 176a can vary from about 0.01 mm to about 10 mm, and the first EM-coupling distance 176a can be wavelength-dependent and can vary from about (λ/4) to about (10λ).

A first plasma-tuning slab 161a can be coupled to a first control assembly 160a and can be used to move 163a the first plasma-tuning slab 161a a first EM-tuning distance 177a relative to the first EM-tuning portion 175a of the first plasma-tuning rod (170a, 175a) within the first EM-energy tuning space 185. The first control assembly 160a and the first plasma-tuning slab 161a can be used to optimize the microwave energy coupled from the first EM-coupling region 162a to the first EM-tuning portion 175a of the first plasma-tuning rod (170a, 175a). For example, the first EM-tuning distance 177a can be established between the first EM-tuning portion 175a and the first plasma-tuning slab 161a within the first EM-energy tuning space 185, and the first EM-tuning distance 177a can vary from about 0.01 mm to about 1 mm.

The first plasma-tuning rod (170a, 175a) can have a first diameter ($d_{1a}$) associated therewith, and the first diameter ($d_{1a}$) can vary from about 0.01 mm to about 1 mm. The first isolation assembly 164a can have a first diameter ($D_{1a}$) associated therewith, and the first diameter ($D_{1a}$) can vary from about 1 mm to about 10 mm.

The first EM-tuning portion 175a, the first EM-coupling region 162a, the first control assembly 160a, and the first plasma-tuning slab 161a can have a first x/y plane offset ($x_{1a}$) associated therewith. For example, the first x/x plane offset ($x_{1a}$) can be established relative to the resonator wall 182b, can be wavelength-dependent, and can vary from about (λ/4) to about (10λ). The first control assembly 160a can have a cylindrical configuration and a diameter ($d_{2a}$) that can vary from about 1 mm to about 5 mm. The first plasma-tuning slab 161a can have diameters ($D_{2a}$) associated therewith, and the diameter ($D_{2a}$) can vary from about 1 mm to about 10 mm.

A second plasma-tuning rod (170b, 175b) can have a second plasma-tuning portion 170b that can extend into the process space 115 at a second location ($x_{2b}$), and a second EM-tuning portion 175b that can extend into the first EM-energy tuning space 185 at a second location ($x_{1b}$). A second isolation assembly 164b can be used to position (extend) the second plasma-tuning portion 170b at the second plasma-tuning distance 171b within the process space 115 at second locations defined using ($x_{2b}$). For example, the second plasma-tuning distances 171b can vary from about 10 mm to about 400 mm, and the second plasma-tuning distances 171b can be wavelength-dependent and can vary from about (λ/4) to about (10λ).

A second EM-coupling region 162b can be established at second EM-coupling distances 176b from the lower resonator wall 183 defining the first EM-energy tuning space 185, and the second EM-tuning portion 175b can extend into the second EM-coupling region 162b. The second EM-tuning portion 175b can obtain second tunable microwave energy from the second EM-coupling region 162b, and the second microwave energy can be transferred as second plasma-tuning energy to the process space 115 at the second location ($x_{2b}$) using the second plasma-tuning portion 170b. The second EM-coupling region 162b can include a tunable E-field region, a tunable H-field region, a maximum field region, a maximum voltage region, maximum energy region, or a maximum current region, or any combination thereof. For example, the second EM-coupling distance 176b can vary from about 0.01 mm to about 10 mm, and the second EM-coupling distance 176b can be wavelength-dependent and can vary from about (λ/4) to about (10λ).

A second plasma-tuning slab 161b can be coupled to a second control assembly 160b and can be used to move 163b the second plasma-tuning slab 161b second EM-tuning distances 177b relative to the second EM-tuning portion 175b of the second plasma-tuning rod (170b, 175b) within the first EM-energy tuning space 185. The second control assembly 160b and the second plasma-tuning slab 161b can be used to optimize the microwave energy coupled from the second EM-coupling region 162b to the second EM-tuning portion 175b of the second plasma-tuning rod (170b, 175b). For example, the second EM-tuning distances 177b can be established between the second EM-tuning portion 175b and the second plasma-tuning slab 161b within the first EM-energy tuning space 185, and the second EM-tuning distances 177b can vary from about 0.01 mm to about 1 mm.

The second plasma-tuning rod (170b, 175b) can have second diameters ($d_{1b}$) associated therewith, and the second diameters ($d_{1b}$) can vary from about 0.01 mm to about 1 mm. The second isolation assembly 164b can have second diameters ($D_{1b}$) associated therewith, and the second diameters ($D_{1b}$) can vary from about 1 mm to about 10 mm.

The second EM-tuning portion 175b, the second EM-coupling region 162b, the second control assembly 160b, and the second plasma-tuning slab 161b can have second x/y plane offsets ($x_{1b}$) associated therewith. For example, the second x/y plane offsets ($x_{1b}$) can be established relative to the resonator wall 182b and can be wavelength-dependent and can vary from about (λ/4) to about (10λ). The second control assembly 160b can have a cylindrical configuration and second diameters ($d_{2b}$) that can vary from about 1 mm to about 5 mm. The second plasma-tuning slab 161b can have diameters ($D_{2b}$) associated therewith, and the diameters ($D_{2b}$) can vary from about 1 mm to about 10 mm.

A third plasma-tuning rod (170c, 175c) can have a third plasma-tuning portion 170c that can extend into the process space 115 at a third location ($x_{2c}$), and a third EM-tuning portion 175c that can extend into the first EM-energy tuning space 185 at a third location ($x_{1c}$). A third isolation assembly 164c can be used to position (extend) the third plasma-tuning portion 170c at the third plasma-tuning distances 171c within the process space 115 at third locations defined using ($x_{2c}$). For example, the third plasma-tuning distances 171c can vary from about 10 mm to about 400 mm, and the third plasma-tuning distances 171c can be wavelength-dependent and can vary from about (λ/4) to about (10λ).

A third EM-coupling region 162c can be established at third EM-coupling distances 176c from the lower resonator wall 183 defining the first EM-energy tuning space 185, and the third EM-tuning portion 175c can extend into the third EM-coupling region 162c. The third EM-tuning portion 175c can obtain third tunable microwave energy from the third EM-coupling region 162c, and the third microwave energy can be transferred as third plasma-tuning energy to the process space 115 at the third location ($x_{2c}$) using the third plasma-tuning portion 170c. The third EM-coupling region 162c can include a tunable E-field region, a tunable H-field region, a maximum field region, a maximum voltage region, maximum energy region, or a maximum current region, or any combination thereof. For example, the third EM-coupling distance 176c can vary from about 0.01 mm to about 10 mm, and the third EM-coupling distance 176c can be wavelength-dependent and can vary from about ($\lambda/4$) to about ($10\lambda$).

A third plasma-tuning slab 161c can be coupled to a third control assembly 160c and can be used to move 163c the third plasma-tuning slab 161c third EM-tuning distances 177c relative to the third EM-tuning portion 175c of the third plasma-tuning rod (170c, 175c) within the first EM-energy tuning space 185. The third control assembly 160c and the third plasma-tuning slab 161c can be used to optimize the microwave energy coupled from the third EM-coupling region 162c to the third EM-tuning portion 175c of the third plasma-tuning rod (170c, 175c). For example, the third EM-tuning distances 177c can be established between the third EM-tuning portion 175c and the third plasma-tuning slab 161c within the first EM-energy tuning space 185, and the third EM-tuning distances 177c can vary from about 0.01 mm to about 1 mm.

The third plasma-tuning rod (170c, 175c) can have third diameters ($d_{1c}$) associated therewith, and the third diameters ($d_{1c}$) can vary from about 0.01 mm to about 1 mm. The third isolation assembly 164c can have third diameters ($D_{1c}$) associated therewith, and the third diameters ($D_{1c}$) can vary from about 1 mm to about 10 mm.

The third EM-tuning portion 175c, the third EM-coupling region 162c, the third control assembly 160c, and the third plasma-tuning slab 161c can have third x/y plane offsets ($x_{1c}$) associated therewith. For example, the third x/y plane offsets ($x_{1c}$) can be established relative to the resonator wall 182b and can be wavelength-dependent and can vary from about ($\lambda/4$) to about ($10\lambda$). The third control assembly 160c can have a cylindrical configuration and third diameters ($d_{2c}$) that can vary from about 1 mm to about 5 mm. The third plasma-tuning slab 161c can have third diameters ($D_{2c}$) associated therewith, and the third diameters ($D_{2c}$) can vary from about 1 mm to about 10 mm.

The control assemblies (160a, 160b, and 165c) can be coupled 196 to the controller 195, and the controller 195 can use process recipes to establish, control, and optimize the EM-tuning distances (177a, 177b, and 177c) to control the plasma uniformity within the process space 115. The controller 195 can be coupled 196 to the microwave source 150, the matching network 152, and the coupling network 154, and the controller 195 can use process recipes to establish, control, and optimize the microwave source 150, the matching network 152, and the coupling network 154 to control the EM-coupling regions (162a, 162b, and 165c) in the EM-energy tuning space 185 and the plasma uniformity within the process space 115. For example, the microwave source 150 can operate at frequencies from about 500 MHz to about 5000 MHz. In addition, the controller 195 can be coupled 196 to the resonator sensors 106 and process sensors 107, and the controller 195 can use process recipes to establish, control, and optimize the data from the resonator sensors 106 and the process sensors 107 to control the EM-coupling regions (162a, 162b, and 165c) in the EM-energy tuning space 185 and the plasma uniformity within the process space 115.

The front view of the first microwave resonator system 100 includes an x/y plane view of a cavity-control assembly 155 that is shown coupled to a front view of a cavity-tuning slab 156. The cavity-control assembly 155 can have a first diameter ($d_{1aa}$) associated therewith, and the first diameter ($d_{1aa}$) can vary from about 0.01 mm to about 1 mm. The cavity-tuning slab 156 can have a second diameter ($D_{1aa}$) associated therewith, and the second diameter ($D_{1aa}$) can vary from about 1 mm to about 10 mm. The cavity-control assembly 155 and the cavity-tuning slab 156 can have a first x/y plane offset ($y_{1aa}$) associated therewith, and the first x/y plane offset ($y_{1aa}$) can vary from about 1 mm to about 10 mm.

The cavity-control assembly 155 can be used to move 157 the cavity-tuning slab 156 cavity-tuning distances 158 within the first EM-energy tuning space 185. The controller 195 can be coupled 196 to the cavity-control assembly 155, and the controller 195 can use process recipes to establish, control, and optimize the cavity-tuning distances 158 to control and maintain the plasma uniformity within the process space 115 in real-time. For example, the cavity-tuning distances 158 can vary from about 0.01 mm to about 10 mm, and the cavity-tuning distances 158 can be wavelength-dependent and can vary from about ($\lambda/4$) to about ($10\lambda$).

Still referring to FIG. 1A, a substrate holder 120, and a lower electrode 121 are shown. When present, the lower electrode 121 can be used to couple Radio Frequency (RF) power to plasma in process space 115. For example, lower electrode 121 can be electrically biased at an RF voltage via the transmission of RF power from RF generator 130 through impedance match network 131 and RF sensor 135 to lower electrode 121. The RF bias can serve to heat electrons to form and/or maintain the plasma. A typical frequency for the RF bias can range from 1 MHz to 100 MHz and is preferably 13.56 MHz. Alternatively, RF power may be applied to the lower electrode 121 at multiple frequencies. Furthermore, impedance match network 131 can serve to maximize the transfer of RF power to the plasma in process chamber 110 by minimizing the reflected power. Various match network topologies and automatic control methods can be utilized. The RF sensor 135 can measure the power levels and/or frequencies associated with the fundamental signals, harmonic signals, and/or intermodulation signals. In addition, the controller 195 can be coupled 196 to the RF generator 130, the impedance match network 131, and the RF sensor 135, and the controller 195 can use process recipes to establish, control, and optimize the data to and from the RF generator 130, the impedance match network 131, and the RF sensor 135 to control the EM-coupling regions (162a, 162b, and 165c) in the EM-energy tuning space 185 and the plasma uniformity within the process space 115.

Some of the first microwave resonator systems 100 can include a pressure control system 190 and exhaust port 191 coupled to the process chamber 110, and configured to evacuate the process chamber 110, as well as control the pressure within the process chamber 110. Alternatively, the pressure control system 190 and/or the exhaust port 191 may not be required.

As shown in FIG. 1A, the first microwave resonator systems 100 can comprise a first gas supply system 140 coupled to a first supply element 141, and the first supply element 141 can be coupled to one or more first flow elements 142 that can be coupled to the process chamber 110. The first flow elements 142 can be configured to introduce a first process gas to process space 115, and can include flow control and/or flow measuring devices. In addition, the first microwave resonator systems 100 can comprise a second gas supply system 145 coupled to a second supply element 146, and the second supply element 146 can be one or more second flow elements 147 that can be coupled to the process chamber 110. The second flow elements 147 can be configured to introduce a second process gas to process space 115, and can include flow control and/or flow measuring devices. Alternatively, the second gas supply system 145, the second supply element 146, and/or the second flow elements 147 may not be required.

During dry plasma etching, the process gas may comprise an etchant, a passivant, or an inert gas, or a combination of two or more thereof. For example, when plasma etching a dielectric film such as silicon oxide ($SiO_x$) or silicon nitride ($Si_xN_y$), the plasma etch gas composition generally includes a fluorocarbon-based chemistry ($C_xF_y$) such as at least one of $C_4F_8$, $C_5F_8$, $C_3F_6$, $C_4F_6$, $CF_4$, etc., and/or may include a fluorohydrocarbon-based chemistry ($C_xH_yF_z$) such as at least one of $CHF_3$, $CH_2F_2$, etc., and can have at least one of an inert gas, oxygen, CO or $CO_2$. Additionally, for example, when etching polycrystalline silicon (polysilicon), the plasma etch gas composition generally includes a halogen-containing gas such as HBr, $Cl_2$, $NF_3$, or $SF_6$ or a combination of two or more thereof, and may include fluorohydrocarbon-based chemistry ($C_xH_yF_z$) such as at least one of $CHF_3$, $CH_2F_2$, etc., and at least one of an inert gas, oxygen, CO or $CO_2$, or two or more thereof. During plasma-enhanced deposition, the process gas may comprise a film forming precursor, a reduction gas, or an inert gas, or a combination of two or more thereof.

Figure 1B:
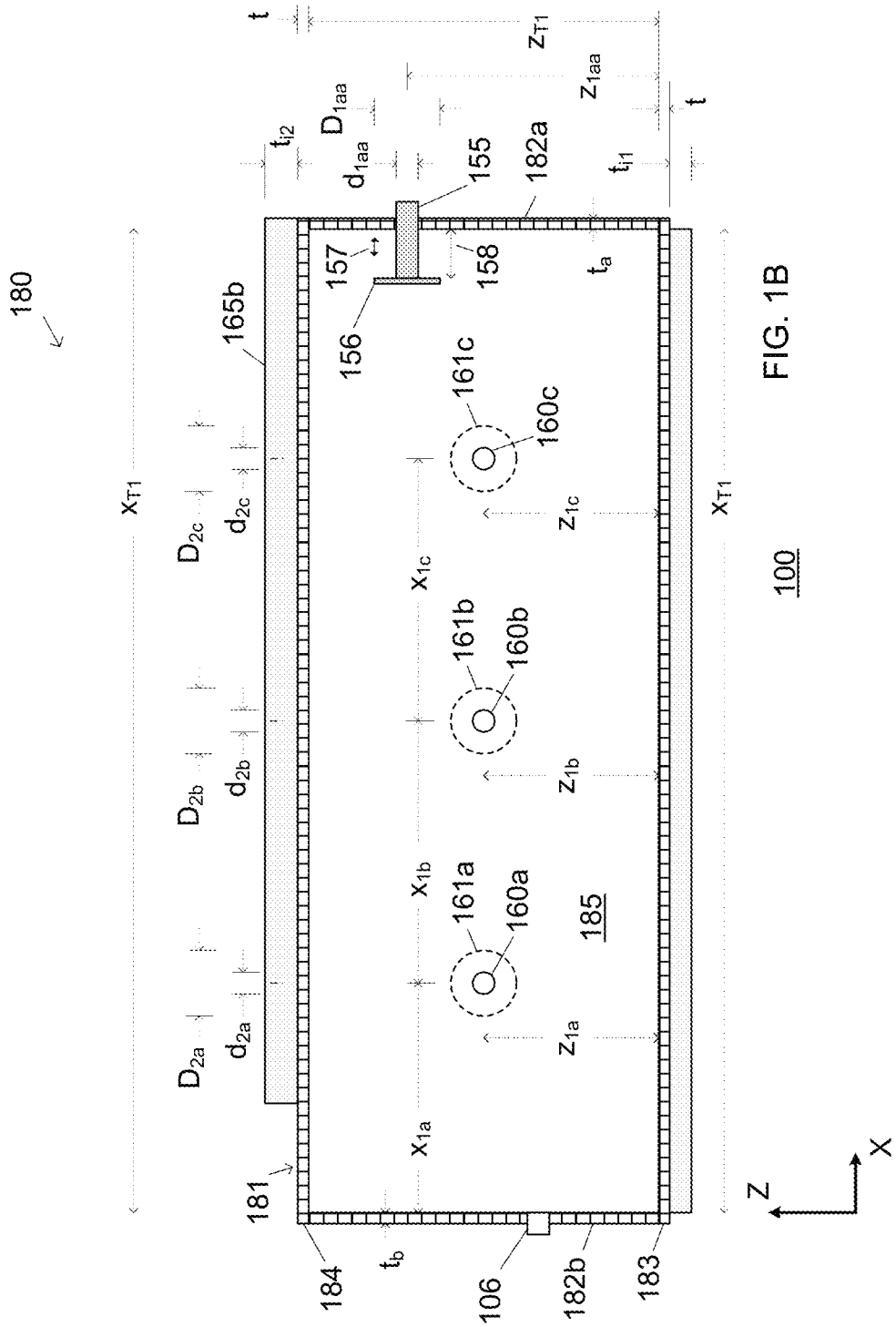

FIG. 1B illustrates a top view of a first resonator assembly in accordance with embodiments of the invention. The first resonator subsystem 180 can have a total length ($x_{T1}$) and a total height ($z_{T1}$) associated therewith in the x/z plane. For example, the total length ($x_{T1}$) can vary from about 10 mm to about 500 mm, and the total height ($z_{T1}$) can vary from about 10 mm to about 1000 mm.

The top view of first resonator subsystem 180 includes an x/z plane view of a first control assembly 160a that is shown surrounded by a top (dash line) view of a first plasma-tuning slab 161a. The first control assembly 160a can have a first diameter ($d_{2a}$) associated therewith, and the first diameter ($d_{2a}$) can vary from about 0.01 mm to about 1 mm. The first plasma-tuning slab 161a can have a second diameter ($D_{2a}$) associated therewith, and the second diameter ($D_{2a}$) can vary from about 1 mm to about 10 mm. The first control assembly 160a and the first plasma-tuning slab 161a can have first x/z plane offsets ($x_{1a}$) associated therewith, and the first x/z plane offsets ($x_{1a}$) can vary from about 1 mm to about 10 mm. Alternatively, the first control assembly 160a and the first plasma-tuning slab 161a may have different first x/z plane offsets ($x_{1a}$) associated therewith. The first control assembly 160a and the first plasma-tuning slab 161a can have first x/z plane offsets ($z_{1a}$) associated therewith, and the first x/z plane offsets ($z_{1a}$) can vary from about 1 mm to about 10 mm. Alternatively, the first control assembly 160a and the first plasma-tuning slab 161a may have different first x/z plane offsets ($z_{1a}$) associated therewith.

In addition, the top view of first resonator subsystem 180 includes an x/z plane view of a second control assembly 160b that is shown surrounded by a top (dash line) view of a second plasma-tuning slab 161b. The second control assembly 160b can have a first diameter ($d_{2b}$) associated therewith, and the first diameter ($d_{2b}$) can vary from about 0.01 mm to about 1 mm. The second plasma-tuning slab 161b can have a second diameter ($D_{2b}$) associated therewith, and the second diameter ($D_{2b}$) can vary from about 1 mm to about 10 mm. The second control assembly 160b and the second plasma-tuning slab 161b can have second x/z plane offsets ($x_{1b}$) associated therewith, and the second x/z plane offsets ($x_{1b}$) can vary from about 1 mm to about 10 mm. Alternatively, the second control assembly 160b and the second plasma-tuning slab 161b may have different second x/z plane offsets ($x_{1b}$) associated therewith. The second control assembly 160b and the second plasma-tuning slab 161b can have second x/z plane offsets ($z_{1b}$) associated therewith, and the second x/z plane offsets ($z_{1b}$) can vary from about 1 mm to about 10 mm. Alternatively, the second control assembly 160b and the second plasma-tuning slab 161b may have different second x/z plane offsets ($z_{1a}$) associated therewith.

Furthermore, the top view of first resonator subsystem 180 includes an x/z plane view of a third control assembly 160c that is shown surrounded by a top (dash line) view of a third plasma-tuning slab 161c. The third control assembly 160c can have a first diameter ($d_{2c}$) associated therewith, and the first diameter ($d_{2c}$) can vary from about 0.01 mm to about 1 mm. The third plasma-tuning slab 161c can have a second diameter ($D_{2c}$) associated therewith, and the third diameter ($D_{2c}$) can vary from about 1 mm to about 10 mm. The third control assembly 160c and the third plasma-tuning slab 161c can have third x/z plane offsets ($x_{1c}$) associated therewith, and the third x/z plane offsets ($x_{1c}$) can vary from about 1 mm to about 10 mm. Alternatively, the third control assembly 160c and the third plasma-tuning slab 161c may have different third x/z plane offsets ($x_{1c}$) associated therewith. The third control assembly 160c and the third plasma-tuning slab 161c can have third x/z plane offsets ($z_{1c}$) associated therewith, and the third x/z plane offsets ($z_{1c}$) can vary from about 1 mm to about 10 mm. Alternatively, the third control assembly 160c and the third plasma-tuning slab 161c may have different third x/z plane offsets ($z_{1c}$) associated therewith.

FIG. 1B shows top views of resonator walls (182a, 182b, 183, and 184). The resonator wall 182a can have wall thicknesses ($t_a$) associated therewith, and the wall thicknesses ($t_a$) can vary from about 1 mm to about 5 mm. The resonator wall 182b can have wall thicknesses ($t_b$) associated therewith, and the wall thicknesses ($t_b$) can vary from about 1 mm to about 5 mm. The resonator walls (182a and 182b) can have wall thicknesses (t) associated therewith, and the wall thicknesses (t) can vary from about 1 mm to about 5 mm.

The top view of the first microwave resonator system 100 includes an x/z plane view of a cavity-control assembly 155 that is shown coupled to a top view of a cavity-tuning slab 156. The cavity-control assembly 155 can have a first diameter ($d_{1aa}$) associated therewith, and the first diameter ($d_{1aa}$) can vary from about 0.01 mm to about 1 mm. The cavity-tuning slab 156 can have a second diameter ($D_{1aa}$) associated therewith, and the second diameter ($D_{1aa}$) can vary from about 1 mm to about 10 mm. The cavity-control assembly 155 and the cavity-tuning slab 156 can have a first x/z plane offset ($z_{1aa}$) associated therewith, and the first x/z plane offset ($z_{1aa}$) can vary from about 1 mm to about 10 mm.

Figure 1C:
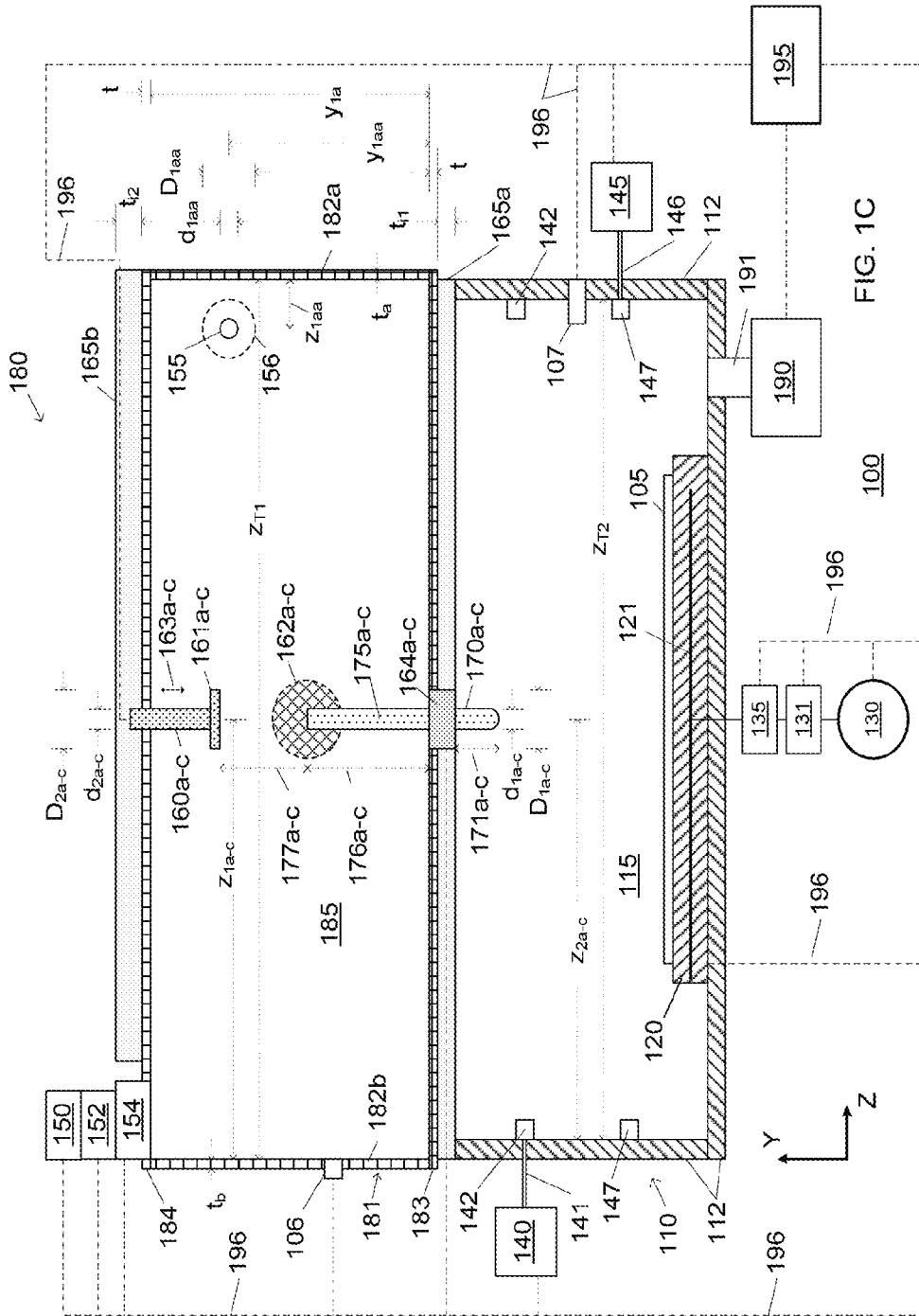

FIG. 1C illustrates a side view of the first microwave resonator system 100. The side view shows a y/z plane view of a process chamber 110 that can be configured using a first interface assembly 165a, a plurality of chamber walls 112 coupled to the first interface assembly 165a, and a process space 115 can be configured within the process chamber 110. For example, the chamber walls 112 can have wall thicknesses (t) associated therewith, and the wall thicknesses (t) can vary from about 1 mm to about 5 mm. The first interface assembly 165a can have a first interface thickness ($t_{i1}$) associated therewith, and the first interface thickness ($t_{i1}$) can vary from about 1 mm to about 10 mm.

The side view shows a y/z plane view of a first resonator subsystem 180 that can comprise a first resonator assembly 181 that can be configured using a plurality of resonator walls (182a, 182b, 183, and 184). For example, the resonator walls (182a, 182b, 183, and 184) can include dielectric material such as quartz and can define a first EM-energy tuning space 185 therein. In addition, one or more resonator sensors 106 can be coupled to the first EM-energy tuning space 185 to obtain first resonator data.

The resonator walls 182a can have wall thicknesses ($t_a$) associated therewith, and the wall thicknesses ($t_a$) can vary from about 1 mm to about 5 mm. The resonator walls 182b can have wall thicknesses ($t_b$) associated therewith, and the wall thicknesses ($t_b$) can vary from about 1 mm to about 5 mm. The resonator walls 182 can have wall thicknesses (t) associated therewith, and the wall thicknesses (t) can vary from about 1 mm to about 5 mm.

In some examples, the first interface assembly 165a can be used to removably couple the first resonator assembly 181 to the process chamber 110. The first interface assembly 165a can have first interface thicknesses ($t_{i1}$) associated therewith, and the first interface thicknesses ($t_{i1}$) can vary from about 1 mm to about 10 mm. Alternatively, the first interface assembly 165a may not be required or may be configured differently. A first interface assembly 165a can comprise one or more isolation assemblies (164a, 164b, and 164c). Each of the isolation assemblies (164a, 164b, and 164c) can be removably coupled to a lower resonator wall 183 and removably coupled to one or more of the first interface assembly 165a.

In addition, a second interface assembly 165b can be coupled to the first resonator assembly 181 using an upper resonator wall 184. The second interface assembly 165b can have second interface thicknesses ($t_{i2}$) associated therewith, and the second interface thicknesses ($t_{i2}$) can vary from about 1 mm to about 10 mm. Alternatively, the second interface assembly 165b may not be required or may be configured differently. The second interface assembly 165b can comprise one or more control assemblies (160a, 160b, and 160c). Each of the control assemblies (160a, 160b, and 160c) can be removably coupled to the upper resonator wall 184 and removably coupled to the second interface assembly 165b.

The first microwave resonator system 100 can be configured to form plasma in the process space 115 as the substrate holder 120 and the substrate are moved through the process space 115. The first microwave resonator system 100 can be configured to process 200 mm substrates, 300 mm substrates, or larger-sized substrates. In addition, square and/or rectangular chambers can be configured so that the first microwave resonator system 100 may be configured to process square or rectangular substrates, wafers, or LCDs regardless of their size, as would be appreciated by those skilled in the art. Therefore, while aspects of the invention will be described in connection with the processing of a semiconductor substrate, the invention is not limited solely thereto.

In other embodiments, the first resonator subsystem 180 can comprise a plurality of resonant cavities (not shown) therein. In some other embodiments, the first resonator subsystem 180 can comprise a plurality of resonator subsystems having one or more resonant cavities therein. In various systems, the first resonator assembly 181 and the first EM-energy tuning space 185 can have cylindrical shapes, rectangular shapes, or squares shapes.

In FIG. 1C, a microwave source 150 is shown coupled to the first resonator assembly 181. The microwave source 150 can be coupled to a matching network 152, and the matching network 152 can be coupled to a coupling network 154. Alternatively, a plurality of matching networks (not shown) or a plurality of coupling networks (not shown) may be coupled to the first resonator subsystem 180. The coupling network 154 can be removably coupled to an upper resonator wall 184 of the first resonator assembly 181 and can be used to provide microwave energy to the first EM-energy tuning space 185. Alternatively, other coupling configurations may be used.

The side view includes a y/z plane view of a first set of plasma-tuning rods {(170a, 175a), (170b, 175b), and (170c, 175c)} that can have a first set of plasma-tuning portions (170a, 170b, and 170c) that can extend into the process space 115 at first y/z plane locations ($z_{2a-c}$), and a first set of EM-tuning portions (175a, 175b, and 175c) that can extend into the first EM-energy tuning space 185 at second z-plane locations ($z_{1a-c}$). A first set of isolation assemblies (164a, 164b, and 164c) can be used to position (extend) the first set of plasma-tuning portions (170a, 170b, and 170c) plasma-tuning distances (171a, 171b, and 171c) within the process space 115 at the first locations defined using ($z_{2a-c}$). For example, the plasma-tuning distances (171a, 171b, and 171c) can vary from about 10 mm to about 400 mm, and the plasma-tuning distances (171a, 171b, and 171c) can be wavelength-dependent and can vary from about ($\lambda/4$) to about ($10\lambda$).

A first set of EM-coupling regions (162a, 162b, and 162c) can be established at a first set of EM-coupling distances (176a, 176b, and 176c) from the lower resonator wall 183 within the first EM-energy tuning space 185, and the first set of EM-tuning portions (175a, 175b, and 175c) can extend into the first set of EM-coupling regions (162a, 162b, and 162c). The first set of EM-tuning portions (175a, 175b, and 175c) can obtain tunable microwave energies from the first set of EM-coupling regions (162a, 162b, and 162c), and the tunable microwave energies can be transferred as controllable plasma-tuning energies to the process space 115 at the first z-plane locations ($z_{2a-c}$) using the first set of plasma-tuning portions (170a, 170b, and 170c). The first set of EM-coupling regions (162a, 162b, and 162c) can include a tunable E-field region, a tunable H-field region, a maximum field region, a maximum voltage region, maximum energy region, or a maximum current region, or any combination thereof. For example, the first set of EM-coupling distances (176a, 176b, and 176c) can vary from about 0.01 mm to about 10 mm, and the first set of EM-coupling distances (176a, 176b, and 176c) can be wavelength-dependent and can vary from about ($\lambda/4$) to about ($10\lambda$).

A first set of plasma-tuning slabs (161a, 161b, and 161c) can be coupled to a first set of control assemblies (160a, 160b, and 160c) and can be used to move (163a, 163b, and 163c) the first set of plasma-tuning slabs (161a, 161b, and 161c) a first set of EM-tuning distances (177a, 177b, and 177c) relative to the first set of EM-tuning portions (175a, 175b, and 175c) of the first set of plasma-tuning rod {(170a, 175a), (170b, 175b), and (170c, 175c)} within the first EM-energy tuning space 185. The first set of control assemblies (160a, 160b, and 160c) and the first set of plasma-tuning slabs (161a, 161b, and 161c) can be used to optimize the microwave energies coupled from the first set of EM-coupling regions (162a, 162b, and 162c) to the first set of EM-tuning portions (175a, 175b, and 175c) of the first set of plasma-tuning rods {(170a, 175a), (170b, 175b), and (170c, 175c)}. For example, the first set of EM-tuning distances (177a, 177b, and 177c) can be established between the first set of EM-tuning portions (175a, 175b, and 175c) and the first set of plasma-tuning slabs (161a, 161b, and 161c) within the first EM-energy tuning space 185, and the first set of EM-tuning distances (177a, 177b, and 177c) can vary from about 0.01 mm to about 1 mm.

The first set of plasma-tuning rod {(170a, 175a), (170b, 175b), and (170c, 175c)} can comprise dielectric material and can have first diameter ($d_{1a}$) associated therewith, and the first diameters ($d_{1a}$) can vary from about 0.01 mm to about 1 mm. The first set of isolation assemblies (164a, 164b, and 164c)

can have first diameters ($D_{1a}$) associated therewith, and the first diameters ($D_{1a}$) can vary from about 1 mm to about 10 mm.

The first set of EM-tuning portions (175a, 175b, and 175c), the first set of EM-coupling regions (162a, 162b, and 162c), the first set of control assemblies (160a, 160b, and 160c), and the first set of plasma-tuning slabs (161a, 161b, and 161c) can have z-plane offsets ($z_{1a-c}$) associated therewith. For example, the z-plane offsets ($z_{1a-c}$) can be established relative to the lower resonator wall 183 and can be wavelength-dependent and can vary from about ($\lambda/4$) to about ($10\lambda$). The first set of control assemblies (160a, 160b, and 160c) can comprise dielectric material, can have cylindrical configurations and diameter ($d_{2a-c}$) that can vary from about 1 mm to about 5 mm. The first set of plasma-tuning slabs (161a, 161b, and 161c) can comprise dielectric material and can have diameters ($D_{2a-c}$) associated therewith, and the diameters ($D_{2a-c}$) can vary from about 1 mm to about 10 mm.

As shown in FIG. 1C, the control assemblies (160a, 160b, and 165c) can be coupled 196 to the controller 195, and the controller 195 can use process recipes to establish, control, and optimize the EM-tuning distances (177a, 177b, and 177c) to control the EM-coupling regions (162a, 162b, and 165c) in the EM-energy tuning space 185 and the plasma uniformity within the process space 115. The controller 195 can be coupled 196 to the microwave source 150, the matching network 152, and the coupling network 154, and the controller 195 can use process recipes to establish, control, and optimize the microwave source 150, the matching network 152, and the coupling network 154 to control the EM-coupling regions (162a, 162b, and 165c) in the EM-energy tuning space 185 and the plasma uniformity within the process space 115. For example, the microwave source 150 can operate at frequencies from about 500 MHz to about 5000 MHz. In addition, the controller 195 can be coupled 196 to the resonator sensors 106 and process sensors 107, and the controller 195 can use process recipes to establish, control, and optimize the data from the resonator sensors 106 and the process sensors 107 to control the EM-coupling regions (162a, 162b, and 165c) in the EM-energy tuning space 185 and the plasma uniformity within the process space 115.

The side view of the first microwave resonator system 100 includes a y/z plane view of a cavity-control assembly 155 and a y/z plane view of a cavity-tuning slab 156. The cavity-control assembly 155 can have a first diameter ($d_{1aa}$) associated therewith, and the first diameter ($d_{1aa}$) can vary from about 0.01 mm to about 1 mm. The cavity-tuning slab 156 can have a second diameter ($D_{1aa}$) associated therewith, and the second diameter ($D_{1aa}$) can vary from about 1 mm to about 10 mm. The cavity-control assembly 155 and the cavity-tuning slab 156 can have first y-plane offsets ($y_{1aa}$) associated therewith, and the first y-plane offsets ($y_{1aa}$) can vary from about 1 mm to about 10 mm.

Still referring to FIG. 1C, side views of the substrate holder 120 and the lower electrode 121 are shown. When present, the lower electrode 121 can be used to couple Radio Frequency (RF) power to plasma in process space 115. For example, lower electrode 121 can be electrically biased at an RF voltage via the transmission of RF power from RF generator 130 through impedance match network 131 and RF sensor 135 to lower electrode 121. The RF bias can serve to heat electrons to form and/or maintain the plasma. A typical frequency for the RF bias can range from 1 MHz to 100 MHz and is preferably 13.56 MHz. Alternatively, RF power may be applied to the lower electrode 121 at multiple frequencies. Furthermore, impedance match network 131 can serve to maximize the transfer of RF power to the plasma in process chamber 110 by minimizing the reflected power. Various match network topologies and automatic control methods can be utilized. The RF sensor 135 can measure the power levels and/or frequencies associated with the fundamental signals, harmonic signals, and/or intermodulation signals. In addition, the controller 195 can be coupled 196 to the RF generator 130, the impedance match network 131, and the RF sensor 135, and the controller 195 can use process recipes to establish, control, and optimize the data to and from the RF generator 130, the impedance match network 131, and the RF sensor 135 to control the EM-coupling regions (162a, 162b, and 165c) in the EM-energy tuning space 185 and the plasma uniformity within the process space 115.

The side view of the first microwave resonator system 100 can include a y/z plane view of a pressure control system 190 and exhaust port 191 coupled to the process chamber 110, and configured to evacuate the process chamber 110, as well as control the pressure within the process chamber 110. Alternatively, the pressure control system 190 and/or the exhaust port 191 may not be required.

As shown in FIG. 1C, the side view can include y/z plane views of the first gas supply system 140, the first supply element 141, the first flow elements 142, and the process chamber 110. The first flow elements 142 can be configured around the process space 115, and can be configured to introduce a first process gas to process space 115. In addition, the side view can include y/z plane views of the second gas supply system 145, the second supply element 146, and the second flow elements 147. The second flow elements 147 can be configured around the process space 115, and can be configured to introduce a second process gas to process space 115.

During dry plasma etching, the process gas may comprise an etchant, a passivant, or an inert gas, or a combination of two or more thereof. For example, when plasma etching a dielectric film such as silicon oxide ($SiO_x$) or silicon nitride ($Si_xN_y$), the plasma etch gas composition generally includes a fluorocarbon-based chemistry ($C_xF_y$) such as at least one of $C_4F_8$, $C_5F_8$, $C_3F_6$, $C_4F_6$, $CF_4$, etc., and/or may include a fluorohydrocarbon-based chemistry ($C_xH_yF_z$) such as at least one of $CHF_3$, $CH_2F_2$, etc., and can have at least one of an inert gas, oxygen, CO or $CO_2$. Additionally, for example, when etching polycrystalline silicon (polysilicon), the plasma etch gas composition generally includes a halogen-containing gas such as HBr, $Cl_2$, $NF_3$, or $SF_6$ or a combination of two or more thereof, and may include fluorohydrocarbon-based chemistry ($C_xH_yF_z$) such as at least one of $CHF_3$, $CH_2F_2$, etc., and at least one of an inert gas, oxygen, CO or $CO_2$, or two or more thereof. During plasma-enhanced deposition, the process gas may comprise a film forming precursor, a reduction gas, or an inert gas, or a combination of two or more thereof.

Figure 2A:
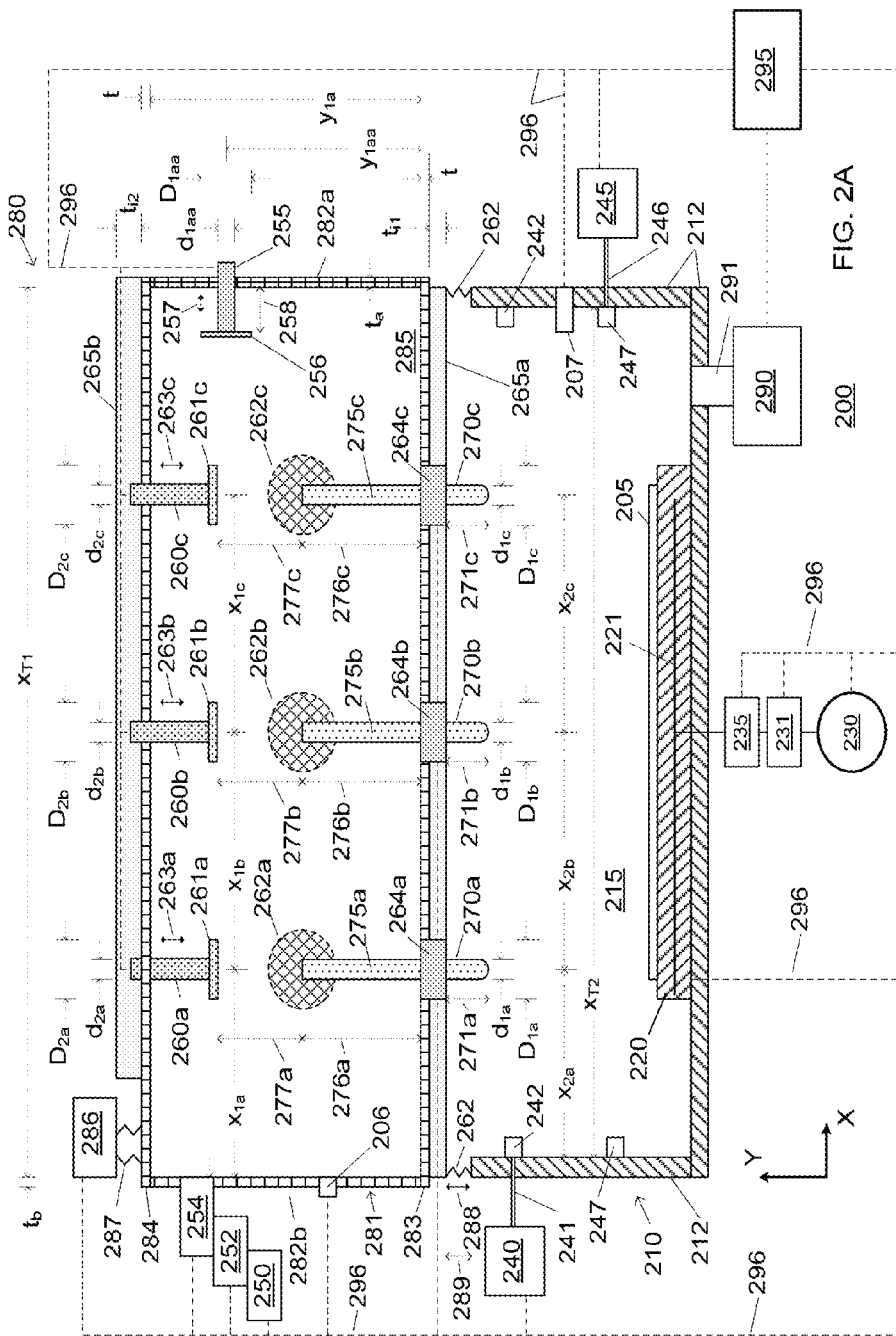

FIG. 2A illustrates a second microwave resonator system 200 according to embodiments of the invention. The second microwave resonator system 200 may be used in a dry plasma etching system or a plasma enhanced deposition system. The second microwave resonator system 200 can comprise a "movable" resonator subsystem 280 coupled to a "variable" process space 215 using one or more baffle members 262. The "movable" resonator subsystem 280 can comprise a second resonator assembly 281 therein that can be moved relative to the top of the process space 215. One or more displacement systems 286 can be coupled to the "movable" resonator subsystem 280 using one or more baffle assemblies 287, and the displacement systems 286 can be used to vertically move 288 the "movable" resonator subsystem 280a displacement distance 289 relative to the top of the process space 215. For example, the displacement distance 289 can vary from about 1 mm (millimeter) to about 10 mm. Alternatively, the second microwave resonator system 200 may be configured differently.

FIG. 2A shows a front view of a second microwave resonator system 200. The front view shows an x/y plane view of a process chamber 210 that can be configured using a first interface assembly 265a, a plurality of chamber walls 212 coupled to the first interface assembly 212a, and a process space 215 can be configured within the process chamber 210. For example, the chamber walls 212 can have wall thicknesses (t) associated therewith, and the wall thicknesses (t) can vary from about 1 mm to about 5 mm. The first interface assembly 212a can have a first interface thickness ($t_{i1}$) associated therewith, and the first interface thickness ($t_{i1}$) can vary from about 1 mm to about 10 mm.

The front view shows an x/y plane view of a second resonator subsystem 280 that can comprise a second resonator assembly 281 having a plurality of resonator walls (282a, 282b, 283, and 284) defining a second EM-energy tuning space 285 therein. For example, the resonator walls (282a, 282b, 283, and 284) can include dielectric material such as quartz. In addition, one or more resonator sensors 206 can be coupled to the second EM-energy tuning space 285 to obtain second resonator data.

The resonator walls 282a can have wall thicknesses ($t_a$) associated therewith, and the wall thicknesses ($t_a$) can vary from about 1 mm to about 5 mm. The resonator walls 282b can have wall thicknesses ($t_b$) associated therewith, and the wall thicknesses ($t_b$) can vary from about 1 mm to about 5 mm. The resonator walls 283 can have wall thicknesses (t) associated therewith, and the wall thicknesses (t) can vary from about 1 mm to about 5 mm.

In some examples, the first interface assembly 265a can be used to removably couple the second resonator assembly 281 to the process chamber 210. The first interface assembly 265a can have first interface thicknesses ($t_{i1}$) associated therewith, and the first interface thicknesses ($t_{i1}$) can vary from about 1 mm to about 10 mm. Alternatively, the first interface assembly 265a may not be required or may be configured differently. A first interface assembly 265a can comprise one or more isolation assemblies (264a, 264b, and 264c). Each of the isolation assemblies (264a, 264b, and 264c) can be removably coupled to a lower resonator wall 283 and removably coupled to one or more of the first interface assembly 265a.

In addition, a second interface assembly 265b can be coupled to the second resonator assembly 281 using an upper resonator wall 284. The second interface assembly 265b can have second interface thicknesses ($t_{i2}$) associated therewith, and the second interface thicknesses ($t_{i2}$) can vary from about 1 mm to about 10 mm. Alternatively, the second interface assembly 265b may not be required or may be configured differently. The second interface assembly 265b can comprise one or more control assemblies (260a, 260b, and 260c). Each of the control assemblies (260a, 260b, and 260c) can be removably coupled to the upper resonator wall 284 and removably coupled to the second interface assembly 265b.

The second microwave resonator system 200 can be configured to form plasma in the process space 215 as the substrate holder 220 and the substrate are moved through the process space 215. The second microwave resonator system 200 can be configured to process 200 mm substrates, 300 mm substrates, or larger-sized substrates. In addition, square and/or rectangular chambers can be configured so that the second microwave resonator system 200 may be configured to process square or rectangular substrates, wafers, or LCDs regardless of their size, as would be appreciated by those skilled in the art. Therefore, while aspects of the invention will be described in connection with the processing of a semiconductor substrate, the invention is not limited solely thereto.

In other embodiments, the second resonator subsystem 280 can comprise a plurality of resonant cavities (not shown) therein. In some other embodiments, the second resonator subsystem 280 can comprise a plurality of resonator subsystems having one or more resonant cavities therein. In various systems, the second resonator assembly 281, and the second EM-energy tuning space 285 can have cylindrical shapes, rectangular shapes, or squares shapes.

In some embodiments, a microwave source 250 can be coupled to the second resonator assembly 281. In addition, one or more RF sources (not shown) sources (not shown) may be coupled to the second resonator subsystem 280. The microwave source 250 can be coupled to a matching network 252, and the matching network 252 can be coupled to a coupling network 254. Alternatively, a plurality of matching networks (not shown) or a plurality of coupling networks (not shown) may be coupled to the second resonator subsystem 280. The coupling network 254 can be removably coupled to an upper resonator wall 284 of the second resonator assembly 281 and can be used to provide microwave energy to the second EM-energy tuning space 285. Alternatively, other coupling configurations may be used.

A first plasma-tuning rod (270a, 275a) can have a first plasma-tuning portion 270a that can extend into the process space 215 at a first location ($x_{2a}$), and a first EM-tuning portion 275a that can extend into the second EM-energy tuning space 285 at a first location ($x_{1a}$). A first isolation assembly 264a can be used to position (extend) the first plasma-tuning portion 270a a first plasma-tuning distance 271a within the process space 215 at a first location defined using ($x_{2a}$). For example, the first plasma-tuning distance 271a can vary from about 10 mm to about 400 mm, and the first plasma-tuning distance 271a can be wavelength-dependent and can vary from about ($\lambda/4$) to about ($10\lambda$).

A first EM-coupling region 262a can be established at a first EM-coupling distance 276a from the lower resonator wall 283 within the second EM-energy tuning space 285, and the first EM-tuning portion 275a can extend into the first EM-coupling region 262a. The first EM-tuning portion 275a can obtain first tunable microwave energy from the first EM-coupling region 262a, and the first microwave energy can be transferred as first plasma-tuning energy to the process space 215 at the first location ($x_{2a}$) using the first plasma-tuning portion 270a. The first EM-coupling region 262a can include a tunable E-field region, a tunable H-field region, a maximum field region, a maximum voltage region, maximum energy region, or a maximum current region, or any combination thereof. For example, the first EM-coupling distance 276a can vary from about 0.01 mm to about 10 mm, and the first EM-coupling distance 276a can be wavelength-dependent and can vary from about ($\lambda/4$) to about ($10\lambda$).

A first plasma-tuning slab 261a can be coupled to a first control assembly 260a and can be used to move 263a the first plasma-tuning slab 261a a first EM-tuning distance 277a relative to the first EM-tuning portion 275a of the first plasma-tuning rod (270a, 275a) within the second EM-energy tuning space 285. The first control assembly 260a and the first plasma-tuning slab 261a can be used to optimize the microwave energy coupled from the first EM-coupling region 262a to the first EM-tuning portion 275a of the first plasma-tuning rod (270a, 275a). For example, the first EM-tuning distance 277a can be established between the first EM-tuning portion 275a and the first plasma-tuning slab 261a within the second EM-energy tuning space 285, and the first EM-tuning distance 277a can vary from about 0.01 mm to about 1 mm.

The first plasma-tuning rod (270a, 275a) can have a first diameter ($d_{1a}$) associated therewith, and the first diameter ($d_{1a}$) can vary from about 0.01 mm to about 1 mm. The first isolation assembly 264a can have a first diameter ($D_{1a}$) associated therewith, and the first diameter ($D_{1a}$) can vary from about 1 mm to about 10 mm.

The first EM-tuning portion 275a, the first EM-coupling region 262a, the first control assembly 260a, and the first plasma-tuning slab 261a can have a first x-plane offset ($x_{1a}$) associated therewith. For example, the first x-plane offset ($x_{1a}$) can be established relative to the resonator wall 282b, can be wavelength-dependent, and can vary from about ($\lambda/4$) to about ($10\lambda$). The first control assembly 260a can have a cylindrical configuration and a diameter ($d_{2a}$) that can vary from about 1 mm to about 5 mm. The first plasma-tuning slab 261a can have diameters ($D_{2a}$) associated therewith, and the diameter ($D_{2a}$) can vary from about 1 mm to about 10 mm.

A second plasma-tuning rod (270b, 275b) can have a second plasma-tuning portion 270b that can extend into the process space 215 at a second location ($x_{2b}$), and a second EM-tuning portion 275b that can extend into the second EM-energy tuning space 285 at a second location ($x_{1b}$). A second isolation assembly 264b can be used to position (extend) the second plasma-tuning portion 270b second plasma-tuning distances 271b within the process space 215 at second locations defined using ($x_{2b}$). For example, the second plasma-tuning distances 271b can vary from about 10 mm to about 400 mm, and the second plasma-tuning distances 271b can be wavelength-dependent and can vary from about ($\lambda/4$) to about ($10\lambda$).

A second EM-coupling region 262b can be established at second EM-coupling distances 276b from the lower resonator wall 283 defining the second EM-energy tuning space 285, and the second EM-tuning portion 275b can extend into the second EM-coupling region 262b. The second EM-tuning portion 275b can obtain second tunable microwave energy from the second EM-coupling region 262b, and the second microwave energy can be transferred as second plasma-tuning energy to the process space 215 at the second location ($x_{2b}$) using the second plasma-tuning portion 270b. The second EM-coupling region 262b can include a tunable E-field region, a tunable H-field region, a maximum field region, a maximum voltage region, maximum energy region, or a maximum current region, or any combination thereof. For example, the second EM-coupling distance 276b can vary from about 0.01 mm to about 10 mm, and the second EM-coupling distance 276b can be wavelength-dependent and can vary from about ($\lambda/4$) to about ($10\lambda$).

A second plasma-tuning slab 261b can be coupled to a second control assembly 260b and can be used to move 263b the second plasma-tuning slab 261b second EM-tuning distances 277b relative to the second EM-tuning portion 275b of the second plasma-tuning rod (270b, 275b) within the second EM-energy tuning space 285. The second control assembly 260b and the second plasma-tuning slab 261b can be used to optimize the microwave energy coupled from the second EM-coupling region 262b to the second EM-tuning portion 275b of the second plasma-tuning rod (270b, 275b). For example, the second EM-tuning distances 277b can be established between the second EM-tuning portion 275b and the second plasma-tuning slab 261b within the second EM-energy tuning space 285, and the second EM-tuning distances 277b can vary from about 0.01 mm to about 1 mm.

The second plasma-tuning rod (270b, 275b) can have second diameters ($d_{1b}$) associated therewith, and the second diameters ($d_{1b}$) can vary from about 0.01 mm to about 1 mm. The second isolation assembly 264b can have second diameters ($D_{1b}$) associated therewith, and the second diameters ($D_{1b}$) can vary from about 1 mm to about 10 mm.

The second EM-tuning portion 275b, the second EM-coupling region 262b, the second control assembly 260b, and the second plasma-tuning slab 261b can have second x-plane offsets ($x_{1b}$) associated therewith. For example, the second x-plane offsets ($x_{1b}$) can be established relative to the resonator wall 282b and can be wavelength-dependent and can vary from about ($\lambda/4$) to about ($10\lambda$). The second control assembly 260b can have a cylindrical configuration and second diameters ($d_{2b}$) that can vary from about 1 mm to about 5 mm. The second plasma-tuning slab 261b can have diameters ($D_{2b}$) associated therewith, and the diameters ($D_{2b}$) can vary from about 1 mm to about 10 mm.

A third plasma-tuning rod (270c, 275c) can have a third plasma-tuning portion 270c that can extend into the process space 215 at a third location ($x_{2c}$), and a third EM-tuning portion 275c that can extend into the second EM-energy tuning space 285 at a third location ($x_{1c}$). A third isolation assembly 264c can be used to position (extend) the third plasma-tuning portion 270c third plasma-tuning distances 271c within the process space 215 at third locations defined using ($x_{2c}$). For example, the third plasma-tuning distances 271c can vary from about 10 mm to about 400 mm, and the third plasma-tuning distances 271c can be wavelength-dependent and can vary from about ($\lambda/4$) to about ($10\lambda$).

A third EM-coupling region 262c can be established at third EM-coupling distances 276c from the lower resonator wall 283 defining the second EM-energy tuning space 285, and the third EM-tuning portion 275c can extend into the third EM-coupling region 262c. The third EM-tuning portion 275c can obtain third tunable microwave energy from the third EM-coupling region 262c, and the third microwave energy can be transferred as third plasma-tuning energy to the process space 215 at the third location ($x_{2c}$) using the third plasma-tuning portion 270c. The third EM-coupling region 262c can include a tunable E-field region, a tunable H-field region, a maximum field region, a maximum voltage region, maximum energy region, or a maximum current region, or any combination thereof. For example, the third EM-coupling distance 276c can vary from about 0.01 mm to about 10 mm, and the third EM-coupling distance 276c can be wavelength-dependent and can vary from about ($\lambda/4$) to about ($10\lambda$).

A third plasma-tuning slab 261c can be coupled to a third control assembly 260c and can be used to move 263c the third plasma-tuning slab 261c third EM-tuning distances 277c relative to the third EM-tuning portion 275c of the third plasma-tuning rod (170c, 275c) within the second EM-energy tuning space 285. The third control assembly 260c and the third plasma-tuning slab 261c can be used to optimize the microwave energy coupled from the third EM-coupling region 262c to the third EM-tuning portion 275c of the third plasma-tuning rod (270c, 275c). For example, the third EM-tuning distances 277c can be established between the third EM-tuning portion 275c and the third plasma-tuning slab 261c within the second EM-energy tuning space 285, and the third EM-tuning distances 277c can vary from about 0.01 mm to about 1 mm.

The third plasma-tuning rod (270c, 275c) can have third diameters ($d_{1c}$) associated therewith, and the third diameters ($d_{1c}$) can vary from about 0.01 mm to about 1 mm. The third isolation assembly 264c can have third diameters ($D_{1c}$) associated therewith, and the third diameters ($D_{1c}$) can vary from about 1 mm to about 10 mm.

The third EM-tuning portion 275c, the third EM-coupling region 262c, the third control assembly 260c, and the third plasma-tuning slab 261c can have third x-plane offsets ($x_{1c}$) associated therewith. For example, the third x-plane offsets ($x_{1c}$) can be established relative to the resonator wall 282b and can be wavelength-dependent and can vary from about ($\lambda/4$) to about ($10\lambda$). The third control assembly 260c can have a cylindrical configuration and third diameters ($d_{2c}$) that can vary from about 1 mm to about 5 mm. The third plasma-tuning slab 261c can have third diameters ($D_{2c}$) associated therewith, and the third diameters ($D_{2c}$) can vary from about 1 mm to about 10 mm.

The control assemblies (260a, 260b, and 265c) can be coupled 296 to the controller 295, and the controller 295 can use process recipes to establish, control, and optimize the EM-tuning distances (277a, 277b, and 277c) to control the EM-coupling regions (262a, 262b, and 265c) in the EM-energy tuning space 285 and the plasma uniformity within the process space 215. The controller 295 can be coupled 296 to the microwave source 250, the matching network 252, and the coupling network 254, and the controller 295 can use process recipes to establish, control, and optimize the microwave source 250, the matching network 252, and the coupling network 254 to control the EM-coupling regions (262a, 262b, and 265c) in the EM-energy tuning space 285 and the plasma uniformity within the process space 215. For example, the microwave source 250 can operate at frequencies from about 500 MHz to about 5000 MHz. In addition, the controller 295 can be coupled 296 to the resonator sensors 206 and process sensors 207, and the controller 295 can use process recipes to establish, control, and optimize the data from the resonator sensors 206 and the process sensors 207 to control the EM-coupling regions (262a, 262b, and 265c) in the EM-energy tuning space 285 and the plasma uniformity within the process space 215.

The front view of the second microwave resonator system 200 includes an x/y plane view of a cavity-control assembly 255 that is shown coupled to a front view of a cavity-tuning slab 256. The cavity-control assembly 255 can have a first diameter ($d_{1aa}$) associated therewith, and the first diameter ($d_{1aa}$) can vary from about 0.01 mm to about 1 mm. The cavity-tuning slab 256 can have a second diameter ($D_{1aa}$) associated therewith, and the second diameter ($D_{1aa}$) can vary from about 1 mm to about 10 mm. The cavity-control assembly 255 and the cavity-tuning slab 256 can have y-plane offsets ($y_{1aa}$) associated therewith, and the y-plane offsets ($y_{1aa}$) can vary from about 1 mm to about 10 mm.

The cavity-control assembly 255 can be used to move 257 the cavity-tuning slab 256 second cavity-tuning distances 258 within the second EM-energy tuning space 285. The controller 295 can be coupled 296 to the cavity-control assembly 255, and the controller 295 can use process recipes to establish, control, and optimize the second cavity-tuning distances 258 to control and maintain the plasma uniformity within the process space 215 in real-time. For example, the second cavity-tuning distances 258 can vary from about 0.01 mm to about 10 mm, and the second cavity-tuning distances 258 can be wavelength-dependent and can vary from about ($\lambda/16$) to about ($10\lambda$).

Still referring to FIG. 2A, a substrate holder 220, and a lower electrode 221 are shown. When present, the lower electrode 221 can be used to couple Radio Frequency (RF) power to plasma in process space 215. For example, lower electrode 221 can be electrically biased at an RF voltage via the transmission of RF power from RF generator 230 through impedance match network 231 and RF sensor 235 to lower electrode 221. The RF bias can serve to heat electrons to form and/or maintain the plasma. A typical frequency for the RF bias can range from 1 MHz to 100 MHz and is preferably 13.56 MHz. Alternatively, RF power may be applied to the lower electrode 221 at multiple frequencies. Furthermore, impedance match network 231 can serve to maximize the transfer of RF power to the plasma in process chamber 210 by minimizing the reflected power. Various match network topologies and automatic control methods can be utilized. The RF sensor 235 can measure the power levels and/or frequencies associated with the fundamental signals, harmonic signals, and/or intermodulation signals. In addition, the controller 295 can be coupled 296 to the RF generator 230, the impedance match network 231, and the RF sensor 235, and the controller 295 can use process recipes to establish, control, and optimize the data to and from the RF generator 230, the impedance match network 231, and the RF sensor 235 to the EM-coupling regions (262a, 262b, and 265c) in the EM-energy tuning space 285 and control the plasma uniformity within the process space 215.

Some second microwave resonator systems 200 can include a pressure control system 290 and exhaust port 291 coupled to the process chamber 210, and configured to evacuate the process chamber 210, as well as control the pressure within the process chamber 210. Alternatively, the pressure control system 290 and/or the exhaust port 291 may not be required.

As shown in FIG. 2A, the second microwave resonator systems 200 can comprise a first gas supply system 240 coupled to a first supply element 241, and the first supply element 241 can be one or more flow elements 242 that can be coupled to the process chamber 210. The flow elements 242 can be configured to introduce a first process gas to process space 215, and can include flow control and/or flow measuring devices. In addition, the second plasma processing system 200 can comprise a second gas supply system 245 coupled to a second supply element 246, and the second supply element 246 can be one or more second flow elements 247 that can be coupled to the process chamber 210. The second flow elements 247 can be configured to introduce a second process gas to process space 215, and can include flow control and/or flow measuring devices. Alternatively, the second gas supply system 245, the second supply element 246, and/or the second flow elements 247 may not be required.

During dry plasma etching, the process gas may comprise an etchant, a passivant, or an inert gas, or a combination of two or more thereof. For example, when plasma etching a dielectric film such as silicon oxide ($SiO_x$) or silicon nitride ($Si_xN_y$), the plasma etch gas composition generally includes a fluorocarbon-based chemistry ($C_xF_y$) such as at least one of $C_4F_8$, $C_5F_8$, $C_3F_6$, $C_4F_6$, $CF_4$, etc., and/or may include a fluorohydrocarbon-based chemistry ($C_xH_yF_z$) such as at least one of $CHF_3$, $CH_2F_2$, etc., and can have at least one of an inert gas, oxygen, CO or $CO_2$. Additionally, for example, when etching polycrystalline silicon (polysilicon), the plasma etch gas composition generally includes a halogen-containing gas such as HBr, $Cl_2$, $NF_3$, or $SF_6$ or a combination of two or more thereof, and may include fluorohydrocarbon-based chemistry ($C_xH_yF_z$) such as at least one of $CHF_3$, $CH_2F_2$, etc., and at least one of an inert gas, oxygen, CO or $CO_2$, or two or more thereof. During plasma-enhanced deposition, the process gas may comprise a film forming precursor, a reduction gas, or an inert gas, or a combination of two or more thereof.

FIG. 2B illustrates a top view of a second resonator assembly in accordance with embodiments of the invention. The second resonator assembly 281 can have a total length ($x_{T1}$) and a total height ($z_{T1}$) associated therewith in the x/z plane. For example, the total length ($x_{T1}$) can vary from about 10 mm to about 500 mm, and the total height ($z_{T1}$) can vary from about 10 mm to about 1000 mm.

The top view of second resonator subsystem 280 includes an x/z plane view of a first control assembly 260a that is shown surrounded by a top (dash line) view of a first plasma-tuning slab 261a. The first control assembly 260a can have a first diameter ($d_{2a}$) associated therewith, and the first diameter ($d_{2a}$) can vary from about 0.01 mm to about 1 mm. The first plasma-tuning slab 261a can have a second diameter ($D_{2a}$) associated therewith, and the second diameter ($D_{2a}$) can vary from about 1 mm to about 10 mm. The first control assembly 260a and the first plasma-tuning slab 261a can have first x-plane offsets ($x_{1a}$) associated therewith, and the first x-plane offsets ($x_{1a}$) can vary from about 1 mm to about 10 mm. Alternatively, the first control assembly 260a and the first plasma-tuning slab 261a may have different first x-plane offsets ($x_{1a}$) associated therewith. The first control assembly 260a and the first plasma-tuning slab 261a can have first z-plane offsets ($z_{1a}$) associated therewith, and the first z-plane offsets ($z_{1a}$) can vary from about 1 mm to about 10 mm. Alternatively, the first control assembly 260a and the first plasma-tuning slab 261a may have different first z-plane offsets ($z_{1a}$) associated therewith.

In addition, the top view of the second resonator subsystem 280 includes an x/z plane view of a second control assembly 260b that is shown surrounded by a top (dash line) view of a second plasma-tuning slab 261b. The second control assembly 260b can have a first diameter ($d_{2b}$) associated therewith, and the first diameter ($d_{2b}$) can vary from about 0.01 mm to about 1 mm. The second plasma-tuning slab 261b can have a second diameter ($D_{2b}$) associated therewith, and the second diameter ($D_{2b}$) can vary from about 1 mm to about 10 mm. The second control assembly 260b and the second plasma-tuning slab 261b can have second x-plane offsets ($x_{1b}$) associated therewith, and the second x-plane offsets ($x_{1b}$) can vary from about 1 mm to about 10 mm. Alternatively, the second control assembly 260b and the second plasma-tuning slab 261b may have different second x-plane offsets ($x_{1b}$) associated therewith. The second control assembly 260b and the second plasma-tuning slab 261b can have second z-plane offsets ($z_{1b}$) associated therewith, and the second z-plane offsets ($z_{1b}$) can vary from about 1 mm to about 10 mm. Alternatively, the second control assembly 260b and the second plasma-tuning slab 261b may have different second z-plane offsets ($z_{1a}$) associated therewith.

Furthermore, the top view of second resonator subsystem 280 includes a x/z plane view of a third control assembly 260c that is shown surrounded by a top (dash line) view of a third plasma-tuning slab 261c. The third control assembly 260c can have a first diameter ($d_{2c}$) associated therewith, and the first diameter ($d_{2c}$) can vary from about 0.01 mm to about 1 mm. The third plasma-tuning slab 261c can have a second diameter ($D_{2c}$) associated therewith, and the third diameter ($D_{2c}$) can vary from about 1 mm to about 10 mm. The third control assembly 260c and the third plasma-tuning slab 261c can have third x-plane offsets ($x_{1c}$) associated therewith, and the third x-plane offsets ($x_{1c}$) can vary from about 1 mm to about 10 mm. Alternatively, the third control assembly 260c and the third plasma-tuning slab 261c may have different third x-plane offsets ($x_{1c}$) associated therewith. The third control assembly 260c and the third plasma-tuning slab 261c can have third z-plane offsets ($z_{1c}$) associated therewith, and the third z-plane offsets ($z_{1b}$) can vary from about 1 mm to about 10 mm. Alternatively, the third control assembly 260c and the third plasma-tuning slab 261c may have different third z-plane offsets ($z_{1a}$) associated therewith.

FIG. 2B shows top views of resonator walls (282a, 282b, 283, and 284). The resonator wall 282a can have wall thicknesses ($t_a$) associated therewith, and the wall thicknesses ($t_a$) can vary from about 1 mm to about 5 mm. The resonator wall 282b can have wall thicknesses ($t_b$) associated therewith, and the wall thicknesses ($t_b$) can vary from about 1 mm to about 5 mm. The resonator walls (282a and 282b) can have wall thicknesses (t) associated therewith, and the wall thicknesses (t) can vary from about 1 mm to about 5 mm.

The top view of the second microwave resonator system 200 includes an x/z plane view of a cavity-control assembly 255 that is shown coupled to a top view of a cavity-tuning slab 256. The cavity-control assembly 255 can have a first diameter ($d_{1aa}$) associated therewith, and the first diameter ($d_{1aa}$) can vary from about 0.01 mm to about 1 mm. The cavity-tuning slab 256 can have a second diameter ($D_{1aa}$) associated therewith, and the second diameter ($D_{1aa}$) can vary from about 1 mm to about 10 mm. The cavity-control assembly 255 and the cavity-tuning slab 256 can have a first y-plane offset ($y_{1aa}$) associated therewith, and the first y-plane offset ($y_{1aa}$) can vary from about 1 mm to about 10 mm.

Figure 2C:
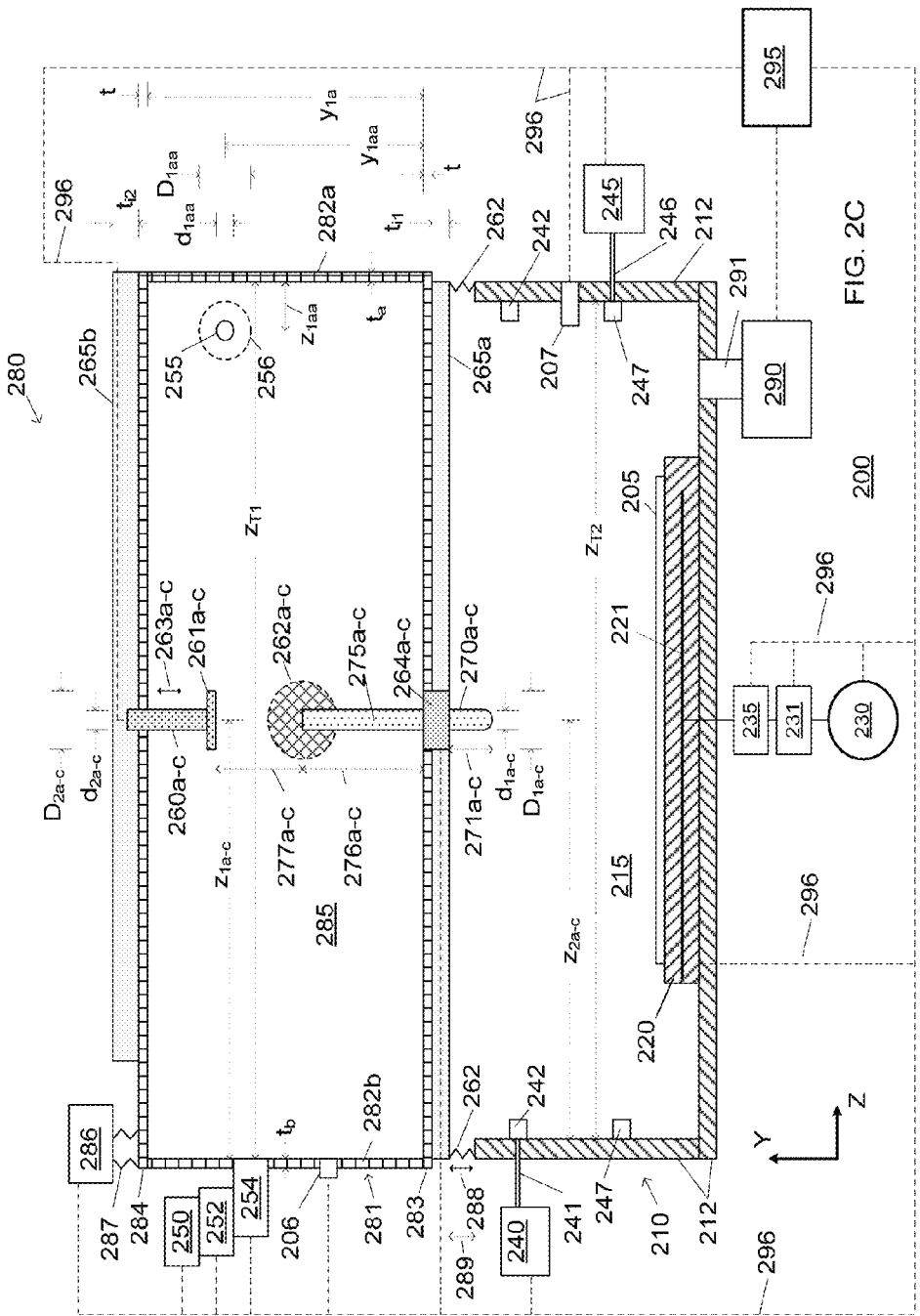

FIG. 2C illustrates a side view of the second microwave resonator system 200. The side view shows a y/z plane view of a process chamber 210 that can be configured using a first interface assembly 265a, a plurality of chamber walls 212 coupled to the first interface assembly 212a, and a process space 215 can be configured within the process chamber 210. For example, the chamber walls 212 can have wall thicknesses (t) associated therewith, and the wall thicknesses (t) can vary from about 1 mm to about 5 mm. The first interface assembly 212a can have a first interface thickness ($t_{i1}$) associated therewith, and the first interface thickness ($t_{i1}$) can vary from about 1 mm to about 10 mm.

The side view shows a y/z plane view of a second resonator subsystem 280 that can comprise a second resonator assembly 281 that can be configured using a plurality of resonator walls (282a, 282b, 283, and 284). For example, the resonator walls (282a, 282b, 283, and 284) can include dielectric material such as quartz and can define a second EM-energy tuning space 285 therein. In addition, one or more resonator sensors 206 can be coupled to the second EM-energy tuning space 285 to obtain first resonator data.

The resonator walls 282a can have wall thicknesses ($t_a$) associated therewith, and the wall thicknesses ($t_a$) can vary from about 1 mm to about 5 mm. The resonator walls 282b can have wall thicknesses ($t_b$) associated therewith, and the wall thicknesses ($t_b$) can vary from about 1 mm to about 5 mm. The resonator walls 283 can have wall thicknesses (t) associated therewith, and the wall thicknesses (t) can vary from about 1 mm to about 5 mm.

In some examples, the first interface assembly 265a can be used to removably couple the second resonator assembly 281 to the process chamber 210. The first interface assembly 265a can have first interface thicknesses ($t_{i1}$) associated therewith, and the first interface thicknesses ($t_{i1}$) can vary from about 1 mm to about 10 mm. Alternatively, the first interface assembly 265a may not be required or may be configured differently. A first interface assembly 265a can comprise one or more isolation assemblies (264a, 264b, and 264c). Each of the isolation assemblies (264a, 264b, and 264c) can be removably coupled to a lower resonator wall 283 and removably coupled to one or more of the first interface assembly 265a.

In addition, a second interface assembly 265b can be coupled to the second resonator assembly 281 using an upper resonator wall 284. The second interface assembly 265b can have second interface thicknesses ($t_{i2}$) associated therewith, and the second interface thicknesses ($t_{i2}$) can vary from about 1 mm to about 10 mm. Alternatively, the second interface assembly 265b may not be required or may be configured differently. The second interface assembly 265b can comprise one or more control assemblies (260a, 260b, and 260c). Each of the control assemblies (260a, 260b, and 260c) can be removably coupled to the upper resonator wall 284 and removably coupled to the second interface assembly 265b.

The second microwave resonator system 200 can be configured to form plasma in the process space 215 as the substrate holder 220 and the substrate are moved through the process space 215. The second microwave resonator system 200 can be configured to process 200 mm substrates, 300 mm substrates, or larger-sized substrates. In addition, square and/or rectangular chambers can be configured so that the second microwave resonator system 200 may be configured to process square or rectangular substrates, wafers, or LCDs regardless of their size, as would be appreciated by those skilled in the art. Therefore, while aspects of the invention will be described in connection with the processing of a semiconductor substrate, the invention is not limited solely thereto.

In other embodiments, the second resonator subsystem 280 can comprise a plurality of resonant cavities (not shown) therein. In some other embodiments, the second resonator subsystem 280 can comprise a plurality of resonator subsystems having one or more resonant cavities therein. In various systems, the second resonator assembly 281 and the second EM-energy tuning space 285 can have cylindrical shapes, rectangular shapes, or squares shapes.

In FIG. 2C, a microwave source 250 is shown coupled to the second resonator assembly 281. The microwave source 250 can be coupled to a matching network 252, and the matching network 252 can be coupled to a coupling network 254. Alternatively, a plurality of matching networks (not shown) or a plurality of coupling networks (not shown) may be coupled to the second resonator subsystem 280. The coupling network 254 can be removably coupled to an upper resonator wall 284 of the second resonator assembly 281 and can be used to provide microwave energy to the second EM-energy tuning space 285. Alternatively, other coupling configurations may be used.

The side view includes a y/z plane view of a first set of plasma-tuning rods {(270a, 275a), (270b, 275b), and (270c, 275c)} that can have a first set of plasma-tuning portions (270a, 270b, and 270c) that can extend into the process space 215 at first z-plane locations ($z_{2a-c}$), and a first set of EM-tuning portions (275a, 275b, and 275c) that can extend into the second EM-energy tuning space 285 at second z-plane locations ($z_{1a-c}$). A first set of isolation assemblies (264a, 264b, and 264c) can be used to position (extend) the first set of plasma-tuning portions (270a, 270b, and 270c) at the first set of plasma-tuning distances (271a, 271b, and 271c) within the process space 215 at the first locations defined using ($z_{2a-c}$). For example, the first set of plasma-tuning distances (271a, 271b, and 271c) can vary from about 10 mm to about 400 mm, and the first set of plasma-tuning distances (271a, 271b, and 271c) can be wavelength-dependent and can vary from about ($\lambda/4$) to about ($10\lambda$).

A first set of EM-coupling regions (262a, 262b, and 262c) can be established at the first set of EM-coupling distances (276a, 276b, and 276c) from the lower resonator wall 283 within the second EM-energy tuning space 285, and the first set of EM-tuning portions (275a, 275b, and 275c) can extend into the first set of EM-coupling regions (262a, 262b, and 262c). The first set of EM-tuning portions (275a, 275b, and 275c) can obtain tunable microwave energies from the first set of EM-coupling regions (262a, 262b, and 262c), and the tunable microwave energies can be transferred as controllable plasma-tuning energies to the process space 215 at the first z-plane locations ($z_{2a-c}$) using the first set of plasma-tuning portions (270a, 270b, and 270c). The first set of EM-coupling regions (262a, 262b, and 262c) can include a tunable E-field region, a tunable H-field region, a maximum field region, a maximum voltage region, maximum energy region, or a maximum current region, or any combination thereof. For example, the first set of EM-coupling distances (276a, 276b, and 276c) can vary from about 0.01 mm to about 10 mm, and the first set of EM-coupling distances (276a, 276b, and 276c) can be wavelength-dependent and can vary from about ($\lambda/4$) to about ($10\lambda$).

A first set of plasma-tuning slabs (261a, 261b, and 261c) can be coupled to a first set of control assemblies (260a, 260b, and 260c) and can be used to move (263a, 263b, and 263c) the first set of plasma-tuning slabs (261a, 261b, and 261c) first set of EM-tuning distances (277a, 277b, and 277c) relative to the first set of EM-tuning portions (275a, 275b, and 275c) of the first set of plasma-tuning rod {(270a, 275a), (270b, 275b), and (270c, 275c)} within the second EM-energy tuning space 285. The first set of control assemblies (260a, 260b, and 260c) and the first set of plasma-tuning slabs (261a, 261b, and 261c) can be used to optimize the microwave energies coupled from the first set of EM-coupling regions (262a, 262b, and 262c) to the first set of EM-tuning portions (275a, 275b, and 275c) of the first set of plasma-tuning rod {(270a, 275a), (270b, 275b), and (270c, 275c)}. For example, the first set of EM-tuning distances (277a, 277b, and 277c) can be established between the first set of EM-tuning portions (275a, 275b, and 275c) and the first set of plasma-tuning slabs (261a, 261b, and 261c) within the second EM-energy tuning space 285, and the first set of EM-tuning distances (277a, 277b, and 277c) can vary from about 0.01 mm to about 1 mm.

The first set of plasma-tuning rod {(270a, 275a), (270b, 275b), and (270c, 275c)} can comprise dielectric material and can have first diameter ($d_{1a}$) associated therewith, and the first diameters ($d_{1a}$) can vary from about 0.01 mm to about 1 mm. The first set of isolation assemblies (264a, 264b, and 264c) can comprise dielectric material and can have first diameters ($D_{1a}$) associated therewith, and the first diameters ($D_{1a}$) can vary from about 1 mm to about 10 mm.

The first set of EM-tuning portions (275a, 275b, and 275c), the first set of EM-coupling regions (262a, 262b, and 262c), the first set of control assemblies (260a, 260b, and 260c), and the first set of plasma-tuning slabs (261a, 261b, and 261c) can have z-plane offsets ($z_{1a-c}$) associated therewith. For example, the z-plane offsets ($z_{1a-c}$) can be established relative to the lower resonator wall 283 and can be wavelength-dependent and can vary from about ($\lambda/4$) to about ($10\lambda$). The first set of control assemblies (260a, 260b, and 260c) can comprise dielectric material, can have cylindrical configurations and diameter ($d_{2a-c}$) that can vary from about 1 mm to about 5 mm. The first set of plasma-tuning slabs (261a, 261b, and 261c) can comprise dielectric material and can have diameters ($D_{2a-c}$) associated therewith, and the diameters ($D_{2a-c}$) can vary from about 1 mm to about 10 mm.

As shown in FIG. 2C, the control assemblies (260a, 260b, and 265c) can be coupled 296 to the controller 295, and the controller 295 can use process recipes to establish, control, and optimize the EM-tuning distances (277a, 277b, and 277c) to control the EM-coupling regions (262a, 262b, and 265c) in the EM-energy tuning space 285 and the plasma uniformity within the process space 215. The controller 295 can be coupled 296 to the microwave source 250, the matching network 252, and the coupling network 254, and the controller 295 can use process recipes to establish, control, and optimize the microwave source 250, the matching network 252, and the coupling network 254 to control the EM-coupling regions (262a, 262b, and 265c) in the EM-energy tuning space 285 and the plasma uniformity within the process space 215. For example, the microwave source 250 can operate at frequencies from about 500 MHz to about 5000 MHz. In addition, the controller 295 can be coupled 296 to the resonator sensors 206 and process sensors 207, and the controller 295 can use process recipes to establish, control, and optimize the data from the resonator sensors 206 and the process sensors 207 to control the EM-coupling regions (262a, 262b, and 265c) in the EM-energy tuning space 285 and the plasma uniformity within the process space 215.

The side view of the second microwave resonator system 200 includes a y/z plane view of a cavity-control assembly 255 and a y/z plane view of a cavity-tuning slab 256. The cavity-control assembly 255 can have a first diameter ($d_{1aa}$) associated therewith, and the first diameter ($d_{1aa}$) can vary from about 0.01 mm to about 1 mm. The cavity-tuning slab 256 can have a second diameter ($D_{1aa}$) associated therewith, and the second diameter ($D_{1aa}$) can vary from about 1 mm to about 10 mm. The cavity-control assembly 255 and the cavity-tuning slab 256 can have first y/z plane offsets ($y_{1aa}$) associated therewith, and the first y/z plane offsets ($y_{1aa}$) can vary from about 1 mm to about 10 mm.

Still referring to FIG. 2C, y/z plane views of the substrate holder 220 and the lower electrode 221 are shown. When present, the lower electrode 221 can be used to couple Radio Frequency (RF) power to plasma in process space 215. For example, lower electrode 221 can be electrically biased at an RF voltage via the transmission of RF power from RF generator 230 through impedance match network 231 and RF sensor 235 to lower electrode 221. The RF bias can serve to heat electrons to form and/or maintain the plasma. A typical frequency for the RF bias can range from 1 MHz to 100 MHz and is preferably 13.56 MHz. Alternatively, RF power may be applied to the lower electrode 221 at multiple frequencies. Furthermore, impedance match network 231 can serve to maximize the transfer of RF power to the plasma in process chamber 210 by minimizing the reflected power. Various match network topologies and automatic control methods can be utilized. The RF sensor 235 can measure the power levels and/or frequencies associated with the fundamental signals, harmonic signals, and/or intermodulation signals. In addition, the controller 295 can be coupled 296 to the RF generator 230, the impedance match network 231, and the RF sensor 235, and the controller 295 can use process recipes to establish, control, and optimize the data to and from the RF generator 230, the impedance match network 231, and the RF sensor 235 to control the EM-coupling regions (262a, 262b, and 265c) in the EM-energy tuning space 285 and the plasma uniformity within the process space 215.

The side view of the second microwave resonator system 200 can include a y/z plane view of a pressure control system 290 and exhaust port 291 coupled to the process chamber 210, and configured to evacuate the process chamber 210, as well as control the pressure within the process chamber 210. Alternatively, the pressure control system 290 and/or the exhaust port 291 may not be required.

As shown in FIG. 2C, the side view can include y/z plane views of the first gas supply system 240, the first supply element 241, the first flow elements 242, and the process chamber 210. The first flow elements 242 can be configured around the process space 215, and can be configured to introduce a first process gas to process space 215. In addition, the side view can include y/z plane views of the second gas supply system 245, the second supply element 246, and the second flow elements 247. The second flow elements 247 can be configured around the process space 215, and can be configured to introduce a second process gas to process space 215.

During dry plasma etching, the process gas may comprise an etchant, a passivant, or an inert gas, or a combination of two or more thereof. For example, when plasma etching a dielectric film such as silicon oxide ($SiO_x$) or silicon nitride ($Si_xN_y$), the plasma etch gas composition generally includes a fluorocarbon-based chemistry ($C_xF_y$) such as at least one of $C_4F_8$, $C_5F_8$, $C_3F_6$, $C_4F_6$, $CF_4$, etc., and/or may include a fluorohydrocarbon-based chemistry ($C_xH_yF_z$) such as at least one of $CHF_3$, $CH_2F_2$, etc., and can have at least one of an inert gas, oxygen, CO or $CO_2$. Additionally, for example, when etching polycrystalline silicon (polysilicon), the plasma etch gas composition generally includes a halogen-containing gas such as HBr, $Cl_2$, $NF_3$, or $SF_6$ or a combination of two or more thereof, and may include fluorohydrocarbon-based chemistry ($C_xH_yF_z$) such as at least one of $CHF_3$, $CH_2F_2$, etc., and at least one of an inert gas, oxygen, CO or $CO_2$, or two or more thereof. During plasma-enhanced deposition, the process gas may comprise a film forming precursor, a reduction gas, or an inert gas, or a combination of two or more thereof.

Figure 3A:
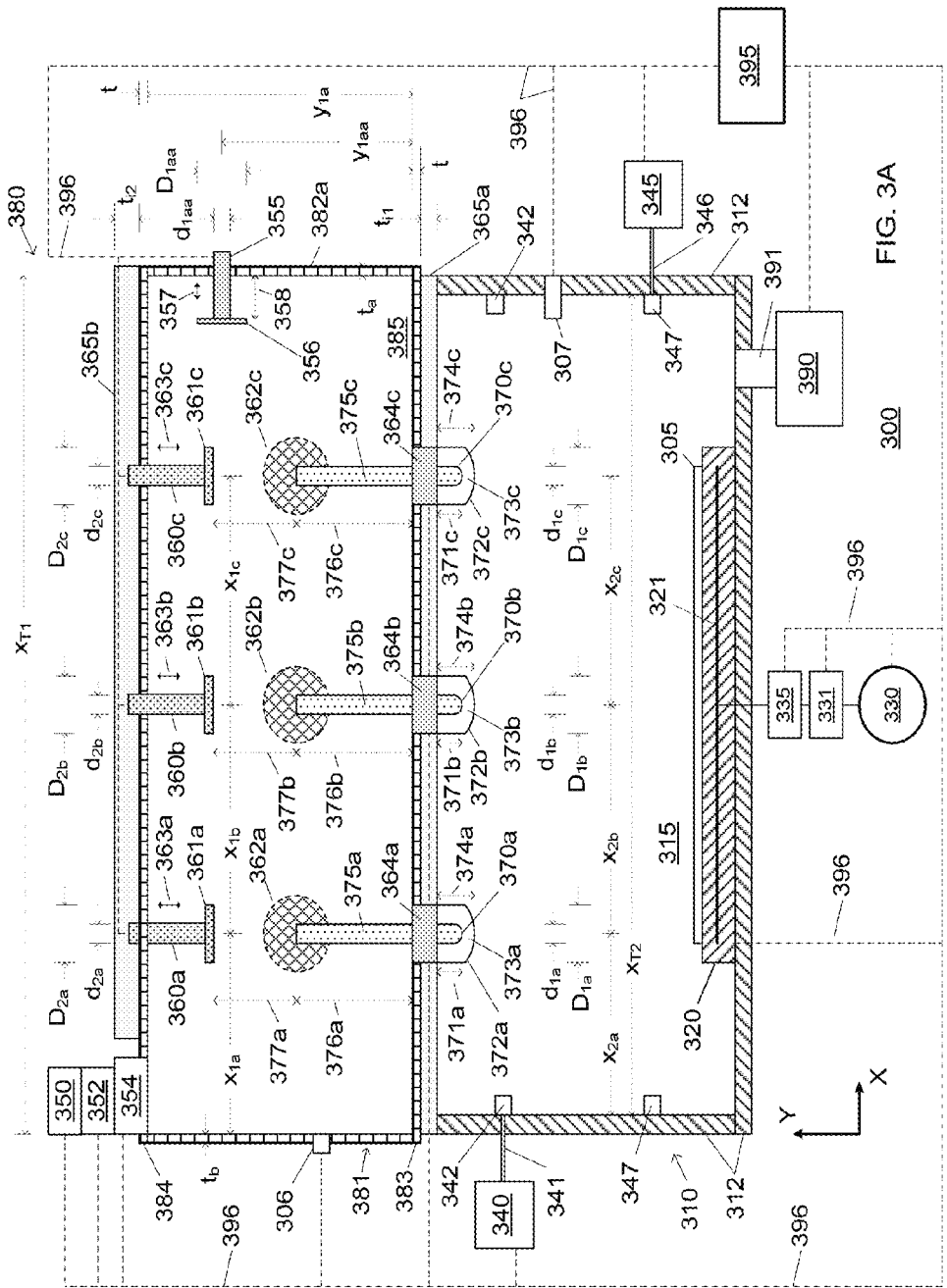
FIGS. 3A-3C illustrate different exemplary views of a third microwave processing system according to embodiments of the invention.

FIG. 3A shows a front view of the third microwave resonator system 300. The front view shows an x/y plane view of a process chamber 310 that can be configured using a first interface assembly 365a, a plurality of chamber walls 312 coupled to the first interface assembly 365a, and a process space 315 can be configured within the process chamber 310. For example, the chamber walls 312 can have wall thicknesses (t) associated therewith, and the wall thickness (t) can vary from about 1 mm to about 5 mm. The first interface assembly 365a can have a first interface thickness ($t_{i1}$) associated therewith, and the first interface thickness ($t_{i1}$) can vary from about 1 mm to about 10 mm.

FIG. 3A shows a front view of the third microwave resonator system 300. The front view shows an x/y plane view of a process chamber 310 that can be configured using a first interface assembly 365a, a plurality of chamber walls 312 coupled to the first interface assembly 312a, and a process space 315 can be configured within the process chamber 310. For example, the chamber walls 312 can have wall thicknesses (t) associated therewith, and the wall thicknesses (t) can vary from about 1 mm to about 5 mm. The first interface assembly 312a can have a first interface thickness ($t_{i1}$) associated therewith, and the first interface thickness ($t_{i1}$) can vary from about 1 mm to about 10 mm.

The front view shows an x/y plane view of a third resonator subsystem 380 that can comprise a third resonator assembly 381 having a plurality of resonator walls (382a, 382b, 383, and 384) defining a third EM-energy tuning space 385 therein. For example, the resonator walls (382a, 382b, 383, and 384) can include dielectric material such as quartz. In addition, one or more resonator sensors 306 can be coupled to the third EM-energy tuning space 385 to obtain first resonator data.

The resonator walls 382a can have wall thicknesses ($t_a$) associated therewith, and the wall thicknesses ($t_a$) can vary from about 1 mm to about 5 mm. The resonator walls 382b can have wall thicknesses ($t_b$) associated therewith, and the wall thicknesses ($t_b$) can vary from about 1 mm to about 5 mm. The resonator walls 383 can have wall thicknesses (t) associated therewith, and the wall thicknesses (t) can vary from about 1 mm to about 5 mm.

In some examples, the first interface assembly 365a can be used to removably couple the third resonator assembly 381 to the process chamber 310. The first interface assembly 365a can have first interface thicknesses ($t_{i1}$) associated therewith, and the first interface thicknesses ($t_{i1}$) can vary from about 1 mm to about 10 mm. Alternatively, the first interface assembly 365a may not be required or may be configured differently. A first interface assembly 365a can comprise one or more isolation assemblies (364a, 364b, and 364c). Each of the isolation assemblies (364a, 364b, and 364c) can be removably coupled to a lower resonator wall 383 and removably coupled to one or more of the first interface assembly 365a. A first protection assembly 372a can be coupled to the first isolation assembly 364a, and the first protection assembly 372a can be configured at a first location ($x_{2a}$) within the process space 315. The first protection assembly 372a can have a first isolated protection space 373a therein and can have a first insertion length 374a associated therewith. A second protection assembly 372b can be coupled to the second isolation assembly 364b, and the second protection assembly 372b can be configured at a second location ($x_{2b}$) within the process space 315. The second protection assembly 372b can have a second isolated protection space 373b therein and can have a second insertion length 374b associated therewith. A third protection assembly 372c can be coupled to the third isolation assembly 364c, and the third protection assembly 372c can be configured at a third location ($x_{2c}$) within the process space 315. The third protection assembly 372c can have a third isolated protection space 373c therein and can have a third insertion length 374c associated therewith. For example, the insertion lengths (374a, 374b, and 374c) can vary from about 1 mm to about 10 mm in the x/y plane, and the first set of protection assemblies (372a, 372b, and 372c) can be constructed using one or more dielectric materials.

In addition, a second interface assembly 365b can be coupled to the third resonator assembly 381 using an upper resonator wall 384. The second interface assembly 365b can have second interface thicknesses ($t_{i2}$) associated therewith, and the second interface thicknesses ($t_{i2}$) can vary from about 1 mm to about 10 mm. Alternatively, the second interface assembly 365b may not be required or may be configured differently. The second interface assembly 365b can comprise one or more control assemblies (360a, 360b, and 360c). Each of the control assemblies (360a, 360b, and 360c) can be removably coupled to the upper resonator wall 384 and removably coupled to the second interface assembly 365b.

The third microwave resonator system 300 can be configured to form plasma in the process space 315 as the substrate holder 320 and the substrate are moved through the process space 315. The third microwave resonator system 300 can be configured to process 200 mm substrates, 300 mm substrates, or larger-sized substrates. In addition, square and/or rectangular chambers can be configured so that the third microwave resonator system 300 may be configured to process square or rectangular substrates, wafers, or LCDs regardless of their size, as would be appreciated by those skilled in the art. Therefore, while aspects of the invention will be described in connection with the processing of a semiconductor substrate, the invention is not limited solely thereto.

In other embodiments, the third resonator subsystem 380 can comprise a plurality of resonant cavities (not shown) therein. In some other embodiments, the third resonator subsystem 380 can comprise a plurality of resonator subsystems having one or more resonant cavities therein. In various systems, the third resonator assembly 381 and the third EM-energy tuning space 385 can have cylindrical shapes, rectangular shapes, or squares shapes.

In some embodiments, a microwave source 350 can be coupled to the third resonator assembly 381. In addition, one or more RF sources (not shown) sources (not shown) may be coupled to the third resonator subsystem 380. The microwave source 350 can be coupled to a matching network 352, and the matching network 352 can be coupled to a coupling network 354. Alternatively, a plurality of matching networks (not shown) or a plurality of coupling networks (not shown) may be coupled to the third resonator subsystem 380. The coupling network 354 can be removably coupled to an upper resonator wall 384 of the third resonator assembly 381 and can be used to provide microwave energy to the third EM-energy tuning space 385. Alternatively, other coupling configurations may be used.

A first plasma-tuning rod (370a, 375a) can have a first plasma-tuning portion 370a that can extend into the first isolated protection space 373a established in the first protection assembly 372a at a first location ($x_{2a}$) in the process space 315, and a first EM-tuning portion 375a that can extend into the third EM-energy tuning space 385 at a first location ($x_{1a}$). A first isolation assembly 364a can be used to position (extend) the first plasma-tuning portion 370a first plasma-tuning distances 371a within the first isolated protection space 373a established in the first protection assembly 372a. For example, the first plasma-tuning distance 371a can vary from about 10 mm to about 400 mm, and the first plasma-tuning distance 371a can be wavelength-dependent and can vary from about ($\lambda/4$) to about ($10\lambda$).

A first EM-coupling region 362a can be established at a first EM-coupling distance 376a from the lower resonator wall 383 defining the third EM-energy tuning space 385, and the first EM-tuning portion 375a can extend into the first EM-coupling region 362a. The first EM-tuning portion 375a can obtain first tunable microwave energy from the first EM-coupling region 362a, and the first microwave energy can be transferred as first plasma-tuning energy to the process space 315 at the first location ($x_{2a}$) using the first plasma-tuning portion 370a. The first EM-coupling region 362a can include a tunable E-field region, a tunable H-field region, a maximum field region, a maximum voltage region, maximum energy region, or a maximum current region, or any combination thereof. For example, the first EM-coupling distance 376a can vary from about 0.01 mm to about 10 mm, and the first EM-coupling distance 376a can be wavelength-dependent and can vary from about ($\lambda/4$) to about ($10\lambda$).

A first plasma-tuning slab 361a can be coupled to a first control assembly 360a and can be used to move 363a the first plasma-tuning slab 361a a first EM-tuning distance 377a relative to the first EM-tuning portion 375a of the first plasma-tuning rod (370a, 375a) within the third EM-energy tuning space 385. The first control assembly 360a and the first plasma-tuning slab 361a can be used to optimize the microwave energy coupled from the first EM-coupling region 362a to the first EM-tuning portion 375a of the first plasma-tuning rod (370a, 375a). For example, the first EM-tuning distance 377a can be established between the first EM-tuning portion 375a and the first plasma-tuning slab 361a within the third EM-energy tuning space 385, and the first EM-tuning distance 377a can vary from about 0.01 mm to about 1 mm.

The first plasma-tuning rod (370a, 375a) can have a first diameter ($d_{1a}$) associated therewith, and the first diameter ($d_{1a}$) can vary from about 0.01 mm to about 1 mm. The first isolation assembly 364a can have a first diameter ($D_{1a}$) associated therewith, and the first diameter ($D_{1a}$) can vary from about 1 mm to about 10 mm.

The first EM-tuning portion 375a, the first EM-coupling region 362a, the first control assembly 360a, and the first plasma-tuning slab 361a can have a first x/y plane offset ($x_{1a}$) associated therewith. For example, the first x/y plane offset ($x_{1a}$) can be established relative to the resonator wall 382b, can be wavelength-dependent, and can vary from about ($\lambda/4$) to about ($10\lambda$). The first control assembly 360a can have a cylindrical configuration and a diameter ($d_{2a}$) that can vary from about 1 mm to about 5 mm. The first plasma-tuning slab 361a can have diameters ($D_{2a}$) associated therewith, and the diameter ($D_{2a}$) can vary from about 1 mm to about 10 mm.

A second plasma-tuning rod (370b, 375b) can have a second plasma-tuning portion 370b that can extend into the second isolated protection space 373b established in the second protection assembly 372b at a second location ($x_{2b}$) in the process space 315, and a second EM-tuning portion 375b that can extend into the third EM-energy tuning space 385 at a second location ($x_{1b}$). A second isolation assembly 364b can be used to position (extend) the second plasma-tuning portion 370b second plasma-tuning distances 371b within the third isolated protection space 373c established in the third protection assembly 372c. For example, the second plasma-tuning distances 371b can vary from about 10 mm to about 400 mm, and the second plasma-tuning distances 371b can be wavelength-dependent and can vary from about ($\lambda/4$) to about ($10\lambda$).

A second EM-coupling region 362b can be established at second EM-coupling distances 376b from the lower resonator wall 383 defining the third EM-energy tuning space 385, and the second EM-tuning portion 375b can extend into the second EM-coupling region 362b. The second EM-tuning portion 375b can obtain second tunable microwave energy from the second EM-coupling region 362b, and the second microwave energy can be transferred as second plasma-tuning energy to the process space 315 at the second location ($x_{2b}$) using the second plasma-tuning portion 370b. The second EM-coupling region 362b can include a tunable E-field region, a tunable H-field region, a maximum field region, a maximum voltage region, maximum energy region, or a maximum current region, or any combination thereof. For example, the second EM-coupling distance 376b can vary from about 0.01 mm to about 10 mm, and the second EM-coupling distance 376b can be wavelength-dependent and can vary from about ($\lambda/4$) to about ($10\lambda$).

A second plasma-tuning slab 361b can be coupled to a second control assembly 360b and can be used to move 363b the second plasma-tuning slab 361b second EM-tuning distances 377b relative to the second EM-tuning portion 375b of the second plasma-tuning rod (370b, 375b) within the third EM-energy tuning space 385. The second control assembly 360b and the second plasma-tuning slab 361b can be used to optimize the microwave energy coupled from the second EM-coupling region 362b to the second EM-tuning portion 375b of the second plasma-tuning rod (370b, 375b). For example, the second EM-tuning distances 377b can be established between the second EM-tuning portion 375b and the second plasma-tuning slab 361b within the third EM-energy tuning space 385, and the second EM-tuning distances 377b can vary from about 0.01 mm to about 1 mm.

The second plasma-tuning rod (370b, 375b) can have second diameters ($d_{1b}$) associated therewith, and the second diameters ($d_{1b}$) can vary from about 0.01 mm to about 1 mm. The second isolation assembly 364b can have second diameters ($D_{1b}$) associated therewith, and the second diameters ($D_{1b}$) can vary from about 1 mm to about 10 mm.

The second EM-tuning portion 375b, the second EM-coupling region 362b, the second control assembly 360b, and the second plasma-tuning slab 361b can have second x/y plane offsets ($x_{1b}$) associated therewith. For example, the second x/y plane offsets ($x_{1b}$) can be established relative to the resonator wall 382b and can be wavelength-dependent and can vary from about ($\lambda/4$) to about ($10\lambda$). The second control assembly 360b can have a cylindrical configuration and second diameters ($d_{2b}$) that can vary from about 1 mm to about 5 mm. The second plasma-tuning slab 361b can have diameters ($D_{2b}$) associated therewith, and the diameters ($D_{2b}$) can vary from about 1 mm to about 10 mm.

A third plasma-tuning rod (370c, 375c) can have a third plasma-tuning portion 370c that can extend into the third isolated protection space 373c established in the third protection assembly 372c at a third location ($x_{2c}$) in the process space 315, and a third EM-tuning portion 375c that can extend into the third EM-energy tuning space 385 at a third location ($x_{1c}$). A third isolation assembly 364c can be used to position (extend) the third plasma-tuning portion 370c third plasma-tuning distances 371c within the third isolated protection space 373c established in the third protection assembly 372c. For example, the third plasma-tuning distances 371c can vary from about 10 mm to about 400 mm, and the third plasma-tuning distances 371c can be wavelength-dependent and can vary from about ($\lambda/4$) to about ($10\lambda$).

A third EM-coupling region 362c can be established at third EM-coupling distances 376c from the lower resonator wall 383 defining the third EM-energy tuning space 385, and the third EM-tuning portion 375c can extend into the third EM-coupling region 362c. The third EM-tuning portion 375c can obtain third tunable microwave energy from the third EM-coupling region 362c, and the third microwave energy can be transferred as third plasma-tuning energy to the process space 315 at the third location ($x_{2c}$) using the third plasma-tuning portion 370c. The third EM-coupling region 362c can include a tunable E-field region, a tunable H-field region, a maximum field region, a maximum voltage region, maximum energy region, or a maximum current region, or any combination thereof. For example, the third EM-coupling distance 376c can vary from about 0.01 mm to about 10 mm, and the third EM-coupling distance 376c can be wavelength-dependent and can vary from about ($\lambda/4$) to about ($10\lambda$).

A third plasma-tuning slab 361c can be coupled to a third control assembly 360c and can be used to move 363c the third plasma-tuning slab 361c third EM-tuning distances 377c relative to the third EM-tuning portion 375c of the third plasma-tuning rod (370c, 375c) within the third EM-energy tuning space 385. The third control assembly 360c and the third plasma-tuning slab 361c can be used to optimize the microwave energy coupled from the third EM-coupling region 362c to the third EM-tuning portion 375b of the third plasma-tuning rod (370c, 375c). For example, the third EM-tuning distances 377c can be established between the third EM-tuning portion 375c and the third plasma-tuning slab 361c within the third EM-energy tuning space 385, and the third EM-tuning distances 377c can vary from about 0.01 mm to about 1 mm.

The third plasma-tuning rod (370c, 375c) can have third diameters ($d_{1c}$) associated therewith, and the third diameters ($d_{1c}$) can vary from about 0.01 mm to about 1 mm. The third isolation assembly 364c can have third diameters ($D_{1c}$) associated therewith, and the third diameters ($D_{1c}$) can vary from about 1 mm to about 10 mm.

The third EM-tuning portion 375c, the third EM-coupling region 362c, the third control assembly 360c, and the third plasma-tuning slab 361c can have third x/y plane offsets ($x_{1c}$) associated therewith. For example, the third x/y plane offsets ($x_{1c}$) can be established relative to the resonator wall 382b and can be wavelength-dependent and can vary from about ($\lambda/4$) to about ($10\lambda$). The third control assembly 360c can have a cylindrical configuration and third diameters ($d_{2c}$) that can vary from about 1 mm to about 5 mm. The third plasma-tuning slab 361c can have third diameters ($D_{2c}$) associated therewith, and the third diameters ($D_{2c}$) can vary from about 1 mm to about 10 mm.

The control assemblies (360a, 360b, and 360c) can be coupled 396 to the controller 395, and the controller 395 can use process recipes to establish, control, and optimize the EM-tuning distances (377a, 377b, and 377c) to control the EM-coupling regions (362a, 362b, and 362c) in the EM-energy tuning space 385 and the plasma uniformity within the process space 315. The controller 395 can be coupled to the microwave source 350, the matching network 352, and the coupling network 354, and the controller 395 can use process recipes to establish, control, and optimize the microwave source 350, the matching network 352, and the coupling network 354 to control the EM-coupling regions (362a, 362b, and 362c) in the EM-energy tuning space 385 and the plasma uniformity within the process space 315. For example, the microwave source 350 can operate at frequencies from about 500 MHz to about 5000 MHz. In addition, the controller 395 can be coupled to the resonator sensors 306 and process sensors 307, and the controller 395 can use process recipes to establish, control, and optimize the data from the resonator sensors 306 and the process sensors 307 to control the EM-coupling regions (362a, 362b, and 362c) in the EM-energy tuning space 385 and the plasma uniformity within the process space 315.

The front view of the third microwave resonator system 300 includes an x/y plane view of a cavity-control assembly 355 that is shown coupled to a front view of a cavity-tuning slab 356. The cavity-control assembly 355 can have a first diameter ($d_{1aa}$) associated therewith, and the first diameter ($d_{1aa}$) can vary from about 0.01 mm to about 1 mm. The cavity-tuning slab 356 can have a second diameter ($D_{1aa}$) associated therewith, and the second diameter ($D_{1aa}$) can vary from about 1 mm to about 10 mm. The cavity-control assembly 355 and the cavity-tuning slab 356 can have a first x/y plane offset ($y_{1aa}$) associated therewith, and the first x/y plane offset ($y_{1aa}$) can vary from about 1 mm to about 10 mm.

The cavity-control assembly 355 can be used to move 357 the cavity-tuning slab 356 cavity-tuning distances 358 within the third EM-energy tuning space 385. The controller 395 can be coupled to the cavity-control assembly 355, and the controller 395 can use process recipes to establish, control, and optimize the cavity-tuning distances 358 to control and maintain the plasma uniformity within the process space 315 in real-time. For example, the cavity-tuning distances 358 can vary from about 0.01 mm to about 10 mm, and the cavity-tuning distances 358 can be wavelength-dependent and can vary from about ($\lambda/16$) to about ($10\lambda$).

Still referring to FIG. 3A, a substrate holder 320, and a lower electrode 321 are shown. When present, the lower electrode 321 can be used to couple Radio Frequency (RF) power to plasma in process space 315. For example, lower electrode 321 can be electrically biased at an RF voltage via the transmission of RF power from RF generator 330 through impedance match network 331 and RF sensor 335 to lower electrode 321. The RF bias can serve to heat electrons to form and/or maintain the plasma. A typical frequency for the RF bias can range from 1 MHz to 100 MHz and is preferably 13.56 MHz. Alternatively, RF power may be applied to the lower electrode 321 at multiple frequencies. Furthermore, impedance match network 331 can serve to maximize the transfer of RF power to the plasma in process chamber 310 by minimizing the reflected power. Various match network topologies and automatic control methods can be utilized. The RF sensor 335 can measure the power levels and/or frequencies associated with the fundamental signals, harmonic signals, and/or intermodulation signals. In addition, the controller 395 can be coupled 396 to the RF generator 330, the impedance match network 331, and the RF sensor 335, and the controller 395 can use process recipes to establish, control, and optimize the data to and from the RF generator 330, the impedance match network 331, and the RF sensor 335 to control the EM-coupling regions (362a, 362b, and 362c) in the EM-energy tuning space 385 and the plasma uniformity within the process space 315.

Some of the third microwave resonator systems 300 can include a pressure control system 390 and exhaust port 391 coupled to the process chamber 310, and configured to evacuate the process chamber 310, as well as control the pressure within the process chamber 310. Alternatively, the pressure control system 390 and/or the exhaust port 391 may not be required.

As shown in FIG. 3A, the third microwave resonator systems 300 can comprise a first gas supply system 340 coupled to a first supply element 341, and the first supply element 341 can be one or more flow elements 342 that can be coupled to the process chamber 310. The flow elements 342 can be configured to introduce a first process gas to process space 315, and can include flow control and/or flow measuring devices. In addition, the third microwave resonator systems 300 can comprise a second gas supply system 345 coupled to a second supply element 346, and the second supply element 346 can be one or more second flow elements 347 that can be coupled to the process chamber 310. The second flow elements 347 can be configured to introduce a second process gas to process space 315, and can include flow control and/or flow measuring devices. Alternatively, the second gas supply system 345, the second supply element 346, and/or the second flow elements 347 may not be required.

During dry plasma etching, the process gas may comprise an etchant, a passivant, or an inert gas, or a combination of two or more thereof. For example, when plasma etching a dielectric film such as silicon oxide ($SiO_x$) or silicon nitride ($Si_xN_y$), the plasma etch gas composition generally includes a fluorocarbon-based chemistry ($C_xF_y$) such as at least one of $C_4F_8$, $C_5F_8$, $C_3F_6$, $C_4F_6$, $CF_4$, etc., and/or may include a fluorohydrocarbon-based chemistry ($C_xH_yF_z$) such as at least one of $CHF_3$, $CH_2F_2$, etc., and can have at least one of an inert gas, oxygen, CO or $CO_2$. Additionally, for example, when etching polycrystalline silicon (polysilicon), the plasma etch gas composition generally includes a halogen-containing gas such as HBr, $Cl_2$, $NF_3$, or $SF_6$ or a combination of two or more thereof, and may include fluorohydrocarbon-based chemistry ($C_xH_yF_z$) such as at least one of $CHF_3$, $CH_2F_2$, etc., and at least one of an inert gas, oxygen, CO or $CO_2$, or two or more thereof. During plasma-enhanced deposition, the process gas may comprise a film forming precursor, a reduction gas, or an inert gas, or a combination of two or more thereof.

Figure 3B:
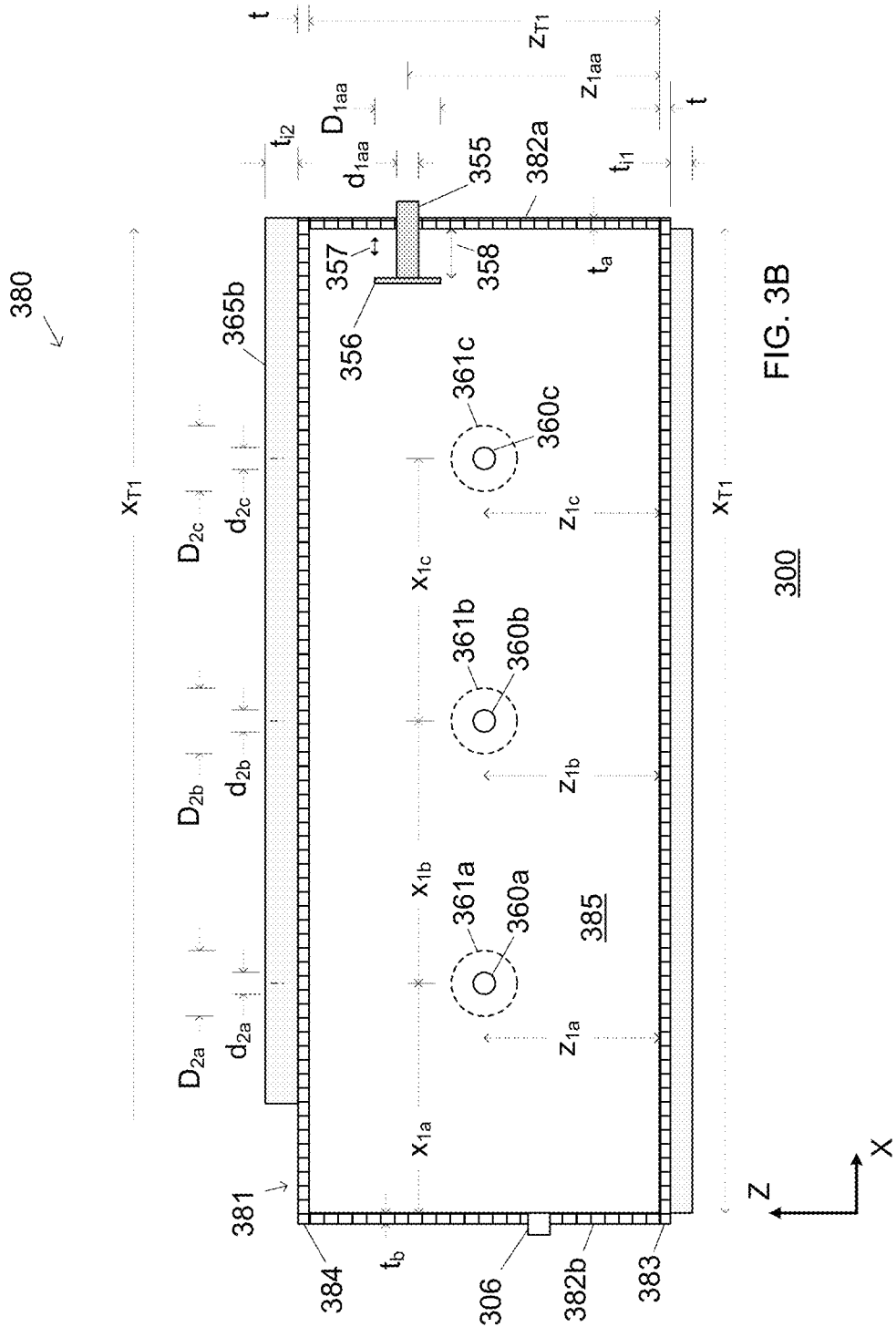

FIG. 3B illustrates a top view of a third resonator assembly in accordance with embodiments of the invention. The third resonator assembly 381 can have a total length ($x_{T1}$) and a total height ($z_{T1}$) associated therewith in the x/z plane. For example, the total length ($x_{T1}$) can vary from about 10 mm to about 500 mm, and the total height ($z_{T1}$) can vary from about 10 mm to about 1000 mm.

The top view of third resonator subsystem 380 includes an x/z plane view of a first control assembly 360a that is shown surrounded by a top (dash line) view of a first plasma-tuning slab 361a. The first control assembly 360a can have a first diameter ($d_{2a}$) associated therewith, and the first diameter ($d_{2a}$) can vary from about 0.01 mm to about 1 mm. The first plasma-tuning slab 361a can have a second diameter ($D_{2a}$) associated therewith, and the second diameter ($D_{2a}$) can vary from about 1 mm to about 10 mm. The first control assembly 360a and the first plasma-tuning slab 361a can have first x/z plane offsets ($x_{1a}$) associated therewith, and the first x/z plane offsets ($x_{1a}$) can vary from about 1 mm to about 10 mm. Alternatively, the first control assembly 360a and the first plasma-tuning slab 361a may have different first x/z plane offsets ($x_{1a}$) associated therewith. The first control assembly 360a and the first plasma-tuning slab 361a can have first x/z plane offsets ($z_{1a}$) associated therewith, and the first x/z plane offsets ($z_{1a}$) can vary from about 1 mm to about 10 mm. Alternatively, the first control assembly 360a and the first plasma-tuning slab 361a may have different first x/z plane offsets ($z_{1a}$) associated therewith.

In addition, the top view of third resonator subsystem 380 includes an x/z plane view of a second control assembly 360b that is shown surrounded by a top (dash line) view of a second plasma-tuning slab 361b. The second control assembly 360b can have a first diameter ($d_{2b}$) associated therewith, and the first diameter ($d_{2b}$) can vary from about 0.01 mm to about 1 mm. The second plasma-tuning slab 361b can have a second diameter ($D_{2b}$) associated therewith, and the second diameter ($D_{2b}$) can vary from about 1 mm to about 10 mm. The second control assembly 360b and the second plasma-tuning slab 361b can have second x/z plane offsets ($x_{1b}$) associated therewith, and the second x/z plane offsets ($x_{1b}$) can vary from about 1 mm to about 10 mm. Alternatively, the second control assembly 360b and the second plasma-tuning slab 361b may have different second x/z plane offsets ($x_{1b}$) associated therewith. The second control assembly 360b and the second plasma-tuning slab 361b can have second x/z plane offsets ($z_{1b}$) associated therewith, and the second x/z plane offsets ($z_{1b}$) can vary from about 1 mm to about 10 mm. Alternatively, the second control assembly 360b and the second plasma-tuning slab 361b may have different second x/z plane offsets ($z_{1a}$) associated therewith.

Furthermore, the top view of third resonator subsystem 380 includes a x/z plane view of a third control assembly 360c that is shown surrounded by a top (dash line) view of a third plasma-tuning slab 361c. The third control assembly 360c can have a first diameter ($d_{2c}$) associated therewith, and the first diameter ($d_{2c}$) can vary from about 0.01 mm to about 1 mm. The third plasma-tuning slab 361c can have a second diameter ($D_{2c}$) associated therewith, and the third diameter ($D_{2c}$) can vary from about 1 mm to about 10 mm. The third control assembly 360c and the third plasma-tuning slab 361c can have third x/z plane offsets ($x_{1c}$) associated therewith, and the third x/z plane offsets ($x_{1c}$) can vary from about 1 mm to about 10 mm. Alternatively, the third control assembly 360c and the third plasma-tuning slab 361c may have different third x/z plane offsets ($x_{1c}$) associated therewith. The third control assembly 360c and the third plasma-tuning slab 361c can have third x/z plane offsets ($z_{1c}$) associated therewith, and the third x/z plane offsets ($z_{1b}$) can vary from about 1 mm to about 10 mm. Alternatively, the third control assembly 360c and the third plasma-tuning slab 361c may have different third x/z plane offsets ($z_{1a}$) associated therewith.

FIG. 3B shows top views of resonator walls (382a, 382b, 383, and 384). The resonator wall 382a can have wall thicknesses ($t_a$) associated therewith, and the wall thicknesses ($t_a$) can vary from about 1 mm to about 5 mm. The resonator wall 382b can have wall thicknesses ($t_b$) associated therewith, and the wall thicknesses ($t_b$) can vary from about 1 mm to about 5 mm. The resonator walls (382a and 382b) can have wall thicknesses (t) associated therewith, and the wall thicknesses (t) can vary from about 1 mm to about 5 mm.

The top view of the third microwave resonator system 300 includes an x/z plane view of a cavity-control assembly 355 and an x/z plane view of a cavity-tuning slab 356. The cavity-control assembly 355 can have a first diameter ($d_{1aa}$) associated therewith, and the first diameter ($d_{1aa}$) can vary from about 0.01 mm to about 1 mm. The cavity-tuning slab 356 can have a second diameter ($D_{1aa}$) associated therewith, and the second diameter ($D_{1aa}$) can vary from about 1 mm to about 10 mm. The cavity-control assembly 355 and the cavity-tuning slab 356 can have a first x/z plane offset ($z_{1aa}$) associated therewith, and the first x/z plane offset ($z_{1aa}$) can vary from about 1 mm to about 10 mm.

Figure 3C:
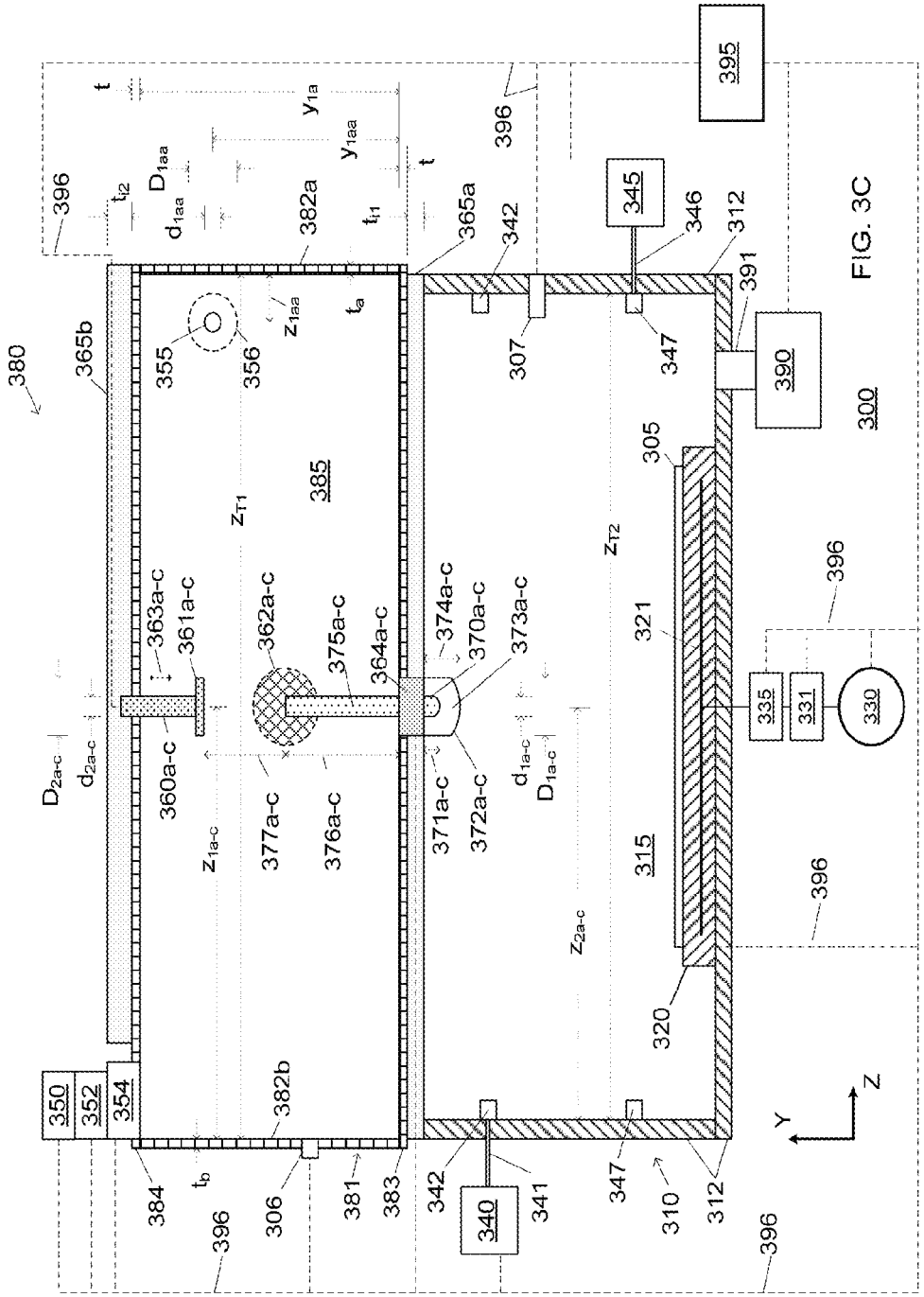

FIG. 3C illustrates a side view of the third microwave resonator system 300. The side view shows a y/z plane view of a process chamber 310 that can be configured using a first interface assembly 365a, and a process space 315 can be configured within the process chamber 310. For example, the chamber walls 312 can have wall thicknesses (t) associated therewith, and the wall thicknesses (t) can vary from about 1 mm to about 5 mm. The first interface assembly 365a can have a first interface thickness ($t_{i1}$) associated therewith, and the first interface thickness ($t_{i1}$) can vary from about 1 mm to about 10 mm.

The side view shows a y/z plane view of a third resonator subsystem 380 that can comprise a third resonator assembly 381 that can be configured using a plurality of resonator walls (382a, 382b, 383, and 384). For example, the resonator walls (382a, 382b, 383, and 384) can include dielectric material such as quartz and can define a third EM-energy tuning space 385 therein. In addition, one or more resonator sensors 306 can be coupled to the third EM-energy tuning space 385 to obtain first resonator data.

The resonator walls 382a can have wall thicknesses ($t_a$) associated therewith, and the wall thicknesses ($t_a$) can vary from about 1 mm to about 5 mm. The resonator walls 382b can have wall thicknesses ($t_b$) associated therewith, and the wall thicknesses ($t_b$) can vary from about 1 mm to about 5 mm. The resonator walls 383 can have wall thicknesses (t) associated therewith, and the wall thicknesses (t) can vary from about 1 mm to about 5 mm.

In some examples, the first interface assembly 365a can be used to removably couple the third resonator assembly 381 to the process chamber 310. The first interface assembly 365a can have first interface thicknesses ($t_{i1}$) associated therewith, and the first interface thicknesses ($t_{i1}$) can vary from about 1 mm to about 10 mm. Alternatively, the first interface assembly 365a may not be required or may be configured differently. A first interface assembly 365a can comprise one or more isolation assemblies (364a, 364b, and 364c). Each of the isolation assemblies (364a, 364b, and 364c) can be removably coupled to a lower resonator wall 383 and removably coupled to one or more of the first interface assembly 365a.

In addition, a second interface assembly 365b can be coupled to the third resonator assembly 381 using an upper resonator wall 384. The second interface assembly 365b can have second interface thicknesses ($t_{i2}$) associated therewith, and the second interface thicknesses ($t_{i2}$) can vary from about 1 mm to about 10 mm. Alternatively, the second interface assembly 365b may not be required or may be configured differently. The second interface assembly 365b can comprise one or more control assemblies (360a, 360b, and 360c). Each of the control assemblies (360a, 360b, and 360c) can be removably coupled to the upper resonator wall 384 and removably coupled to the second interface assembly 365b.

The third microwave resonator system 300 can be configured to form plasma in the process space 315 as the substrate holder 320 and the substrate are moved through the process space 315. The third microwave resonator system 300 can be configured to process 200 mm substrates, 300 mm substrates, or larger-sized substrates. In addition, square and/or rectangular chambers can be configured so that the third microwave resonator system 300 may be configured to process square or rectangular substrates, wafers, or LCDs regardless of their size, as would be appreciated by those skilled in the art. Therefore, while aspects of the invention will be described in connection with the processing of a semiconductor substrate, the invention is not limited solely thereto.

In other embodiments, the third resonator subsystem 380 can comprise a plurality of resonant cavities (not shown) therein. In some other embodiments, the third resonator subsystem 380 can comprise a plurality of resonator subsystems having one or more resonant cavities therein. In various systems, the third resonator assembly 381 and the third EM-energy tuning space 385 can have cylindrical shapes, rectangular shapes, or squares shapes.

In FIG. 3C, a side view of third microwave resonator system 300 is shown. The microwave source 350 can be coupled to a matching network 352, and the matching network 352 can be coupled to a coupling network 354. Alternatively, a plurality of matching networks (not shown) or a plurality of coupling networks (not shown) may be coupled to the third resonator subsystem 380. The coupling network 354 can be removably coupled to an upper resonator wall 384 of the third resonator assembly 381 and can be used to provide microwave energy to the third EM-energy tuning space 385. Alternatively, other coupling configurations may be used.

The side view includes a y/z plane view of a first set of plasma-tuning rods {(370a, 375a), (370b, 375b), and (370c, 375c)} that can have a first set of plasma-tuning portions (370a, 370b, and 370c) that can extend into first set of isolated protection spaces (373a, 373b, and 373c) established in the first set of protection assemblies (372a, 372b, and 372c) at first y/z plane locations ($z_{2a-c}$) in the process space 315, and a first set of EM-tuning portions (375a, 375b, and 375c) that can extend into the third EM-energy tuning space 385 at second y/z plane locations ($z_{1a-c}$). A first set of isolation assemblies (364a, 364b, and 364c) can be used to position (extend) the first set of plasma-tuning portions (370a, 370b, and 370c) first set of plasma-tuning distances (371a, 371b, and 371c) within the process space 315 at the first locations defined using ($z_{2a-c}$). For example, the first set of plasma-tuning distances (371a, 371b, and 371c) can vary from about 10 mm to about 400 mm, and the first set of plasma-tuning distances (371a, 371b, and 371c) can be wavelength-dependent and can vary from about ($\lambda/4$) to about ($10\lambda$).

A first set of EM-coupling regions (362a, 362b, and 362c) can be established at the EM-coupling distances (376a, 376b, and 376c) from the lower resonator wall 383 defining the third EM-energy tuning space 385, and the first set of EM-tuning portions (375a, 375b, and 375c) can extend into the first set of EM-coupling regions (362a, 362b, and 362c). The first set of EM-tuning portions (375a, 375b, and 375c) can obtain tunable microwave energies from the first set of EM-coupling regions (362a, 362b, and 362c), and the tunable microwave energies can be transferred as controllable plasma-tuning energies to the process space 315 at the first y/z plane locations ($z_{2a-c}$) using the first set of plasma-tuning portions (370a, 370b, and 370c). The first set of EM-coupling regions (362a, 362b, and 362c) can include a tunable E-field region, a tunable H-field region, a maximum field region, a maximum voltage region, maximum energy region, or a maximum current region, or any combination thereof. For example, the EM-coupling distances (376a, 376b, and 376c) can vary from about 0.01 mm to about 10 mm, and the EM-coupling distances (376a, 376b, and 376c) can be wavelength-dependent and can vary from about ($\lambda/4$) to about ($10\lambda$).

A first set of plasma-tuning slabs (361a, 361b, and 361c) can be coupled to a first set of control assemblies (360a, 360b, and 360c) and can be used to move (363a, 363b, and 363c) the first set of plasma-tuning slabs (361a, 361b, and 361c) first EM-tuning distances (377a, 377b, and 377c) relative to the first set of EM-tuning portions (375a, 375b, and 375c) of the first set of plasma-tuning rod {(370a, 375a), (370b, 375b), and (370c, 375c)} within the third EM-energy tuning space 385. The first set of control assemblies (360a, 360b, and 360c) and the first set of plasma-tuning slabs (361a, 361b, and 361c) can be used to optimize the microwave energies coupled from the first set of EM-coupling regions (362a, 362b, and 362c) to the first set of EM-tuning portions (375a, 375b, and 375c) of the first set of plasma-tuning rod {(370a, 375a), (370b, 375b), and (370c, 375c)}. For example, the first EM-tuning distances (377a, 377b, and 377c) can be established between the first set of EM-tuning portions (375a, 375b, and 375c) and the first set of plasma-tuning slabs (361a, 361b, and 361c) within the third EM-energy tuning space 385, and the first EM-tuning distances (377a, 377b, and 377c) can vary from about 0.01 mm to about 1 mm.

A first set of protection assemblies (372a, 372b, and 372c) can be coupled to the first set of isolation assemblies (364a, 364b, and 364c), and the first set of protection assemblies (372a, 372b, and 372c) can be configured at first locations ($z_{2a-c}$) within the process space 315. The set of protection assemblies (372a, 372b, and 372c) can have first sets of isolated protection spaces (373a, 373b, and 373c) therein and can have insertion lengths (374a, 374b, and 374c) associated therewith. For example, the insertion lengths (374a, 374b, and 374c) can vary from about 1 mm to about 10 mm in the y/z plane, and the protection assemblies (372a, 372b, and 372c) can be constructed using one or more dielectric materials.

The first set of plasma-tuning rod {(370a, 375a), (370b, 375b), and (370c, 375c)} can comprise dielectric material and can have first diameter ($d_{1a}$) associated therewith, and the first diameters ($d_{1a}$) can vary from about 0.01 mm to about 1 mm. The first set of isolation assemblies (364a, 364b, and 364c) and the first set of protection assemblies (372a, 372b, and 372c) can comprise dielectric material, can have first diameters ($D_{1a}$) associated therewith, and the first diameters ($D_{1a}$) can vary from about 1 mm to about 10 mm. Alternatively, the isolation assemblies (364a, 364b, and 364c) and the first set of protection assemblies (372a, 372b, and 372c) can have different diameters associated therewith.

The first set of EM-tuning portions (375a, 375b, and 375c), the first set of EM-coupling regions (362a, 362b, and 362c), the first set of control assemblies (360a, 360b, and 360c), and the first set of plasma-tuning slabs (361a, 361b, and 361c) can have y/z plane offsets ($z_{1a-c}$) associated therewith. For example, the y/z plane offsets ($z_{1a-c}$) can be established relative to the lower resonator wall 383 and can be wavelength-dependent and can vary from about ($\lambda/4$) to about ($10\lambda$). The first set of control assemblies (360a, 360b, and 360c) can comprise dielectric material, can have cylindrical configurations and diameter ($d_{2a-c}$) that can vary from about 1 mm to about 5 mm. The first set of plasma-tuning slabs (361a, 361b, and 361c) can comprise dielectric material, can have diameters ($D_{2a-c}$) associated therewith, and the diameters ($D_{2a-c}$) can vary from about 1 mm to about 10 mm.

As shown in FIG. 3C, the control assemblies (360a, 360b, and 360c) can be coupled 396 to the controller 395, and the controller 395 can use process recipes to establish, control, and optimize the EM-tuning distances (377a, 377b, and 377c) to control the EM-coupling regions (362a, 362b, and 362c) in the EM-energy tuning space 385 and the plasma uniformity within the process space 315. The controller 395 can be coupled to the microwave source 350, the matching network 352, and the coupling network 354, and the controller 395 can use process recipes to establish, control, and optimize the microwave source 350, the matching network 352, and the coupling network 354 to control the plasma uniformity within the process space 315. For example, the microwave source 350 can operate at frequencies from about 500 MHz to about 5000 MHz. In addition, the controller 395 can be coupled to the resonator sensors 306 and process sensors 307, and the controller 395 can use process recipes to establish, control, and optimize the data from the resonator sensors 306 and the process sensors 307 to control the EM-coupling regions (362a, 362b, and 362c) in the EM-energy tuning space 385 and the plasma uniformity within the process space 315.

The side view of the third microwave resonator system 300 includes a y/z plane view of a cavity-control assembly 355 that is shown coupled to a side view of a cavity-tuning slab 356. The cavity-control assembly 355 can have a first diameter ($d_{1aa}$) associated therewith, and the first diameter ($d_{1aa}$) can vary from about 0.01 mm to about 1 mm. The cavity-tuning slab 356 can have a second diameter ($D_{1aa}$) associated therewith, and the second diameter ($D_{1aa}$) can vary from about 1 mm to about 10 mm. The cavity-control assembly 355 and the cavity-tuning slab 356 can have first y/z plane offsets ($y_{1aa}$) associated therewith, and the first y/z plane offsets ($y_{1aa}$) can vary from about 1 mm to about 10 mm.

Still referring to FIG. 3C, side views of the substrate holder 320 and the lower electrode 321 are shown. When present, the lower electrode 321 can be used to couple Radio Frequency (RF) power to plasma in process space 315. For example, lower electrode 321 can be electrically biased at an RF voltage via the transmission of RF power from RF generator 330 through impedance match network 331 and RF sensor 335 to lower electrode 321. The RF bias can serve to heat electrons to form and/or maintain the plasma. A typical frequency for the RF bias can range from 1 MHz to 100 MHz and is preferably 13.56 MHz. Alternatively, RF power may be applied to the lower electrode 321 at multiple frequencies. Furthermore, impedance match network 331 can serve to maximize the transfer of RF power to the plasma in process chamber 310 by minimizing the reflected power. Various match network topologies and automatic control methods can be utilized. The RF sensor 335 can measure the power levels and/or frequencies associated with the fundamental signals, harmonic signals, and/or intermodulation signals. In addition, the controller 395 can be coupled 396 to the RF generator 330, the impedance match network 331, and the RF sensor 335, and the controller 395 can use process recipes to establish, control, and optimize the data to and from the RF generator 330, the impedance match network 331, and the RF sensor 335 to control the EM-coupling regions (362a, 362b, and 362c) in the EM-energy tuning space 385 and the plasma uniformity within the process space 315.

The side view of the third microwave resonator system 300 can include a y/z plane view of a pressure control system 390 and exhaust port 391 coupled to the process chamber 310, and configured to evacuate the process chamber 310, as well as control the pressure within the process chamber 310. Alternatively, the pressure control system 390 and/or the exhaust port 391 may not be required.

As shown in FIG. 3C, the side view can include y/z plane views of the first gas supply system 340, the first supply element 341, the first flow elements 342, and the process chamber 310. The first flow elements 342 can be configured around the process space 315, and can be configured to introduce a first process gas to process space 315. In addition, the side view can include y/z plane views of the second gas supply system 345, the second supply element 346, and the second flow elements 347. The second flow elements 347 can be configured around the process space 315, and can be configured to introduce a second process gas to process space 315.

During dry plasma etching, the process gas may comprise an etchant, a passivant, or an inert gas, or a combination of two or more thereof. For example, when plasma etching a dielectric film such as silicon oxide ($SiO_x$) or silicon nitride ($Si_xN_y$), the plasma etch gas composition generally includes a fluorocarbon-based chemistry ($C_xF_y$) such as at least one of $C_4F_8$, $C_5F_8$, $C_3F_6$, $C_4F_6$, $CF_4$, etc., and/or may include a fluorohydrocarbon-based chemistry ($C_xH_yF_z$) such as at least one of $CHF_3$, $CH_2F_2$, etc., and can have at least one of an inert gas, oxygen, CO or $CO_2$. Additionally, for example, when etching polycrystalline silicon (polysilicon), the plasma etch gas composition generally includes a halogen-containing gas such as HBr, $Cl_2$, $NF_3$, or $SF_6$ or a combination of two or more thereof, and may include fluorohydrocarbon-based chemistry ($C_xH_yF_z$) such as at least one of $CHF_3$, $CH_2F_2$, etc., and at least one of an inert gas, oxygen, CO or $CO_2$, or two or more thereof. During plasma-enhanced deposition, the process gas may comprise a film forming precursor, a reduction gas, or an inert gas, or a combination of two or more thereof.

Figure 4A:
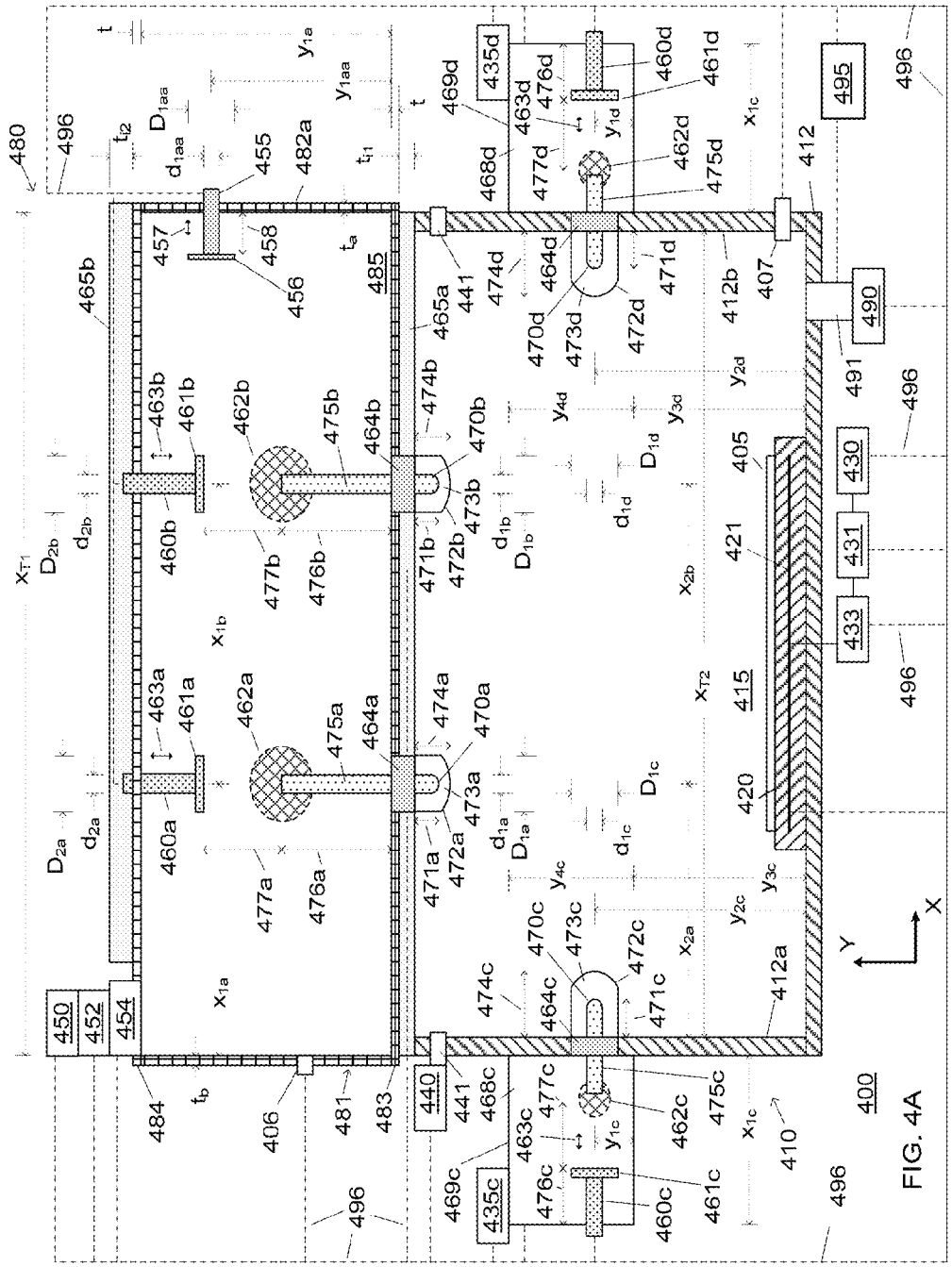
FIGS. 4A-4C illustrate different exemplary views of a fourth microwave processing system according to embodiments of the invention.

FIG. 4A illustrates a fourth microwave resonator system 400 according to embodiments of the invention. The fourth microwave resonator system 400 may be used in a dry plasma etching system or a plasma enhanced deposition system. The fourth microwave resonator system 400 can include a fourth resonator subsystem 480 that can be coupled to a process chamber 410. Alternatively, the fourth microwave resonator system 400 may be configured differently.

FIG. 4A shows a front view of the fourth microwave resonator system 400. The front view shows an x/y plane view of a process chamber 410 that can be configured using a first interface assembly 465a, a plurality of chamber walls 412 coupled to the first interface assembly 465a, and a process space 415 can be configured within the process chamber 410. For example, the chamber walls 412 can have wall thicknesses (t) associated therewith, and the wall thicknesses (t) can vary from about 1 mm to about 5 mm. The first interface assembly 465a can have a first interface thickness ($t_{i1}$) associated therewith, and the first interface thickness ($t_{i1}$) can vary from about 1 mm to about 10 mm.

The front view shows an x/y plane view of a fourth resonator subsystem 480 that can comprise a third resonator assembly 481 having a plurality of resonator walls (482a, 482b, 483, and 484) defining a fourth EM-energy tuning space 485 therein. For example, the resonator walls (482a, 482b, 483, and 484) can include dielectric material such as quartz. In addition, one or more resonator sensors 406 can be coupled to the fourth EM-energy tuning space 485 to obtain first resonator data.

The resonator walls 482a can have wall thicknesses ($t_a$) associated therewith, and the wall thicknesses ($t_a$) can vary from about 1 mm to about 5 mm. The resonator walls 482b can have wall thicknesses ($t_b$) associated therewith, and the wall thicknesses ($t_b$) can vary from about 1 mm to about 5 mm. The resonator walls 482 can have wall thicknesses (t) associated therewith, and the wall thicknesses (t) can vary from about 1 mm to about 5 mm.

In some examples, the first interface assembly 465a can be used to removably couple the fourth resonator assembly 481 to the process chamber 410. The first interface assembly 465a can have first interface thicknesses ($t_{i1}$) associated therewith, and the first interface thicknesses ($t_{i1}$) can vary from about 1 mm to about 10 mm. Alternatively, the first interface assembly 465a may not be required or may be configured differently.

A first interface assembly 465a can comprise one or more isolation assemblies (464a and 464b). Each of the isolation assemblies (464a and 464b) can be removably coupled to a lower resonator wall 483 and removably coupled to the first interface assembly 465a. A first protection assembly 472a can be coupled to the first isolation assembly 464a, and the first protection assembly 472a can be configured at a first location ($x_{2a}$) within the process space 415. The first protection assembly 472a can have a first isolated protection space 473a therein and can have a first insertion length 474a associated therewith. A second protection assembly 472b can be coupled to the second isolation assembly 464b, and the second protection assembly 472b can be configured at a second location ($x_{2b}$) within the process space 415. The second protection assembly 472b can have a second isolated protection space 473b therein and can have a second insertion length 474b associated therewith. For example, the insertion lengths (474a and 474b) can vary from about 1 mm to about 10 mm in the x/y plane, and the first set of protection assemblies (472a and 472b) can be constructed using one or more dielectric materials.

A third protection assembly 472c can be coupled to the third isolation assembly 464c, and the third protection assembly 472c can be configured at a third location ($y_{2c}$) within the process space 415. The third protection assembly 472c can have a third isolated protection space 473c therein and can have a third insertion length 474c associated therewith. A fourth protection assembly 472d can be coupled to the fourth isolation assembly 464d, and the fourth protection assembly 472d can be configured at a fourth location ($y_{2d}$) within the process space 415. The fourth protection assembly 472d can have a fourth isolated protection space 473d therein and can have a fourth insertion length 474d associated therewith. For example, the insertion lengths (474c and 474d) can vary from about 1 mm to about 10 mm in the x/y plane, and the second set of protection assemblies (472c and 472d) can be constructed using one or more dielectric materials.

In addition, a second interface assembly 465b can be coupled to the fourth resonator assembly 481 using an upper resonator wall 484. The second interface assembly 465b can have second interface thicknesses ($t_{i2}$) associated therewith, and the second interface thicknesses ($t_{i2}$) can vary from about 1 mm to about 10 mm. Alternatively, the second interface assembly 465b may not be required or may be configured differently. The second interface assembly 465b can comprise one or more control assemblies (460a and 460b). Each of the control assemblies (460a and 460b) can be removably coupled to the upper resonator wall 484 and removably coupled to the second interface assembly 465b.

The fourth microwave resonator system 400 can be configured to form plasma in the process space 415 as the substrate holder 420 and the substrate are moved through the process space 415. The fourth microwave resonator system 400 can be configured to process 200 mm substrates, 300 mm substrates, or larger-sized substrates. In addition, square and/or rectangular chambers can be configured so that the fourth microwave resonator system 400 may be configured to process square or rectangular substrates, wafers, or LCDs regardless of their size, as would be appreciated by those skilled in the art. Therefore, while aspects of the invention will be described in connection with the processing of a semiconductor substrate, the invention is not limited solely thereto.

In other embodiments, the fourth resonator subsystem 480 can comprise a plurality of resonant cavities (not shown) therein. In some other embodiments, the fourth microwave resonator system 400 can comprise a plurality of resonator subsystems having one or more resonant cavities therein. In various systems, the fourth resonator assembly 481 and the fourth EM-energy tuning space 485 can have cylindrical shapes, rectangular shapes, or squares shapes.

In some embodiments, a microwave source 450 can be coupled to the fourth resonator assembly 481. In addition, one or more RF sources (not shown) sources (not shown) may be coupled to the fourth resonator subsystem 480. The microwave source 450 can be coupled to a matching network 452, and the matching network 452 can be coupled to a coupling network 454. Alternatively, a plurality of matching networks (not shown) or a plurality of coupling networks (not shown) may be coupled to the fourth resonator subsystem 480. The coupling network 454 can be removably coupled to an upper resonator wall 484 of the fourth resonator assembly 481 and can be used to provide microwave energy to the fourth EM-energy tuning space 485. Alternatively, other coupling configurations may be used.

A first plasma-tuning rod (470a, 475a) can have a first plasma-tuning portion 470a that can extend into the first isolated protection space 473a established in the first protection assembly 472a at a first location ($x_{2a}$) in the process space 415, and a first EM-tuning portion 475a that can extend into the fourth EM-energy tuning space 485 at a first location ($x_{1a}$). A first isolation assembly 464a can be used to position (extend) the first plasma-tuning portion 470a at first plasma-tuning distances 471a within the first isolated protection space 473a established in the first protection assembly 472a. For example, the first plasma-tuning distance 471a can vary from about 10 mm to about 400 mm, and the first plasma-tuning distance 471a can be wavelength-dependent and can vary from about ($\lambda/4$) to about ($10\lambda$).

A first EM-coupling region 462a can be established at a first EM-coupling distance 476a from the lower resonator wall 483 defining the fourth EM-energy tuning space 485, and the first EM-tuning portion 475a can extend into the first EM-coupling region 462a. The first EM-tuning portion 475a can obtain first tunable microwave energy from the first EM-coupling region 462a, and the first microwave energy can be transferred as first plasma-tuning energy to the process space 415 at the first x/y plane location ($x_{2a}$) using the first plasma-tuning portion 470a. The first EM-coupling region 462a can include a tunable E-field region, a tunable H-field region, a maximum field region, a maximum voltage region, maximum energy region, or a maximum current region, or any combination thereof. For example, the first EM-coupling distance 476a can vary from about 0.01 mm to about 10 mm, and the first EM-coupling distance 476a can be wavelength-dependent and can vary from about ($\lambda/4$) to about ($10\lambda$).

A first plasma-tuning slab 461a can be coupled to a first control assembly 460a and can be used to move 463a the first plasma-tuning slab 461a a first EM-tuning distance 477a relative to the first EM-tuning portion 475a of the first plasma-tuning rod (470a, 475a) within the fourth EM-energy tuning space 485. The first control assembly 460a and the first plasma-tuning slab 461a can be used to optimize the microwave energy coupled from the first EM-coupling region 462a to the first EM-tuning portion 475a of the first plasma-tuning rod (470a, 475a). For example, the first EM-tuning distance 477a can be established between the first EM-tuning portion 475a and the first plasma-tuning slab 461a within the fourth EM-energy tuning space 485, and the first EM-tuning distance 477a can vary from about 0.01 mm to about 1 mm.

The first plasma-tuning rod (470a, 475a) can have a first diameter ($d_{1a}$) associated therewith, and the first diameter ($d_{1a}$) can vary from about 0.01 mm to about 1 mm. The first isolation assembly 464a can have a first diameter ($D_{1a}$) associated therewith, and the first diameter ($D_{1a}$) can vary from about 1 mm to about 10 mm.

The first EM-tuning portion 475a, the first EM-coupling region 462a, the first control assembly 460a, and the first plasma-tuning slab 461a can have a first x/y plane offset ($x_{1a}$) associated therewith. For example, the first x/y plane offset ($x_{1a}$) can be established relative to the resonator wall 482b, can be wavelength-dependent, and can vary from about ($\lambda/4$) to about ($10\lambda$). The first control assembly 460a can have a cylindrical configuration and a diameter ($d_{2a}$) that can vary from about 1 mm to about 5 mm. The first plasma-tuning slab 461a can have diameters ($D_{2a}$) associated therewith, and the diameter ($D_{2a}$) can vary from about 1 mm to about 10 mm.

A second plasma-tuning rod (470b, 475b) can have a second plasma-tuning portion 470b that can extend into the second isolated protection space 473b established in the second protection assembly 472b at a second location ($x_{2b}$) in the process space 415, and a second EM-tuning portion 475b that can extend into the fourth EM-energy tuning space 485 at a second x/y plane location ($x_{1b}$). A second isolation assembly 464b can be used to position (extend) the second plasma-tuning portion 470b second plasma-tuning distances 471b within the third isolated protection space 473c established in the third protection assembly 472c. For example, the second plasma-tuning distances 471b can vary from about 10 mm to about 400 mm, and the second plasma-tuning distances 471b can be wavelength-dependent and can vary from about ($\lambda/4$) to about ($10\lambda$).

A second EM-coupling region 462b can be established at second EM-coupling distances 476b from the lower resonator wall 483 defining the fourth EM-energy tuning space 485, and the second EM-tuning portion 475b can extend into the second EM-coupling region 462b. The second EM-tuning portion 475b can obtain second tunable microwave energy from the second EM-coupling region 462b, and the second microwave energy can be transferred as second plasma-tuning energy to the process space 415 at the second x/y plane location ($x_{2b}$) using the second plasma-tuning portion 470b. The second EM-coupling region 462b can include a tunable E-field region, a tunable H-field region, a maximum field region, a maximum voltage region, maximum energy region, or a maximum current region, or any combination thereof. For example, the second EM-coupling distance 476b can vary from about 0.01 mm to about 10 mm, and the second EM-coupling distance 476b can be wavelength-dependent and can vary from about ($\lambda/4$) to about ($10\lambda$).

A second plasma-tuning slab 461b can be coupled to a second control assembly 460b and can be used to move 463b the second plasma-tuning slab 461b second EM-tuning distances 477b relative to the second EM-tuning portion 475b of the second plasma-tuning rod (470b, 475b) within the fourth EM-energy tuning space 485. The second control assembly 460b and the second plasma-tuning slab 461b can be used to optimize the microwave energy coupled from the second EM-coupling region 462b to the second EM-tuning portion 475b of the second plasma-tuning rod (470b, 475b). For example, the second EM-tuning distances 477b can be established between the second EM-tuning portion 475b and the second plasma-tuning slab 461b within the fourth EM-energy tuning space 485, and the second EM-tuning distances 477b can vary from about 0.01 mm to about 1 mm.

The second plasma-tuning rod (470b, 475b) can have second diameters ($d_{1b}$) associated therewith, and the second diameters ($d_{1b}$) can vary from about 0.01 mm to about 1 mm. The second isolation assembly 464b can have second diameters ($D_{1b}$) associated therewith, and the second diameters ($D_{1b}$) can vary from about 1 mm to about 10 mm.

The second EM-tuning portion 475b, the second EM-coupling region 462b, the second control assembly 460b, and the second plasma-tuning slab 461b can have second x/y plane offsets ($x_{1b}$) associated therewith. For example, the second x/y plane offsets ($x_{1b}$) can be established relative to the resonator wall 482b and can be wavelength-dependent and can vary from about ($\lambda/4$) to about ($10\lambda$). The second control assembly 460b can have a cylindrical configuration and second diameters ($d_{2b}$) that can vary from about 1 mm to about 5 mm. The second plasma-tuning slab 461b can have diameters ($D_{2b}$) associated therewith, and the diameters ($D_{2b}$) can vary from about 1 mm to about 10 mm.

A first resonator subassembly 481c can be coupled to a first chamber wall 412a at a first x/y plane offset ($y_{3c}$) and can have a first height ($y_{4c}$). For example, the first y/y plane offsets ($y_{3c}$) can be established relative to the lower chamber wall 412 and can be wavelength-dependent and can vary from about ($\lambda/4$) to about ($100\lambda$). In addition, the first height ($y_{4c}$) can vary from about ($\lambda/4$) to about ($10\lambda$).

In some embodiments, a first EM source 435c can be coupled to the first resonator subassembly 481c, and the first EM source 435c can operate at frequencies from about 500 MHz to about 5000 MHz. The controller 495 can be coupled to the first resonator subassembly 481c and the first EM source 435c, and the controller 495 can use process recipes to establish, control, and optimize the first resonator subassembly 481c and the first EM source 435c to control the third EM-coupling region 462c in the third EM-energy tuning space 485c and the plasma uniformity within the process space 415.

A third plasma-tuning rod (470c, 475c) can have a third plasma-tuning portion 470c that can extend into the third isolated protection space 473c established in the third protection assembly 472c at a third x/y plane location ($y_{2c}$) in the process space 415, and a third EM-tuning portion 475c that can extend into the third EM-energy tuning space 485c at a third x/y plane location ($y_{1c}$). A third isolation assembly 464c can be used to position (extend) the third plasma-tuning portion 470c third plasma-tuning distances 471c within the third isolated protection space 473c established in the third protection assembly 472c. For example, the third plasma-tuning distances 471c can vary from about 10 mm to about 400 mm, and the third plasma-tuning distances 471c can be wavelength-dependent and can vary from about ($\lambda/4$) to about ($10\lambda$).

A third EM-coupling region 462c can be established at third EM-coupling distances 476c from at least one wall in the first resonator subassembly 481c defining the third EM-energy tuning space 485c, and the third EM-tuning portion 475c can extend into the third EM-coupling region 462c. The third EM-tuning portion 475c can obtain third tunable microwave energy from the third EM-coupling region 462c, and the third microwave energy can be transferred as third plasma-tuning energy to the process space 415 at the third x/y plane location ($y_{2c}$) using the third plasma-tuning portion 470c. The third EM-coupling region 462c can include a tunable E-field region, a tunable H-field region, a maximum field region, a maximum voltage region, maximum energy region, or a maximum current region, or any combination thereof. For example, the third EM-coupling distance 476c can vary from about 0.01 mm to about 10 mm, and the third EM-coupling distance 476c can be wavelength-dependent and can vary from about ($\lambda/4$) to about ($10\lambda$).

A third plasma-tuning slab 461c can be coupled to a third control assembly 460c and can be used to move 463c the third plasma-tuning slab 461c third EM-tuning distances 477c relative to the third EM-tuning portion 475c of the third plasma-tuning rod (470c, 475c) within the third EM-energy tuning space 485c. The third control assembly 460c and the third plasma-tuning slab 461c can be used to optimize the microwave energy coupled from the third EM-coupling region 462c to the third EM-tuning portion 475c of the third plasma-tuning rod (470c, 475c). For example, the third EM-tuning distances 477c can be established between the third EM-tuning portion 475c and the third plasma-tuning slab 461c within the third EM-energy tuning space 485c, and the third EM-tuning distances 477c can vary from about 0.01 mm to about 1 mm.

The third plasma-tuning rod (470c, 475c) can have third diameters ($d_{1c}$) associated therewith, and the third diameters ($d_{1c}$) can vary from about 0.01 mm to about 1 mm. The third isolation assembly 464c can have third diameters ($D_{1c}$) associated therewith, and the third diameters ($D_{1c}$) can vary from about 1 mm to about 10 mm.

The third EM-tuning portion 475c, the third EM-coupling region 462c, the third control assembly 460c, and the third plasma-tuning slab 461c can have third x/y plane offsets ($y_{1c}$) associated therewith. For example, the third x/y plane offsets ($y_{1c}$) can be established relative to one or more walls of a first additional cavity 469c, can be wavelength-dependent, and can vary from about ($\lambda/4$) to about ($10\lambda$). The third control assembly 460c can have a cylindrical configuration and third diameters ($d_{1c}$) that can vary from about 1 mm to about 5 mm. The third plasma-tuning slab 461c can have third diameters ($D_{1c}$) associated therewith, and the third diameters ($D_{1c}$) can vary from about 1 mm to about 10 mm.

A second resonator subassembly 481d can be coupled to a second chamber wall 412b at a second x/y plane offset ($y_{3d}$) and can have a second height ($y_{4d}$). For example, the second x/y plane offsets ($y_{3d}$) can be established relative to the lower chamber wall 412, can be wavelength-dependent and can vary from about ($\lambda/4$) to about ($100\lambda$). In addition, the second height ($y_{4d}$) can vary from about ($\lambda/4$) to about ($10\lambda$).

In some embodiments, a second EM source 435d can be coupled to the second resonator subassembly 481d, and the second EM source 435d can operate at frequencies from about 500 MHz to about 5000 MHz. The controller 495 can be coupled to the second resonator subassembly 481d and the second EM source 435d, and the controller 495 can use process recipes to establish, control, and optimize the second resonator subassembly 481d and the second EM source 435d to control the fourth EM-coupling region 462d in the fourth EM-energy tuning space 485d and the plasma uniformity within the process space 415.

A fourth plasma-tuning rod (470d, 475d) can have a fourth plasma-tuning portion 470d that can extend into the fourth isolated protection space 473d established in the fourth protection assembly 472d at a fourth x/y plane location ($y_{2d}$) in the process space 415, and a fourth EM-tuning portion 475d that can extend into the fourth EM-energy tuning space 485d at a fourth x/y plane location ($y_{1c}$). A fourth isolation assembly 464d can be used to position (extend) the fourth plasma-tuning portion 470d fourth plasma-tuning distances 471d within the fourth isolated protection space 473d established in the fourth protection assembly 472d. For example, the fourth plasma-tuning distances 471d can vary from about 10 mm to about 400 mm, and the fourth plasma-tuning distances 471d can be wavelength-dependent and can vary from about ($\lambda/4$) to about ($10\lambda$).

A fourth EM-coupling region 462d can be established at fourth EM-coupling distances 476d from at least one wall in the second resonator subassembly 481d defining the fourth EM-energy tuning space 485d, and the fourth EM-tuning portion 475d can extend into the fourth EM-coupling region 462d. The fourth EM-tuning portion 475d can obtain fourth tunable microwave energy from the fourth EM-coupling region 462d, and the fourth microwave energy can be transferred as fourth plasma-tuning energy to the process space 415 at the fourth x/y plane location ($y_{2d}$) using the fourth plasma-tuning portion 470d. The fourth EM-coupling region 462d can include a tunable E-field region, a tunable H-field region, a maximum field region, a maximum voltage region, maximum energy region, or a maximum current region, or any combination thereof. For example, the fourth EM-coupling distance 476d can vary from about 0.01 mm to about 10 mm, and the fourth EM-coupling distance 476d can be wavelength-dependent and can vary from about ($\lambda/4$) to about ($10\lambda$).

A fourth plasma-tuning slab 461d can be coupled to a fourth control assembly 460d and can be used to move 463d the fourth plasma-tuning slab 461d fourth EM-tuning distances 477d relative to the fourth EM-tuning portion 475d of the fourth plasma-tuning rod (470d, 475d) within the fourth EM-energy tuning space 485d. The fourth control assembly 460d and the fourth plasma-tuning slab 461d can be used to optimize the microwave energy coupled from the fourth EM-coupling region 462d to the fourth EM-tuning portion 475d of the fourth plasma-tuning rod (470d, 475d). For example, the fourth EM-tuning distances 477d can be established between the fourth EM-tuning portion 475d and the fourth plasma-tuning slab 461d within the fourth EM-energy tuning space 485, and the fourth EM-tuning distances 477d can vary from about 0.01 mm to about 1 mm.

The fourth plasma-tuning rod (470d, 475d) can have fourth diameters ($d_{1d}$) associated therewith, and the fourth diameters ($d_{1d}$) can vary from about 0.01 mm to about 1 mm. The fourth isolation assembly 464d can have fourth diameters ($D_{1d}$) associated therewith, and the fourth diameters ($D_{1d}$) can vary from about 1 mm to about 10 mm.

The fourth EM-tuning portion 475d, the fourth EM-coupling region 462d, the fourth control assembly 460d, and the fourth plasma-tuning slab 461d can have fourth x/y plane offsets ($y_{1d}$) associated therewith. For example, the fourth x/y plane offsets ($y_{1d}$) can be established relative to one or more walls of a second additional cavity 469d, can be wavelength-dependent, and can vary from about ($\lambda/4$) to about ($10\lambda$). The fourth control assembly 460d can have a cylindrical configuration and fourth diameters ($d_{1d}$) that can vary from about 1 mm to about 5 mm. The fourth plasma-tuning slab 461d can have fourth diameters ($D_{1d}$) associated therewith, and the fourth diameters ($D_{1d}$) can vary from about 1 mm to about 10 mm.

The control assemblies (460a, 460b, 460c, and 460d) can be coupled 496 to the controller 495, and the controller 495 can use process recipes to establish, control, and optimize the EM-tuning distances (477a, 477b, 477c, and 477d) to control the EM-coupling regions (462a, 462b, 462c, and 462d) in the EM-energy tuning spaces (485, 485c, and 485d) and the plasma uniformity within the process space 415. The controller 495 can be coupled to the microwave source 450, the matching network 452, and the coupling network 454, and the controller 495 can use process recipes to establish, control, and optimize the microwave source 450, the matching network 452, and the coupling network 454 to control the EM-coupling regions (462a, 462b, 462c, and 462d) in the EM-energy tuning spaces (485, 485c, and 485d) and the plasma uniformity within the process space 415. For example, the microwave source 450 can operate at frequencies from about 500 MHz to about 5000 MHz. In addition, the controller 495 can be coupled to the resonator sensors 406 and process sensors 407, and the controller 495 can use process recipes to establish, control, and optimize the data from the resonator sensors 406 and the process sensors 407 to control the EM-coupling regions (462a, 462b, 462c, and 462d) in the EM-energy tuning spaces (485, 485c, and 485d) and the plasma uniformity within the process space 415.

The front view of the fourth microwave resonator system 400 includes an x/y plane view of a cavity-control assembly 455 that is shown coupled to an x/y plane view of a cavity-tuning slab 456. The cavity-control assembly 455 can have a first diameter ($d_{1aa}$) associated therewith, and the first diameter ($d_{1aa}$) can vary from about 0.01 mm to about 1 mm. The cavity-tuning slab 456 can have a second diameter ($D_{1aa}$) associated therewith, and the second diameter ($D_{1aa}$) can vary from about 1 mm to about 10 mm. The cavity-control assembly 455 and the cavity-tuning slab 456 can have a first x/y plane offset ($y_{1aa}$) associated therewith, and the first x/y plane offset ($y_{1aa}$) can vary from about 1 mm to about 10 mm.

The cavity-control assembly 455 can be used to move 457 the cavity-tuning slab 456 cavity-tuning distances 458 within the fourth EM-energy tuning space 485. The controller 495 can be coupled to the cavity-control assembly 455, and the controller 495 can use process recipes to establish, control, and optimize the cavity-tuning distances 458 to control and maintain the plasma uniformity within the process space 415 in real-time. For example, the cavity-tuning distances 458 can vary from about 0.01 mm to about 10 mm, and the cavity-tuning distances 458 can be wavelength-dependent and can vary from about ($\lambda/16$) to about ($10\lambda$).

Still referring to FIG. 4A, a substrate holder 420, and a lower electrode 421 are shown. When present, the lower electrode 421 can be used to couple Radio Frequency (RF) power to plasma in process space 415. For example, lower electrode 421 can be electrically biased at an RF voltage via the transmission of RF power from RF generator 430 through impedance match network 431 and RF sensor 432 to lower electrode 421. The RF bias can serve to heat electrons to form and/or maintain the plasma. A typical frequency for the RF bias can range from 1 MHz to 100 MHz and is preferably 13.56 MHz. Alternatively, RF power may be applied to the lower electrode 421 at multiple frequencies. Furthermore, impedance match network 431 can serve to maximize the transfer of RF power to the plasma in process chamber 410 by minimizing the reflected power. Various match network topologies and automatic control methods can be utilized. The RF sensor 432 can measure the power levels and/or frequencies associated with the fundamental signals, harmonic signals, and/or intermodulation signals. In addition, the controller 495 can be coupled 496 to the RF generator 430, the impedance match network 431, and the RF sensor 432, and the controller 495 can use process recipes to establish, control, and optimize the data to and from the RF generator 430, the impedance match network 431, and the RF sensor 432 to control the EM-coupling regions (462a, 462b, 462c, and 462d) in the EM-energy tuning spaces (485, 485c, and 485d) and the plasma uniformity within the process space 415.

Some of the third microwave resonator systems 400 can include a pressure control system 490 and exhaust port 491 coupled to the process chamber 410, and configured to evacuate the process chamber 410, as well as control the pressure within the process chamber 410. Alternatively, the pressure control system 490 and/or the exhaust port 491 may not be required.

As shown in FIG. 4A, the fourth microwave resonator systems 400 can comprise a first gas supply system 440 coupled to first supply elements 441, and the first supply element 441 can be coupled to the process chamber 410. The first supply elements 441 can be configured to introduce a first process gas to process space 415, and can include flow control and/or flow measuring devices. Alternatively, a second gas supply system and second supply element may be required.

During dry plasma etching, the process gas may comprise an etchant, a passivant, or an inert gas, or a combination of two or more thereof. For example, when plasma etching a dielectric film such as silicon oxide ($SiO_x$) or silicon nitride ($Si_xN_y$), the plasma etch gas composition generally includes a fluorocarbon-based chemistry ($C_xF_y$) such as at least one of $C_4F_8$, $C_5F_8$, $C_3F_6$, $C_4F_6$, $CF_4$, etc., and/or may include a fluorohydrocarbon-based chemistry ($C_xH_yF_z$) such as at least one of $CHF_3$, $CH_2F_2$, etc., and can have at least one of an inert gas, oxygen, CO or $CO_2$. Additionally, for example, when etching polycrystalline silicon (polysilicon), the plasma etch gas composition generally includes a halogen-containing gas such as HBr, $Cl_2$, $NF_3$, or $SF_6$ or a combination of two or more thereof, and may include fluorohydrocarbon-based chemistry ($C_xH_yF_z$) such as at least one of $CHF_3$, $CH_2F_2$, etc., and at least one of an inert gas, oxygen, CO or $CO_2$, or two or more thereof. During plasma-enhanced deposition, the process gas may comprise a film forming precursor, a reduction gas, or an inert gas, or a combination of two or more thereof.

Figure 4B:
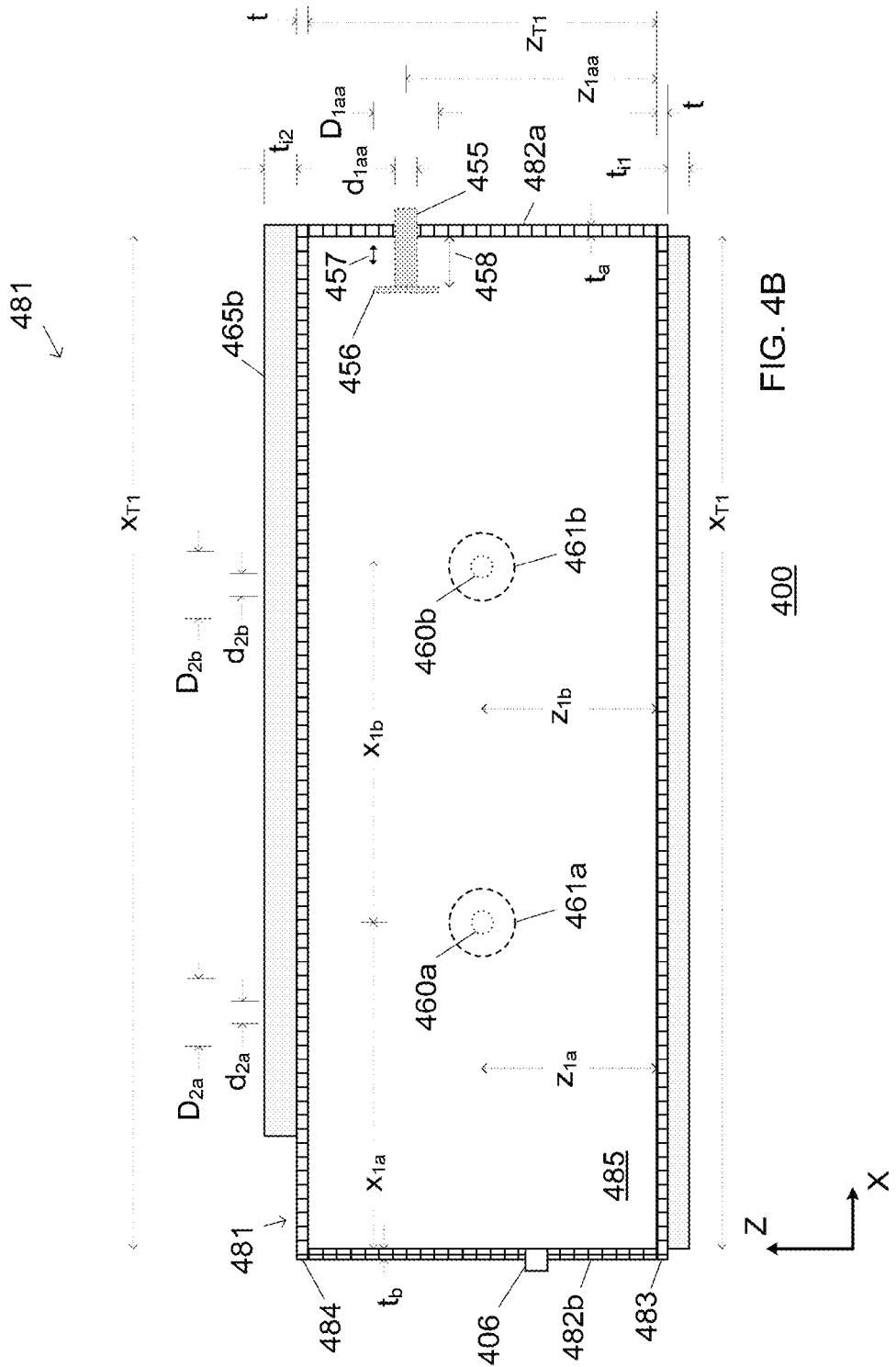

FIG. 4B illustrates a top view of a fourth resonator assembly in accordance with embodiments of the invention. The fourth resonator assembly 481 can have a total length ($x_{T1}$) and a total height ($z_{T1}$) associated therewith in the x/z plane. For example, the total length ($x_{T1}$) can vary from about 10 mm to about 500 mm, and the total height ($z_{T1}$) can vary from about 10 mm to about 1000 mm.

The top view of fourth resonator subsystem 480 includes an x/z plane view of a first control assembly 460a that is shown surrounded by a top (dash line) view of a first plasma-tuning slab 461a. The first control assembly 460a can have a first diameter ($d_{2a}$) associated therewith, and the first diameter ($d_{2a}$) can vary from about 0.01 mm to about 1 mm. The first plasma-tuning slab 461a can have a second diameter ($D_{2a}$) associated therewith, and the second diameter ($D_{2a}$) can vary from about 1 mm to about 10 mm. The first control assembly 460a and the first plasma-tuning slab 461a can have first x/z plane offsets ($x_{1a}$) associated therewith, and the first x/z plane offsets ($x_{1a}$) can vary from about 1 mm to about 10 mm. Alternatively, the first control assembly 460a and the first plasma-tuning slab 461a may have different first x/z plane offsets ($x_{1a}$) associated therewith. The first control assembly 460a and the first plasma-tuning slab 461a can have first x/z plane offsets ($z_{1a}$) associated therewith, and the first x/z plane offsets ($z_{1a}$) can vary from about 1 mm to about 10 mm. Alternatively, the first control assembly 460a and the first plasma-tuning slab 461a may have different first x/z plane offsets ($z_{1a}$) associated therewith.

In addition, the top view of fourth resonator assembly 481 includes an x/z plane view of a second control assembly 460b that is shown surrounded by a top (dash line) view of a second plasma-tuning slab 461b. The second control assembly 460b can have a first diameter ($d_{2b}$) associated therewith, and the first diameter ($d_{2b}$) can vary from about 0.01 mm to about 1 mm. The second plasma-tuning slab 461b can have a second diameter ($D_{2b}$) associated therewith, and the second diameter ($D_{2b}$) can vary from about 1 mm to about 10 mm. The second control assembly 460b and the second plasma-tuning slab 461b can have second x/z plane offsets ($x_{1b}$) associated therewith, and the second x/z plane offsets ($x_{1b}$) can vary from about 1 mm to about 10 mm. Alternatively, the second control assembly 460b and the second plasma-tuning slab 461b may have different second x/z plane offsets ($x_{1b}$) associated therewith. The second control assembly 460b and the second plasma-tuning slab 461b can have second x/z plane offsets ($z_{1b}$) associated therewith, and the second x/z plane offsets ($z_{1b}$) can vary from about 1 mm to about 10 mm. Alternatively, the second control assembly 460b and the second plasma-tuning slab 461b may have different second x/z plane offsets ($z_{1a}$) associated therewith.

FIG. 4B shows top views of resonator walls (482a, 482b, 483, and 484). The resonator wall 482a can have wall thicknesses ($t_a$) associated therewith, and the wall thicknesses ($t_a$) can vary from about 1 mm to about 5 mm. The resonator wall 482b can have wall thicknesses ($t_b$) associated therewith, and the wall thicknesses ($t_b$) can vary from about 1 mm to about 5 mm. The resonator walls (482a and 482b) can have wall thicknesses (t) associated therewith, and the wall thicknesses (t) can vary from about 1 mm to about 5 mm.

The top view of the fourth resonator assembly 481 includes an x/z plane view of a cavity-control assembly 455 and an x/z plane view of a cavity-tuning slab 456. The cavity-control assembly 455 can have a first diameter ($d_{1aa}$) associated therewith, and the first diameter ($d_{1aa}$) can vary from about 0.01 mm to about 1 mm. The cavity-tuning slab 456 can have a second diameter ($D_{1aa}$) associated therewith, and the second diameter ($D_{1aa}$) can vary from about 1 mm to about 10 mm. The cavity-control assembly 455 and the cavity-tuning slab 456 can have a first x/z plane offset ($z_{1aa}$) associated therewith, and the first x/z plane offset ($z_{1aa}$) can vary from about 1 mm to about 10 mm.

Figure 4C:
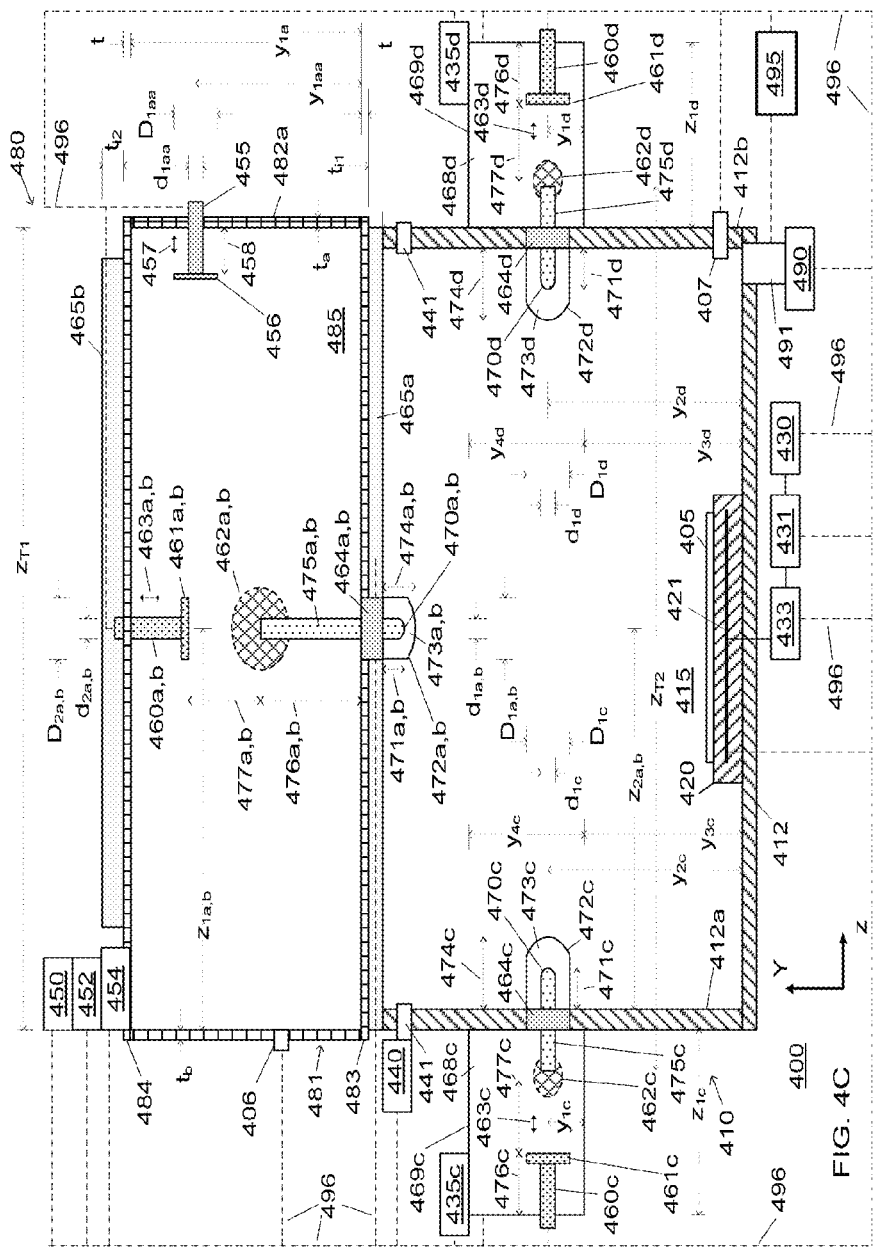

FIG. 4C illustrates a side view of the fourth microwave resonator systems 400. The side view shows a y/z plane view of a process chamber 410 that can be configured using a first interface assembly 465a, a plurality of chamber walls 412 coupled to the first interface assembly 465a, and a process space 415 can be configured within the process chamber 410. For example, the chamber walls 412 can have wall thicknesses (t) associated therewith, and the wall thicknesses (t) can vary from about 1 mm to about 5 mm. The first interface assembly 465a can have a first interface thickness ($t_{i1}$) associated therewith, and the first interface thickness ($t_{i1}$) can vary from about 1 mm to about 10 mm.

The side view shows a y/z plane view of a fourth resonator subsystem 480 that can comprise a fourth resonator assembly 481 that can be configured using a plurality of resonator walls (482a, 482b, 483, and 484). For example, the resonator walls (482a, 482b, 483, and 484) can include dielectric material such as quartz and can define a fourth EM-energy tuning space 485 therein. In addition, one or more resonator sensors 406 can be coupled to the fourth EM-energy tuning space 485 to obtain first resonator data.

The resonator walls 482a can have wall thicknesses ($t_a$) associated therewith, and the wall thicknesses ($t_a$) can vary from about 1 mm to about 5 mm. The resonator walls 482b can have wall thicknesses ($t_b$) associated therewith, and the wall thicknesses ($t_b$) can vary from about 1 mm to about 5 mm. The resonator walls 482 can have wall thicknesses (t) associated therewith, and the wall thicknesses (t) can vary from about 1 mm to about 5 mm.

In some examples, the first interface assembly 465a can be used to removably couple the third resonator assembly 481 to the process chamber 410. The first interface assembly 465a can have first interface thicknesses ($t_{i1}$) associated therewith, and the first interface thicknesses ($t_{i1}$) can vary from about 1 mm to about 10 mm. Alternatively, the first interface assembly 465a may not be required or may be configured differently. A first interface assembly 465a can comprise one or more isolation assemblies (464a and 464b). Each of the isolation assemblies (464a and 464b) can be removably coupled to a lower resonator wall 483 and removably coupled to one or more of the first interface assembly 465a.

In addition, a second interface assembly 465b can be coupled to the third resonator assembly 481 using an upper resonator wall 484. The second interface assembly 465b can have second interface thicknesses ($t_{i2}$) associated therewith, and the second interface thicknesses ($t_{i2}$) can vary from about 1 mm to about 10 mm. Alternatively, the second interface assembly 465b may not be required or may be configured differently. The second interface assembly 465b can comprise one or more control assemblies (460a and 460b). Each of the control assemblies (460a and 460b) can be removably coupled to the upper resonator wall 484 and removably coupled to the second interface assembly 465b.

The fourth microwave resonator system 400 can be configured to form plasma in the process space 415 as the substrate holder 420 and the substrate are moved through the process space 415. The fourth microwave resonator system 400 can be configured to process 200 mm substrates, 300 mm substrates, or larger-sized substrates. In addition, square and/or rectangular chambers can be configured so that the fourth microwave resonator system 400 may be configured to process square or rectangular substrates, wafers, or LCDs regardless of their size, as would be appreciated by those skilled in the art. Therefore, while aspects of the invention will be described in connection with the processing of a semiconductor substrate, the invention is not limited solely thereto.

In other embodiments, the fourth resonator assembly 481 can comprise a plurality of resonant cavities (not shown) therein. In some other embodiments, the fourth resonator system 480 can comprise a plurality of resonator subsystems having one or more resonant cavities therein. In various systems, the fourth resonator assembly 481 and the fourth EM-energy tuning space 485 can have cylindrical shapes, rectangular shapes, or squares shapes.

In FIG. 4C, a microwave source 450 is shown coupled to the fourth resonator assembly 481. The microwave source 450 can be coupled to a matching network 452, and the matching network 452 can be coupled to a coupling network 454. Alternatively, a plurality of matching networks (not shown) or a plurality of coupling networks (not shown) may be coupled to the fourth resonator assembly 481. The coupling network 454 can be removably coupled to an upper resonator wall 484 of the fourth resonator assembly 481 and can be used to provide microwave energy to the fourth EM-energy tuning space 485. Alternatively, other coupling configurations may be used.

The side view includes a y/z plane view of a first set of plasma-tuning rods {(470a, 475a) and (470b, 475b)} that can have a first set of plasma-tuning portions (470a and 470b) that can extend into first set of isolated protection spaces (473a and 473b) established in the first set of protection assemblies (472a and 472b) at first y/z plane locations ($z_{2a-b}$) in the process space 415, and a first set of EM-tuning portions (475a and 475b) that can extend into the fourth EM-energy tuning space 485 at second y/z plane locations ($z_{1a-c}$). A first set of isolation assemblies (464a and 464b) can be used to position (extend) the first set of plasma-tuning portions (470a and 470b) first set of plasma-tuning distances (471a and 471b) within the process space 415 at the first locations defined using ($z_{2a-b}$). For example, the first set of plasma-tuning distances (471a and 471b) can vary from about 10 mm to about 400 mm, and the first set of plasma-tuning distances (471a and 471b) can be wavelength-dependent and can vary from about ($\lambda/4$) to about ($10\lambda$).

A first set of EM-coupling regions (462a and 462b) can be established at the EM-coupling distances (476a and 476b) from the lower resonator wall 483 defining the fourth EM-energy tuning space 485, and the first set of EM-tuning portions (475a and 475b) can extend into the first set of EM-coupling regions (462a and 462b). The first set of EM-tuning portions (475a and 475b) can obtain tunable microwave energies from the first set of EM-coupling regions (462a and 462b), and the tunable microwave energies can be transferred as controllable plasma-tuning energies to the process space 415 at the first y/z plane locations ($z_{2a-c}$) using the first set of plasma-tuning portions (470a and 470b). The first set of EM-coupling regions (462a and 462b) can include a tunable E-field region, a tunable H-field region, a maximum field region, a maximum voltage region, maximum energy region, or a maximum current region, or any combination thereof. For example, the EM-coupling distances (476a and 476b) can vary from about 0.01 mm to about 10 mm, and the EM-coupling distances (476a and 476b) can be wavelength-dependent and can vary from about ($\lambda/4$) to about ($10\lambda$).

A first set of plasma-tuning slabs (461a and 461b) can be coupled to a first set of control assemblies (460a and, 460b) and can be used to move (463a and 463b) the first set of plasma-tuning slabs (461a and 461b) EM-tuning distances (477a and 477b) relative to the first set of EM-tuning portions (475a and 475b) of the first set of plasma-tuning rod {(470a, 475a) and (470b, 475b)} within the fourth EM-energy tuning space 485. The first set of control assemblies (460a and 460b) and the first set of plasma-tuning slabs (461a and 461b) can be used to optimize the microwave energies coupled from the first set of EM-coupling regions (462a and 462b) to the first set of EM-tuning portions (475a and 475b) of the first set of plasma-tuning rod {(470a, 475a), and (470b, 475b)}. For example, the EM-tuning distances (477a and 477b) can be established between the first set of EM-tuning portions (475a and 475b) and the first set of plasma-tuning slabs (461a and 461b) within the fourth EM-energy tuning space 485, and the EM-tuning distances (477a and 477b) can vary from about 0.01 mm to about 1 mm.

A first set of protection assemblies (472a and 472b) can be coupled to the first set of isolation assemblies (464a and 464b), and the first set of protection assemblies (472a and 472b) can be configured at first locations ($z_{2a-b}$) within the process space 415. The set of protection assemblies (472a and 472b) can have first sets of isolated protection spaces (473a and 473b) therein and can have insertion lengths (474a and 474b) associated therewith. For example, the insertion lengths (474a and 474b) can vary from about 1 mm to about 10 mm in the y/z plane. In addition, the protection assemblies (472a and 472b) and the isolation assemblies (464a and 464b) can be constructed using one or more dielectric materials.

The first set of plasma-tuning rod {(470a, 475a) and (470b, 475b)} can comprise dielectric material and can have first diameter ($d_{1a}$) associated therewith, and the first diameters ($d_{1a}$) can vary from about 0.01 mm to about 1 mm. The first set of isolation assemblies (464a and 464b) and the first set of protection assemblies (472a and 472b) can have first diameters ($D_{1a}$) associated therewith, and the first diameters ($D_{1a}$) can vary from about 1 mm to about 10 mm. Alternatively, the isolation assemblies (464a and 464b) and the first set of protection assemblies (472a and 472b) can have different diameters associated therewith.

The first set of EM-tuning portions (475a and 475b), the first set of EM-coupling regions (462a and 462b), the first set of control assemblies (460a and 460b), and the first set of plasma-tuning slabs (461a and 461b) can have y/z plane offsets ($z_{1a-b}$) associated therewith. For example, the y/z plane offsets ($z_{1a-b}$) can be established relative to the lower resonator wall 483 and can be wavelength-dependent and can vary from about ($\lambda/4$) to about ($10\lambda$). The first set of control assemblies (460a and 460b) can comprise dielectric material, can have cylindrical configurations and diameter ($d_{2a-c}$) that can vary from about 1 mm to about 5 mm. The first set of plasma-tuning slabs (461a and 461b) can comprise dielectric material, can have diameters ($D_{2a-b}$) associated therewith, and the diameters ($D_{2a-b}$) can vary from about 1 mm to about 10 mm.

A first resonator subassembly 481c can be coupled to a first chamber wall 412a at a first y/z plane offset ($y_{3c}$) and can have a first height ($y_{4c}$). For example, the first x/y plane offsets ($y_{3c}$) can be established relative to the lower chamber wall 412 and can be wavelength-dependent and can vary from about ($\lambda/4$) to about ($100\lambda$). In addition, the first height ($y_{4c}$) can vary from about ($\lambda/4$) to about ($10\lambda$).

In some embodiments, a first EM source 435c can be coupled to the first resonator subassembly 481c, and the first EM source 435c can operate at frequencies from about 500 MHz to about 5000 MHz. The controller 495 can be coupled to the first resonator subassembly 481c and the first EM source 435c, and the controller 495 can use process recipes to establish, control, and optimize the first resonator subassembly 481c and the first EM source 435c to control the EM-coupling regions (462a, 462b, 462c, and 462d) in the EM-energy tuning spaces (485, 485c, and 485d) and the plasma uniformity within the process space 415.

A third plasma-tuning rod (470c, 475c) can have a third plasma-tuning portion 470c that can extend into the third isolated protection space 473c established in the third protection assembly 472c at a third x/y plane location ($y_{2c}$) in the process space 415, and a third EM-tuning portion 475c that can extend into the third EM-energy tuning space 485c at a third x/y plane location ($y_{1c}$). A third isolation assembly 464c can be used to position (extend) the third plasma-tuning portion 470c third plasma-tuning distances 471c within the third isolated protection space 473c established in the third protection assembly 472c. For example, the third plasma-tuning distances 471c can vary from about 10 mm to about 400 mm, and the third plasma-tuning distances 471c can be wavelength-dependent and can vary from about ($\lambda/4$) to about ($10\lambda$).

A third EM-coupling region 462c can be established at third EM-coupling distances 476c from at least one wall in the first resonator subassembly 481c defining the third EM-energy tuning space 485c, and the third EM-tuning portion 475c can extend into the third EM-coupling region 462c. The third EM-tuning portion 475c can obtain third tunable microwave energy from the third EM-coupling region 462c, and the third microwave energy can be transferred as third plasma-tuning energy to the process space 415 at the third x/y plane location ($y_{2c}$) using the third plasma-tuning portion 470c. The third EM-coupling region 462c can include a tunable E-field region, a tunable H-field region, a maximum field region, a maximum voltage region, maximum energy region, or a maximum current region, or any combination thereof. For example, the third EM-coupling distance 476c can vary from about 0.01 mm to about 10 mm, and the third EM-coupling distance 476c can be wavelength-dependent and can vary from about ($\lambda/4$) to about ($10\lambda$).

A third plasma-tuning slab 461c can be coupled to a third control assembly 460c and can be used to move 463c the third plasma-tuning slab 461c third EM-tuning distances 477c relative to the third EM-tuning portion 475c of the third plasma-tuning rod (470c, 475c) within the third EM-energy tuning space 485c. The third control assembly 460c and the third plasma-tuning slab 461c can be used to optimize the microwave energy coupled from the third EM-coupling region 462c to the third EM-tuning portion 475c of the third plasma-tuning rod (470c, 475c). For example, the third EM-tuning distances 477c can be established between the third EM-tuning portion 475c and the third plasma-tuning slab 461c within the third EM-energy tuning space 485c, and the third EM-tuning distances 477c can vary from about 0.01 mm to about 1 mm.

The third plasma-tuning rod (470c, 475c) can have third diameters ($d_{1c}$) associated therewith, and the third diameters ($d_{1c}$) can vary from about 0.01 mm to about 1 mm. The third isolation assembly 464c can have third diameters ($D_{1c}$) associated therewith, and the third diameters ($D_{1c}$) can vary from about 1 mm to about 10 mm.

The third EM-tuning portion 475c, the third EM-coupling region 462c, the third control assembly 460c, and the third plasma-tuning slab 461c can have third x/y plane offsets ($y_{1c}$) associated therewith. For example, the third x/y plane offsets ($y_{1c}$) can be established relative to one or more walls of a first additional cavity 469c, can be wavelength-dependent, and can vary from about ($\lambda/4$) to about ($10\lambda$). The third control assembly 460c can have a cylindrical configuration and third diameters ($d_{1c}$) that can vary from about 1 mm to about 5 mm. The third plasma-tuning slab 461c can have third diameters ($D_{1c}$) associated therewith, and the third diameters ($D_{1c}$) can vary from about 1 mm to about 10 mm.

A second resonator subassembly 481d can be coupled to a second chamber wall 412b at a second x/y plane offset ($y_{3d}$) and can have a second height ($y_{4d}$). For example, the second x/y plane offsets ($y_{3d}$) can be established relative to the lower chamber wall 412, can be wavelength-dependent and can vary from about ($\lambda/4$) to about ($100\lambda$). In addition, the second height ($y_{4d}$) can vary from about ($\lambda/4$) to about ($10\lambda$).

In some embodiments, a second EM source 435d can be coupled to the second resonator subassembly 481d, and the second EM source 435d can operate at frequencies from about 500 MHz to about 5000 MHz. The controller 495 can be coupled to the second resonator subassembly 481d and the second EM source 435d, and the controller 495 can use process recipes to establish, control, and optimize the second resonator subassembly 481d and the second EM source 435d to control the EM-coupling regions (462a, 462b, 462c, and 462d) in the EM-energy tuning spaces (485, 485c, and 485d) and the plasma uniformity within the process space 415.

A fourth plasma-tuning rod (470d, 475d) can have a fourth plasma-tuning portion 470d that can extend into the fourth isolated protection space 473d established in the fourth protection assembly 472d at a fourth x/y plane location ($y_{2d}$) in the process space 415, and a fourth EM-tuning portion 475d that can extend into the fourth EM-energy tuning space 485d at a fourth x/y plane location ($y_{1c}$). A fourth isolation assembly 464d can be used to position (extend) the fourth plasma-tuning portion 470d fourth plasma-tuning distances 471d within the fourth isolated protection space 473d established in the fourth protection assembly 472d. For example, the fourth plasma-tuning distances 471d can vary from about 10 mm to about 400 mm, and the fourth plasma-tuning distances 471d can be wavelength-dependent and can vary from about ($\lambda/4$) to about ($10\lambda$).

A fourth EM-coupling region 462d can be established at fourth EM-coupling distances 476d from at least one wall in the second resonator subassembly 481d defining the fourth EM-energy tuning space 485d, and the fourth EM-tuning portion 475d can extend into the fourth EM-coupling region 462d. The fourth EM-tuning portion 475d can obtain fourth tunable microwave energy from the fourth EM-coupling region 462d, and the fourth microwave energy can be transferred as fourth plasma-tuning energy to the process space 415 at the fourth x/y plane location ($y_{2d}$) using the fourth plasma-tuning portion 470d. The fourth EM-coupling region 462d can include a tunable E-field region, a tunable H-field region, a maximum field region, a maximum voltage region, maximum energy region, or a maximum current region, or any combination thereof. For example, the fourth EM-coupling distance 476d can vary from about 0.01 mm to about 10 mm, and the fourth EM-coupling distance 476d can be wavelength-dependent and can vary from about ($\lambda/4$) to about ($10\lambda$).

A fourth plasma-tuning slab 461d can be coupled to a fourth control assembly 460d and can be used to move 463d the fourth plasma-tuning slab 461d fourth EM-tuning distances 477d relative to the fourth EM-tuning portion 475d of the fourth plasma-tuning rod (470d, 475d) within the fourth EM-energy tuning space 485d. The fourth control assembly 460d and the fourth plasma-tuning slab 461d can be used to optimize the microwave energy coupled from the fourth EM-coupling region 462d to the fourth EM-tuning portion 475d of the fourth plasma-tuning rod (470d, 475d). For example, the fourth EM-tuning distances 477d can be established between the fourth EM-tuning portion 475d and the fourth plasma-tuning slab 461d within the fourth EM-energy tuning space 485, and the fourth EM-tuning distances 477d can vary from about 0.01 mm to about 1 mm.

The fourth plasma-tuning rod (470d, 475d) can have fourth diameters ($d_{1d}$) associated therewith, and the fourth diameters ($d_{1d}$) can vary from about 0.01 mm to about 1 mm. The fourth isolation assembly 464d can have fourth diameters ($D_{1d}$) associated therewith, and the fourth diameters ($D_{1d}$) can vary from about 1 mm to about 10 mm.

The fourth EM-tuning portion 475d, the fourth EM-coupling region 462d, the fourth control assembly 460d, and the fourth plasma-tuning slab 461d can have fourth x/y plane offsets ($y_{1d}$) associated therewith. For example, the fourth x/y plane offsets ($y_{1d}$) can be established relative to one or more walls of a second additional cavity 469d, can be wavelength-dependent, and can vary from about ($\lambda/4$) to about ($10\lambda$). The fourth control assembly 460d can have a cylindrical configuration and fourth diameters ($d_{1d}$) that can vary from about 1 mm to about 5 mm. The fourth plasma-tuning slab 461d can have fourth diameters ($D_{1d}$) associated therewith, and the fourth diameters ($D_{1d}$) can vary from about 1 mm to about 10 mm.

As shown in FIG. 4C, the control assemblies (460a and 460b) can be coupled 496 to the controller 495, and the controller 495 can use process recipes to establish, control, and optimize the EM-tuning distances (477a and 477b) to control the EM-coupling regions (462a, 462b, 462c, and 462d) in the EM-energy tuning spaces (485, 485c, and 485d) and the plasma uniformity within the process space 415. The controller 495 can be coupled to the microwave source 450, the matching network 452, and the coupling network 454, and the controller 495 can use process recipes to establish, control, and optimize the microwave source 450, the matching network 452, and the coupling network 454 to control the EM-coupling regions (462a, 462b, 462c, and 462d) in the EM-energy tuning spaces (485, 485c, and 485d) and the plasma uniformity within the process space 415. For example, the microwave source 450 can operate at frequencies from about 500 MHz to about 5000 MHz. In addition, the controller 495 can be coupled to the resonator sensors 406 and process sensors 407, and the controller 495 can use process recipes to establish, control, and optimize the data from the resonator sensors 406 and the process sensors 407 to control the EM-coupling regions (462a, 462b, 462c, and 462d) in the EM-energy tuning spaces (485, 485c, and 485d) and the plasma uniformity within the process space 415.

The side view of the fourth microwave resonator system 400 includes a y/z plane view of a cavity-control assembly 455 that is shown coupled to a y/z plane view of a cavity-tuning slab 456. The cavity-control assembly 455 can have a first diameter ($d_{1aa}$) associated therewith, and the first diameter ($d_{1aa}$) can vary from about 0.01 mm to about 1 mm. The cavity-tuning slab 456 can have a second diameter ($D_{1aa}$) associated therewith, and the second diameter ($D_{1aa}$) can vary from about 1 mm to about 10 mm. The cavity-control assembly 455 and the cavity-tuning slab 456 can have first y/z plane offsets ($y_{1aa}$) associated therewith, and the first y/z plane offsets ($y_{1aa}$) can vary from about 1 mm to about 10 mm.

Still referring to FIG. 4C, side views of the substrate holder 420 and the lower electrode 421 are shown. When present, the lower electrode 421 can be used to couple Radio Frequency (RF) power to plasma in process space 415. For example, lower electrode 421 can be electrically biased at an RF voltage via the transmission of RF power from RF generator 430 through impedance match network 431 and RF sensor 432 to lower electrode 421. The RF bias can serve to heat electrons to form and/or maintain the plasma. A typical frequency for the RF bias can range from 1 MHz to 100 MHz and is preferably 13.56 MHz. Alternatively, RF power may be applied to the lower electrode 421 at multiple frequencies. Furthermore, impedance match network 431 can serve to maximize the transfer of RF power to the plasma in process chamber 410 by minimizing the reflected power. Various match network topologies and automatic control methods can be utilized. The RF sensor 432 can measure the power levels and/or frequencies associated with the fundamental signals, harmonic signals, and/or intermodulation signals. In addition, the controller 495 can be coupled 496 to the RF generator 430, the impedance match network 431, and the RF sensor 432, and the controller 495 can use process recipes to establish, control, and optimize the data to and from the RF generator 430, the impedance match network 431, and the RF sensor 432 to control the EM-coupling regions (462a, 462b, 462c, and 462d) in the EM-energy tuning spaces (485, 485c, and 485d) and the plasma uniformity within the process space 415.

The side view of the fourth microwave resonator system 400 can include a y/z plane view of a pressure control system 490 and exhaust port 491 coupled to the process chamber 410, and configured to evacuate the process chamber 410, as well as control the pressure within the process chamber 410. Alternatively, the pressure control system 490 and/or the exhaust port 491 may not be required.

As shown in FIG. 4C, the side view can include y/z plane views of the gas supply system 440, the supply elements 441, and the process chamber 410. The supply elements 441 can be configured around the process space 415, and can be configured to introduce process gas to process space 415.

During dry plasma etching, the process gas may comprise an etchant, a passivant, or an inert gas, or a combination of two or more thereof. For example, when plasma etching a dielectric film such as silicon oxide ($SiO_x$) or silicon nitride ($Si_xN_y$), the plasma etch gas composition generally includes a fluorocarbon-based chemistry ($C_xF_y$) such as at least one of $C_4F_8$, $C_5F_8$, $C_3F_6$, $C_4F_6$, $CF_4$, etc., and/or may include a fluorohydrocarbon-based chemistry ($C_xH_yF_z$) such as at least one of $CHF_3$, $CH_2F_2$, etc., and can have at least one of an inert gas, oxygen, CO or $CO_2$. Additionally, for example, when etching polycrystalline silicon (polysilicon), the plasma etch gas composition generally includes a halogen-containing gas such as HBr, $Cl_2$, $NF_3$, or $SF_6$ or a combination of two or more thereof, and may include fluorohydrocarbon-based chemistry ($C_xH_yF_z$) such as at least one of $CHF_3$, $CH_2F_2$, etc., and at least one of an inert gas, oxygen, CO or $CO_2$, or two or more thereof. During plasma-enhanced deposition, the process gas may comprise a film forming precursor, a reduction gas, or an inert gas, or a combination of two or more thereof.

Figure 5A:
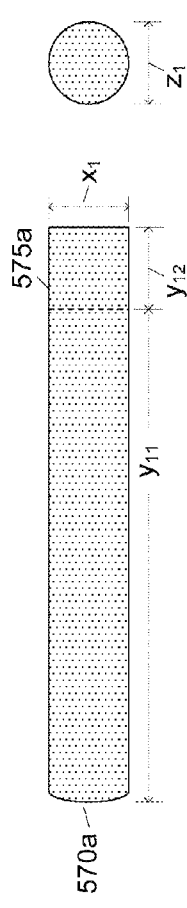
FIGS. 5A-5D show different views of exemplary plasma-tuning rods in accordance with embodiments of the invention.

FIGS. 5A-5D show different views of exemplary plasma-tuning rods in accordance with embodiments of the invention. FIG. 5A shows a front view and a side view of a first exemplary plasma-tuning rod (570a, 575a). The first plasma-tuning portion 570a can have first lengths ($y_{11}$) associated therewith, and the first lengths ($y_{11}$) can vary from about 1 mm to about 400 mm. The first EM-tuning portion 575a can have lengths ($y_{12}$) associated therewith, and the lengths ($y_{12}$) can vary from about 1 mm to about 400 mm. The first plasma-tuning portion 570a and the first EM-tuning portion 575a can have first heights ($x_1$) associated therewith, and the first heights ($x_1$) can vary from about 0.1 mm to about 10 mm. The first plasma-tuning portion 570a and the first EM-tuning portion 575a can have first widths ($z_1$) associated therewith, and the first widths ($z_1$) can vary from about 0.1 mm to about 10 mm. For example, the first plasma-tuning rod (570a and 575a) can comprise dielectric material, can be circular, and have a solid cross-section.

Figure 5B:
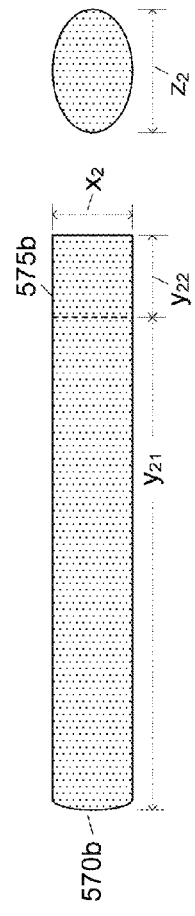

FIG. 5B shows a front view and a side view of a second exemplary plasma-tuning rod (570b, 575b). The second plasma-tuning portion 570b can have first lengths ($y_{21}$) associated therewith, and the first lengths ($y_{21}$) can vary from about 1 mm to about 400 mm. The second EM-tuning portion 575b can have lengths ($y_{22}$) associated therewith, and the lengths ($y_{22}$) can vary from about 1 mm to about 400 mm. The second plasma-tuning portion 570b and the second EM-tuning portion 575b can have second heights ($x_2$) associated therewith, and the second heights ($x_2$) can vary from about 0.1 mm to about 10 mm. The second plasma-tuning portion 570b and the second EM-tuning portion 575b can have second widths ($z_2$) associated therewith, and the second widths ($z_2$) can vary from about 0.1 mm to about 10 mm. For example, the second plasma-tuning rod (570b and 575b) can comprise dielectric material, can be oval, and have a solid cross-section.

Figure 5C:
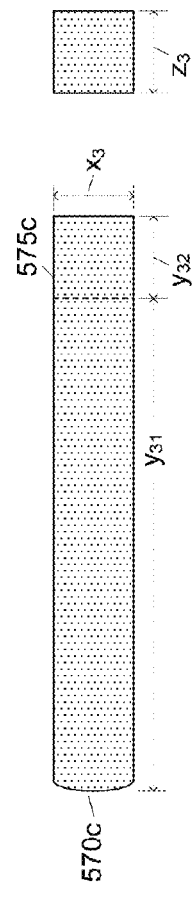

FIG. 5C shows a front view and a side view of a third exemplary plasma-tuning rod (570c, 575c). The third plasma-tuning portion 570c can have third lengths ($y_{31}$) associated therewith, and the third lengths ($y_{31}$) can vary from about 1 mm to about 400 mm. The third EM-tuning portion 575c can have a length ($y_{32}$) associated therewith, and the length ($y_{32}$) can vary from about 1 mm to about 400 mm. The third plasma-tuning portion 570c and the third EM-tuning portion 575c can have third heights ($x_3$) associated therewith, and the third heights ($x_3$) can vary from about 0.1 mm to about 10 mm. The third plasma-tuning portion 570c and the third EM-tuning portion 575c can have third widths ($z_3$) associated therewith, and the third widths ($z_3$) can vary from about 0.1 mm to about 10 mm. For example, the third plasma-tuning rod (570c and 575c) can comprise dielectric material, can be square, and have a solid cross-section.

Figure 5D:
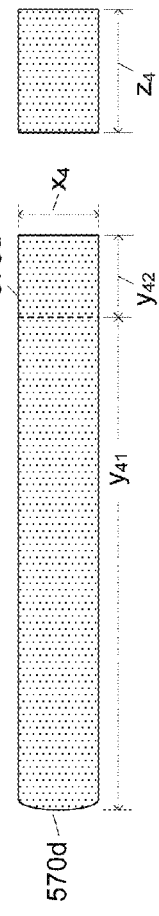

FIG. 5D shows a front view and a side view of a fourth exemplary plasma-tuning rod (570d, 575d). The fourth plasma-tuning portion 570d can have fourth lengths ($y_{41}$) associated therewith, and the fourth lengths ($y_{41}$) can vary from about 1 mm to about 400 mm. The fourth EM-tuning portion 575d can have a length ($y_{42}$) associated therewith, and the length ($y_{42}$) can vary from about 1 mm to about 400 mm. The fourth plasma-tuning portion 570d and the fourth EM-tuning portion 575d can have fourth heights ($x_4$) associated therewith, and the fourth heights ($x_4$) can vary from about 0.1 mm to about 10 mm. The fourth plasma-tuning portion 570d and the fourth EM-tuning portion 575d can have fourth widths ($z_4$) associated therewith, and the fourth widths ($z_4$) can vary from about 0.1 mm to about 10 mm. For example, the fourth plasma-tuning rod (570d and 575d) can comprise dielectric material, can be rectangular, and have a solid cross-section.

FIGS. 6A-6D show different views of exemplary plasma-tuning rods in accordance with embodiments of the invention. FIG. 6A shows a front view and a side view of a first exemplary plasma-tuning rod (670a, 675a). The first plasma-tuning portion 670a can have first lengths ($y_{11}$) associated therewith, and the first lengths ($y_{11}$) can vary from about 1 mm to about 400 mm. The first EM-tuning portion 675a can have lengths ($y_{12}$) associated therewith, and the lengths ($y_{12}$) can vary from about 1 mm to about 400 mm. The first plasma-tuning portion 670a and the first EM-tuning portion 675a can have first heights ($x_1$) associated therewith, and the first heights ($x_1$) can vary from about 0.1 mm to about 10 mm. The first plasma-tuning portion 670a and the first EM-tuning portion 675a can have first widths ($z_1$) associated therewith, and the first widths ($z_1$) can vary from about 0.1 mm to about 10 mm. The first plasma-tuning portion 670a and the first EM-tuning portion 675a can have first thicknesses ($t_{z1}$) associated therewith, and the first thicknesses ($t_{z1}$) can vary from about 0.01 mm to about 1 mm. For example, the first plasma-tuning rod (670a and 675a) can comprise dielectric material, can be circular, and can have a hollow or partially hollow cross-section.

FIG. 6B shows a front view and a side view of a second exemplary plasma-tuning rod (670b, 675b). The second plasma-tuning portion 670b can have first lengths ($y_{21}$) associated therewith, and the first lengths ($y_{21}$) can vary from about 1 mm to about 400 mm. The second EM-tuning portion 675b can have lengths ($y_{22}$) associated therewith, and the lengths ($y_{22}$) can vary from about 1 mm to about 400 mm. The second plasma-tuning portion 670b and the second EM-tuning portion 675b can have second heights ($x_2$) associated therewith, and the second heights ($x_2$) can vary from about 0.1 mm to about 10 mm. The second plasma-tuning portion 670b and the second EM-tuning portion 675b can have second widths ($z_2$) associated therewith, and the second widths ($z_2$) can vary from about 0.1 mm to about 10 mm. The second plasma-tuning portion 670b and the second EM-tuning portion 675b can have second thicknesses ($t_{z2}$) associated therewith, and the second thicknesses ($t_{z2}$) can vary from about 0.01 mm to about 1 mm. For example, the second plasma-tuning rod (670b and 675b) can comprise dielectric material, can be oval, and can have a hollow or partially hollow cross-section.

FIG. 6C shows a front view and a side view of a third exemplary plasma-tuning rod (670c, 675c). The third plasma-tuning portion 670c can have third lengths ($y_{31}$) associated therewith, and the third lengths ($y_{31}$) can vary from about 1 mm to about 400 mm. The third EM-tuning portion 675c can have a length ($y_{32}$) associated therewith, and the length ($y_{32}$) can vary from about 1 mm to about 400 mm. The third plasma-tuning portion 670c and the third EM-tuning portion 675c can have third heights ($x_3$) associated therewith, and the third heights ($x_3$) can vary from about 0.1 mm to about 10 mm. The third plasma-tuning portion 670c and the third EM-tuning portion 675c can have third widths ($z_3$) associated therewith, and the third widths ($z_3$) can vary from about 0.1 mm to about 10 mm. The third plasma-tuning portion 670c and the third EM-tuning portion 675c can have third thicknesses ($t_{z3}$ and $t_{x3}$) associated therewith, and the third thicknesses ($t_{z3}$ and $t_{x3}$) can vary from about 0.01 mm to about 1 mm. For example, the third plasma-tuning rod (670c and 675c) can comprise dielectric material, can be square, and can have a hollow or partially hollow cross-section.

FIG. 6D shows a front view and a side view of a fourth exemplary plasma-tuning rod (670d, 675d). The fourth plasma-tuning portion 670d can have fourth lengths ($y_{41}$) associated therewith, and the fourth lengths ($y_{41}$) can vary from about 1 mm to about 400 mm. The fourth EM-tuning portion 675d can have a length ($y_{42}$) associated therewith, and the length ($y_{42}$) can vary from about 1 mm to about 400 mm. The fourth plasma-tuning portion 670d and the fourth EM-tuning portion 675d can have fourth heights ($x_4$) associated therewith, and the fourth heights ($x_4$) can vary from about 0.1 mm to about 10 mm. The fourth plasma-tuning portion 670d and the fourth EM-tuning portion 675d can have fourth widths ($z_4$) associated therewith, and the fourth widths ($z_4$) can vary from about 0.1 mm to about 10 mm. The fourth plasma-tuning portion 670d and the fourth EM-tuning portion 675d can have fourth thicknesses ($t_{z4}$ and $t_{x4}$) associated therewith, and the fourth thicknesses ($t_{z4}$ and $t_{x4}$) can vary from about 0.01 mm to about 1 mm. For example, the fourth plasma-tuning rod (670d and 675d) can comprise dielectric material, can be rectangular, and can have a hollow or partially hollow cross-section.

Figure 7A:
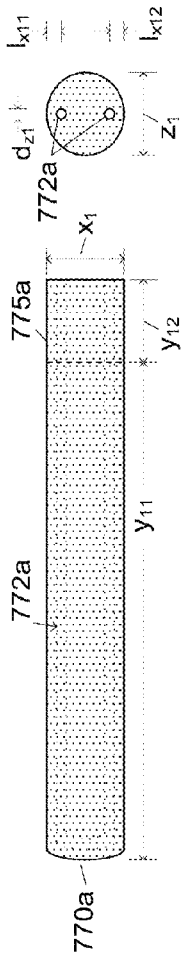
FIGS. 7A-7D show different views of exemplary plasma-tuning rods in accordance with embodiments of the invention.

FIGS. 7A-7D show different views of exemplary plasma-tuning rods in accordance with embodiments of the invention. FIG. 7A shows a front view and a side view of a first exemplary plasma-tuning rod (770a, 775a). The first plasma-tuning portion 770a can have first lengths ($y_{11}$) associated therewith, and the first lengths ($y_{11}$) can vary from about 1 mm to about 400 mm. The first EM-tuning portion 775a can have lengths ($y_{12}$) associated therewith, and the lengths ($y_{12}$) can vary from about 1 mm to about 400 mm. The first plasma-tuning portion 770a and the first EM-tuning portion 775a can have first heights ($x_1$) associated therewith, and the first heights ($x_1$) can vary from about 0.1 mm to about 10 mm. The first plasma-tuning portion 770a and the first EM-tuning portion 775a can have first widths ($z_1$) associated therewith, and the first widths ($z_1$) can vary from about 0.1 mm to about 10 mm. A first temperature control loop 772a can be configured within the first exemplary plasma-tuning rod (770a, 775a). For example, a temperature control fluid and/or gas can flow through the first temperature control loop 772a to control the temperature of the first exemplary plasma-tuning rod (770a, 775a). The first temperature control loop 772a can have first diameters ($d_{z1}$) associated therewith, and the first diameters ($d_{z1}$) can vary from about 0.001 mm to about 0.001 mm. In addition, the first temperature control loop 772a have first offsets ($l_{x11}$ and $l_{x12}$) associated therewith, and the first offsets ($l_{x11}$ and $l_{x12}$) can vary from about 0.01 mm to about 0.1 mm. For example, the first plasma-tuning rod (770a and 775a) can comprise dielectric material, can be circular, and can have a hollow or partially hollow cross-section to accommodate different configurations and/or shapes for the first temperature control loop 772a.

Figure 7B:
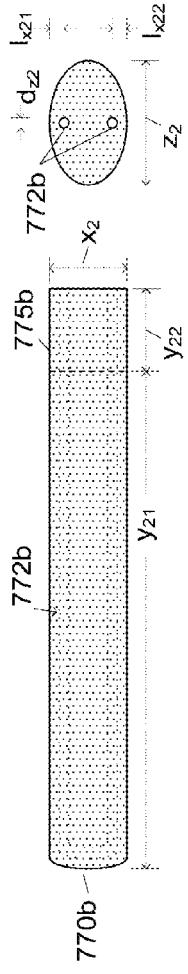
Figure 7C:
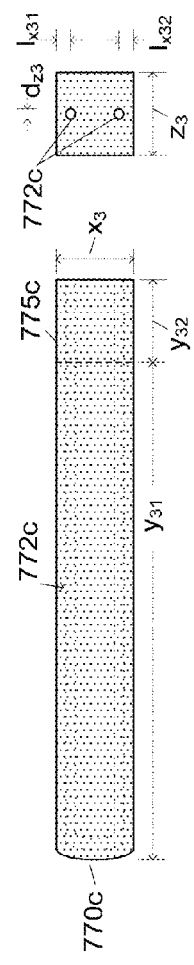

FIG. 7B shows a front view and a side view of a second exemplary plasma-tuning rod (770b, 775b). The second plasma-tuning portion 770b can have first lengths ($y_{21}$) associated therewith, and the first lengths ($y_{21}$) can vary from about 1 mm to about 400 mm. The second EM-tuning portion 775b can have lengths ($y_{22}$) associated therewith, and the lengths ($y_{22}$) can vary from about 1 mm to about 400 mm. The second plasma-tuning portion 770b and the second EM-tuning portion 775b can have second heights ($x_2$) associated therewith, and the second heights ($x_2$) can vary from about 0.1 mm to about 10 mm. The second plasma-tuning portion 770b and the second EM-tuning portion 775b can have second widths ($z_2$) associated therewith, and the second widths ($z_2$) can vary from about 0.1 mm to about 10 mm. A second temperature control loop 772b can be configured within the second exemplary plasma-tuning rod (770b, 775b). For example, a temperature control fluid and/or gas can flow through the second temperature control loop 772b to control the temperature of the second exemplary plasma-tuning rod (770b, 775b). The second temperature control loop 772b can have second diameters ($d_{z2}$) associated therewith, and the second diameters ($d_{z2}$) can vary from about 0.001 mm to about 0.001 mm. In addition, the second temperature control loop 772b have second offsets ($l_{x21}$ and $l_{x22}$) associated therewith, and the second offsets ($l_{x21}$ and $l_{x22}$) can vary from about 0.01 mm to about 0.1 mm. For example, the second plasma-tuning rod (770b and 775b) can comprise dielectric material, can be oval, and can have a hollow or partially hollow cross-section to accommodate different configurations and/or shapes for the second temperature control loop 772b. FIG. 7C shows a front view and a side view of a third exemplary plasma-tuning rod (770c, 775c). The third plasma-tuning portion 770c can have third lengths ($y_{31}$) associated therewith, and the third lengths ($y_{31}$) can vary from about 1 mm to about 400 mm. The third EM-tuning portion 775c can have a length ($y_{32}$) associated therewith, and the length ($y_{32}$) can vary from about 1 mm to about 400 mm. The third plasma-tuning portion 770c and the third EM-tuning portion 775c can have third heights ($x_3$) associated therewith, and the third heights ($x_3$) can vary from about 0.1 mm to about 10 mm. The third plasma-tuning portion 770c and the third EM-tuning portion 775c can have third widths ($z_3$) associated therewith, and the third widths ($z_3$) can vary from about 0.1 mm to about 10 mm. A third temperature control loop 772c can be configured within the third exemplary plasma-tuning rod (770c, 775c). For example, a temperature control fluid and/or gas can flow through the third temperature control loop 772c to control the temperature of the third exemplary plasma-tuning rod (770c, 775c). The third temperature control loop 772c can have third diameters ($d_{z3}$) associated therewith, and the third diameters ($d_{z3}$) can vary from about 0.001 mm to about 0.001 mm. In addition, the third temperature control loop 772c have third offsets ($l_{x31}$ and $l_{x32}$) associated therewith, and the third offsets ($l_{x31}$ and $l_{x32}$) can vary from about 0.01 mm to about 0.1 mm. For example, the third plasma-tuning rod (770c and 775c) can comprise dielectric material, can be square, and can have a hollow or partially hollow cross-section to accommodate different configurations and/or shapes for the third temperature control loop 772c.

Figure 7D:
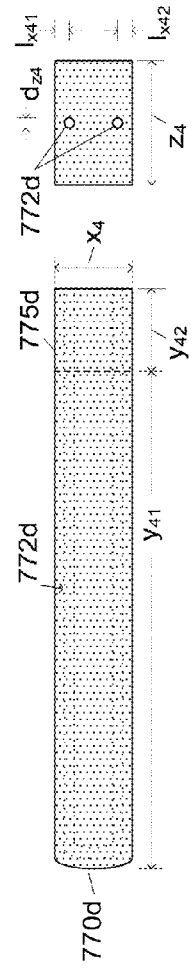

FIG. 7D shows a front view and a side view of a fourth exemplary plasma-tuning rod (770d, 775d). The fourth plasma-tuning portion 770d can have fourth lengths ($y_{41}$) associated therewith, and the fourth lengths ($y_{41}$) can vary from about 1 mm to about 400 mm. The fourth EM-tuning portion 775d can have a length ($y_{42}$) associated therewith, and the length ($y_{42}$) can vary from about 1 mm to about 400 mm. The fourth plasma-tuning portion 770d and the fourth EM-tuning portion 775d can have fourth heights ($x_4$) associated therewith, and the fourth heights ($x_4$) can vary from about 0.1 mm to about 10 mm. The fourth plasma-tuning portion 770d and the fourth EM-tuning portion 775d can have fourth widths ($z_4$) associated therewith, and the fourth widths ($z_4$) can vary from about 0.1 mm to about 10 mm. A fourth temperature control loop 772d can be configured within the fourth exemplary plasma-tuning rod (770d, 775d). For example, a temperature control fluid and/or gas can flow through the fourth temperature control loop 772d to control the temperature of the fourth exemplary plasma-tuning rod (770d, 775d). The fourth temperature control loop 772d can have fourth diameters ($d_{z4}$) associated therewith, and the fourth diameters ($d_{z4}$) can vary from about 0.001 mm to about 0.001 mm. In addition, the fourth temperature control loop 772d have fourth offsets ($l_{x41}$ and $l_{x42}$) associated therewith, and the fourth offsets ($l_{x41}$ and $l_{x42}$) can vary from about 0.01 mm to about 0.1 mm. For example, the fourth plasma-tuning rod (770d and 775d) can comprise dielectric material, can be rectangular, and can have a hollow or partially hollow cross-section to accommodate different configurations and/or shapes for the fourth temperature control loop 772d.

FIG. 8 illustrates a flow diagram for an exemplary operating procedure in accordance with embodiments of the invention. A multi-step procedure 800 is shown in FIG. 8. Alternatively, a different multi-step procedure may be used.

In 810, a substrate (105-405) can be positioned on a movable substrate holder (120-420) in a process chamber (110-410), and a resonator assembly (181-481) can be coupled to the process chamber (110-410). In some embodiments, the resonator assembly (181-481) with the EM-energy tuning spaces (185-485) therein can be coupled to the process chambers (110-410) using the first interface assemblies (165a-465a). Alternatively, other configurations may be used.

In 820, a plurality of plasma-tuning rods can be configured from the EM-energy tuning spaces (185-485) through the first interface assemblies (165a-465a) into the process spaces (115-415) in the process chambers (110-410). Isolation assemblies (164a, 164c-464a, 464b) can be removably coupled to the first interface assemblies (165a-465a) and can be configured to isolate the process spaces (115-415) in the process chambers (110-410) from the EM-energy tuning spaces (185-485). The isolation assemblies (164a, 164c-464a, 464b) can be used to removably couple the plasma-tuning rods to the first interface assemblies (165a-465a). For example, the plasma-tuning portions of the plasma-tuning rods can be configured in the process spaces (115-415), and the EM-tuning portions can be configured within the EM-energy tuning spaces (185-485).

In 830, process gas can be supplied into the process chamber around the plasma-tuning rods. During dry plasma etching, the process gas may comprise an etchant, a passivant, or an inert gas, or a combination of two or more thereof. For example, when plasma etching a dielectric film such as silicon oxide ($SiO_x$) or silicon nitride ($Si_xN_y$), the plasma etch gas composition generally includes a fluorocarbon-based chemistry ($C_xF_y$) such as at least one of $C_4F_8$, $C_5F_8$, $C_3F_6$, $C_4F_6$, $CF_4$, etc., and/or may include a fluorohydrocarbon-based chemistry ($C_xH_yF_z$) such as at least one of $CHF_3$, $CH_2F_2$, etc., and can have at least one of an inert gas, oxygen, CO or $CO_2$. Additionally, for example, when etching polycrystalline silicon (polysilicon), the plasma etch gas composition generally includes a halogen-containing gas such as HBr, $Cl_2$, $NF_3$, or $SF_6$ or a combination of two or more thereof, and may include fluorohydrocarbon-based chemistry ($C_xH_yF_z$) such as at least one of $CHF_3$, $CH_2F_2$, etc., and at least one of an inert gas, oxygen, CO or $CO_2$, or two or more thereof. During plasma-enhanced deposition, the process gas may comprise a film forming precursor, a reduction gas, or an inert gas, or a combination of two or more thereof.

In 840, uniform microwave plasma can be created by applying tunable microwave signals to the plasma-tuning rods.

In some systems, one or more sets of EM-coupling regions {(162a-162c, FIG. 1), (262a-262c, FIG. 2), (362a-362c, FIG. 3), or (462a-462d, FIG. 4)} can be established at first set of EM-coupling distances {(176a-176c, FIG. 1), (276a-276c, FIG. 2), (376a-376c, FIG. 3), or (476a-476d, FIG. 4)} from the lower resonator walls (183-483) within the resonator assemblies (181-481), and the EM-tuning portions {(175a-175c, FIG. 1), (275a-275c, FIG. 2), (375a-375c, FIG. 3), or (475a-475b, FIG. 4)} can extend into the first set of EM-coupling regions {(162a-162c, FIG. 1), (262a-262c, FIG. 2), (362a-362c, FIG. 3), or (462a-462d, FIG. 4)}. The EM-tuning portions can obtain different tunable microwave signals (energies) from the sets of EM-coupling regions, and the different tunable microwave signals (energies) can be transferred as controllable plasma-tuning energies to the process spaces (115-415) at different locations using the plasma-tuning portions {(170a-170c, FIG. 1), (270a-270c, FIG. 2), (370a-370c, FIG. 3), or (470a-470b, FIG. 4)}). The sets of EM-coupling regions {(162a-162c, FIG. 1), (262a-262c, FIG. 2), (362a-362c, FIG. 3), or (462a-462b, FIG. 4)} can include tunable E-field regions, tunable H-field regions, maximum E-field regions, maximum H-field regions, maximum voltage regions, maximum energy regions, or maximum current regions, or any combination thereof.

One or more sets of plasma-tuning slabs {(161a-161c, FIG. 1), (261a-261c, FIG. 2), (361a-361c, FIG. 3), or (461a-461b, FIG. 4)} can be coupled to a first set of control assemblies {(160a-160c, FIG. 1), (260a-260c, FIG. 2), (360a-360c, FIG. 3), or (460a-460b, FIG. 4)} and can be used to move {(163a-163c, FIG. 1), (263a-263c, FIG. 2), (363a-363c, FIG. 3), or (463a-463b, FIG. 4)} the sets of plasma-tuning slabs sets of EM-tuning distances {(177a-177c, FIG. 1), (277a-277c, FIG. 2), (377a-377c, FIG. 3), or (477a-477b, FIG. 4)} relative to the sets of EM-tuning portions of the sets of plasma tuning rods within the EM-energy tuning spaces (185-485). The sets of control assemblies and the sets of plasma-tuning slabs can be used to tune/optimize the different tunable microwave signals (energies) coupled from the sets of EM-coupling regions to the sets of EM-tuning portions associated with the sets of plasma tuning rods.

One or more controllers (195-495) can be coupled to one or more of the sets of control assemblies {(160a-160c, FIG. 1), (260a-260c, FIG. 2), (360a-360c, FIG. 3), or (460a-460b, FIG. 4)} and can be used to control/optimize the movements {(163a-163c, FIG. 1), (263a-263c, FIG. 2), (363a-363c, FIG. 3), or (463a-463b, FIG. 4)} of the sets of plasma-tuning slabs {(161a-161c, FIG. 1), (261a-261c, FIG. 2), (361a-361c, FIG. 3), or (461a-461d, FIG. 4)}. For example, one or more of the controllers (195-495) can be used to control/optimize the sets of EM-tuning distances {(177a-177c, FIG. 1), (277a-277c, FIG. 2), (377a-377c, FIG. 3), or (477a-477b, FIG. 4)} to create, optimize, and/or maintain a uniform microwave plasma within the process space (115-415) during substrate processing.

In addition, one or more sets of the cavity-control assemblies {(155a-155c, FIG. 1), (255a-255c, FIG. 2), (355a-355c, FIG. 3), or (455a-455b, FIG. 4)} can be used to move {(157a-157c, FIG. 1), (257a-257c, FIG. 2), (357a-357c, FIG. 3), or (457a-457b, FIG. 4)} the cavity-tuning slabs {(156a-156c, FIG. 1), (256a-256c, FIG. 2), (356a-356c, FIG. 3), or (456a-456b, FIG. 4)} cavity-tuning distances {(158a-158c, FIG. 1), (258a-258c, FIG. 2), (358a-358c, FIG. 3), or (458a-458b, FIG. 4)} within the EM-energy tuning spaces (185-485). One or more of the controllers (195-495) can be coupled to one or more of the cavity-control assemblies (155-455), and the controllers can use process recipes to establish, control, and optimize the cavity-tuning distances to control and maintain the plasma uniformity within the process spaces in real-time.

Furthermore, one or more of the controllers (195-495) can be coupled to the microwave sources (150-450), the matching networks (152-452), the coupling networks (154-454), and the resonant assemblies (181-481), and at least one of the controllers can use process recipes to establish, control, and optimize the microwave sources (150-450), the matching networks (152-452), and the coupling networks (154-454) to control the microwave plasma uniformity within the process spaces (115-415).

In 850, the substrate can be processed by moving the substrate through the uniform microwave plasma.

Figure 9:
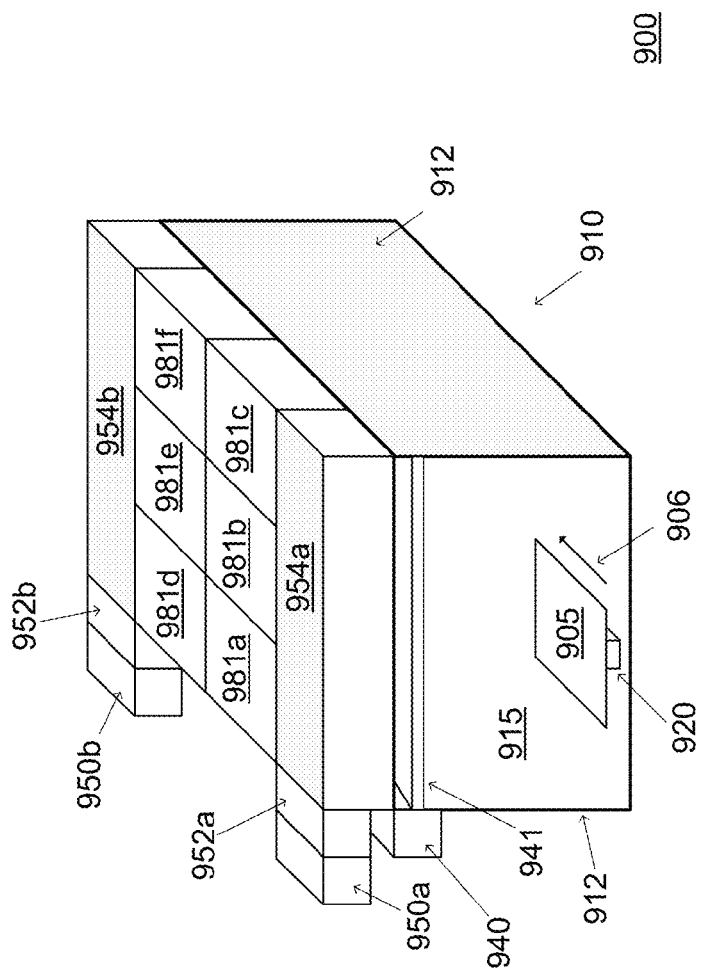
FIG. 9 illustrates a plasma processing system 900 according to embodiments of the invention.

FIG. 9 illustrates a plasma processing system 900 according to embodiments of the invention. The plasma processing system 900 may comprise a dry plasma etching system or a plasma enhanced deposition system.

The plasma processing system 900 comprises a rectangular process chamber 910 having a plurality of chamber walls 912 and coupling networks (954a and 954b) configured to define a process space 915. The plasma processing system 900 comprises a substrate holder 920 configured to support and/or move 906 the substrate 905 through the process space 915. The plasma processing system 900 comprises a process gas system 940 and a process gas shower plate 941 configured to provide process gas to the process space 915. The substrate 905 can be exposed to plasma or process chemistry in process space 915. The plasma processing system 900 can comprise a first set of resonator assemblies (981a, 981b, and 981c) that can be coupled to the first coupling networks 954a, and a second set of resonator assemblies (981d, 981e, and 981f) that can be coupled to the second coupling networks 954b. In some embodiments, the first coupling network 954a can be coupled to a first matching network 952a that can be coupled to a first microwave source 950a, and the second coupling network 954b can be coupled to a second matching network 952b that can be coupled to a second microwave source 950b. The plasma processing system 900 can be configured to form plasma in the process space 915. For example, the resonator assemblies (981a, 981b, 981c, 981d, 981e, and 981f) can be configured using the microwave resonator systems (100, 200, 300, or 400) described herein.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

Thus, the description is not intended to limit the invention and the configuration, operation, and behavior of the present invention has been described with the understanding that modifications and variations of the embodiments are possible, given the level of detail present herein. Accordingly, the preceding detailed description is not mean or intended to, in any way, limit the invention—rather the scope of the invention is defined by the appended claims.

The invention claimed is:

1. A microwave processing system for processing a substrate comprising:
   a rectangular process chamber comprising a process space having a substrate holder therein;
   a resonator assembly coupled to the rectangular process chamber using an interface assembly, the resonator assembly having an electromagnetic (EM) energy tuning space therein, the interface assembly including a set of isolation assemblies, wherein a set of EM-coupling regions, each with EM energy therein, are established in the EM-energy tuning space;

a set of plasma-tuning rods, each coupled to a respective one of the isolation assemblies, the set of plasma-tuning rods each having a plasma-tuning portion configured to control plasma uniformity in the process space and an EM-tuning portion in the EM-energy tuning space, each of the plasma-tuning portions being coupled to a respective one of the EM-coupling regions, wherein the EM-turning portions are configured to obtain EM energy from the set of EM-coupling regions;

a set of plasma-tuning slabs coupled to a set of slab control assemblies, each plasma-tuning slab being positioned a variable EM-coupling distance from the EM-tuning portion of a plasma-tuning rod of the set by a respective slab control assembly of the set that is configured to tune the EM energy in a respective one of the EM-coupling regions of the set so that the EM energy in at least one EM-coupling region of the set differs from the EM energy in at least one other EM-coupling region of the set when the respective EM-coupling distance for the at least one EM-coupling region differs from the respective EM-coupling distance of the at least one other EM-coupling region;

a cavity-tuning slab positioned at a variable cavity tuning distance within the EM energy tuning space by a cavity control assembly coupled to the cavity tuning slab and configured to tune EM energy in the EM-energy tuning space;

a resonator sensor coupled to the EM-energy tuning space, the resonator sensor being configured to obtain resonator data from the EM-energy tuning space; and a controller coupled to the set of isolation assemblies, the cavity control assembly, the set of slab control assemblies, and the resonator sensor, wherein the controller is configured to independently control each of the EM-coupling regions to tune the EM energy therein, the cavity control assembly to tune the EM energy in the EM-energy tuning space, EM-tuning distances established between the set of plasma-tuning slabs and the respective EM-tuning portion of the respective plasma-tuning rod within the EM-energy tuning space, and the set of plasma-tuning rods using the set of isolation assemblies, in response to the resonator data, thereby controlling the set of EM-coupling regions in the EM-energy tuning space and the plasma uniformity in the process space.

2. The microwave processing system of claim 1, further comprising:
a coupling network coupled to the resonator assembly;
a matching network coupled to the coupling network;
a microwave source coupled to the matching network, wherein the microwave source is configured to operate in a frequency range from 500 MHz to 5000 MHz,
wherein the controller is coupled to the microwave source, the matching network and the coupling network and is configured to control the microwave source, the matching network and/or the coupling network, thereby controlling the set of EM-coupling regions in the EM-energy tuning space and the plasma uniformity in the process space.

3. The microwave processing system of claim 1, further comprising:

a plurality of flow elements coupled to the rectangular process chamber and configured to provide process gas to the process space;
a plurality of supply elements coupled to the flow elements; and
a gas supply system coupled to the supply elements, wherein the controller is coupled to the gas supply system, the controller being configured to control the gas supply system, thereby controlling the first set of EM-coupling regions in the EM-energy tuning space and the plasma uniformity in the process space.

4. The microwave processing system of claim 3, wherein the process gas comprises two or more of: a carbon-containing gas, a fluorine-containing gas, a hydrogen-containing gas, an oxygen-containing gas, and an inert gas.

5. The microwave processing system of claim 1, wherein:
the cavity-tuning slab is disposed proximate to a first end of the EM-energy tuning space in the first resonator assembly;
the cavity-tuning slab is positioned at a cavity-tuning distance from at least one wall of the first resonator assembly; and
the controller is configured to control the cavity-tuning distance, thereby controlling the set of EM-coupling regions in the EM-energy tuning space and the plasma uniformity in the process space.

6. The microwave processing system of claim 1, further comprising:
a lower electrode configured within the substrate holder; and
a Radio Frequency (RF) generator coupled to the lower electrode, wherein the controller is coupled to the RF generator and is configured to control the RF generator, thereby controlling the first set of EM-coupling regions in the EM-energy tuning space and the plasma uniformity in the process space.

7. A microwave processing system for processing a substrate comprising:
a rectangular process chamber comprising a process space having a substrate holder therein;
a resonator assembly coupled to the rectangular process chamber using an interface assembly, the resonator assembly having an electromagnetic (EM) energy tuning space therein, the interface assembly including a set of isolation assemblies, wherein a set of EM-coupling regions, each with EM energy therein, are established in the EM-energy tuning space;
a set of plasma-tuning rods, each coupled to a respective one of the isolation assemblies, the set of plasma-tuning rods each having a plasma-tuning portion configured to control plasma uniformity in the process space and an EM-tuning portion in the EM-energy tuning space, each of the plasma-turning portions being coupled to a respective one of the EM-coupling regions, wherein the EM-tuning portions are configured to obtain EM energy from the set of EM-coupling regions;
a set of plasma-tuning slabs coupled to a set of slab control assemblies and disposed proximate to each respective EM-coupling region in the EM-energy tuning space, each plasma-tuning slab being positioned a variable EM-coupling distance from the EM-tuning portion of a plasma-tuning rod of the set by a respective slab control assembly of the set that is configured to tune the EM energy in a respective one of the EM-coupling regions of the set;
a cavity-tuning slab positioned at a variable cavity tuning distance within the EM energy tuning space by a cavity control assembly coupled to the cavity tuning slab and configured to tune EM energy in the EM-energy tuning space;

a resonator sensor coupled to the EM-energy tuning space, the resonator sensor being configured to obtain resonator data from the EM-energy tuning space; and a controller coupled to the set of isolation assemblies, the cavity control assembly, the set of slab control assemblies, and the resonator sensor, wherein the controller is configured to independently control each of the EM-coupling regions to tune the EM energy therein, the cavity control assembly to tune the EM energy in the EM-energy tuning space, EM-tuning distances established between the set of plasma-tuning slabs and the respective EM-tuning portion of the respective plasma-tuning rod within the EM-energy tuning space, and the set of plasma-tuning rods using the set of isolation assemblies, in response to the resonator data, thereby controlling the set of EM-coupling regions in the EM-energy tuning space and the plasma uniformity in the process space.

* * * * *